US011108001B2

(12) United States Patent
Yen et al.

(10) Patent No.: US 11,108,001 B2
(45) Date of Patent: Aug. 31, 2021

(54) ORGANIC COMPOUND AND ORGANIC ELECTROLUMINESCENCE DEVICE USING THE SAME

(71) Applicants: Feng-Wen Yen, Taipei (TW); Li-Chieh Chuang, Nantou (TW)

(72) Inventors: Feng-Wen Yen, Taipei (TW); Li-Chieh Chuang, Nantou (TW)

(73) Assignee: LUMINESCENCE TECHNOLOGY CORP., Hsin-Chu (TW)

( * ) Notice: Subject to any disclaimer, the term of this patent is extended or adjusted under 35 U.S.C. 154(b) by 315 days.

(21) Appl. No.: 16/251,055

(22) Filed: Jan. 17, 2019

(65) Prior Publication Data

US 2020/0235320 A1 Jul. 23, 2020

(51) Int. Cl.
*H01L 51/00* (2006.01)
*H01L 51/50* (2006.01)

(52) U.S. Cl.
CPC ...... *H01L 51/0094* (2013.01); *H01L 51/0036* (2013.01); *H01L 51/0059* (2013.01); *H01L 51/0067* (2013.01); *H01L 51/0072* (2013.01); *H01L 51/0073* (2013.01); *H01L 51/5012* (2013.01); *H01L 51/5072* (2013.01); *H01L 51/5096* (2013.01)

(58) Field of Classification Search
None
See application file for complete search history.

(56) References Cited

U.S. PATENT DOCUMENTS 9,172,046 B1* 10/2015 Kim .......................... C09B 1/00
2011/0266526 A1* 11/2011 Ma ...................... H01L 51/0054 257/40
2013/0048975 A1* 2/2013 Hong .................. C07D 409/10 257/40
2014/0175384 A1 6/2014 Yen et al.
2014/0197382 A1* 7/2014 Kim .................... H01L 29/7869 257/40
2014/0197392 A1* 7/2014 Horiuchi .............. C07D 307/91 257/40
2014/0367654 A1* 12/2014 Kim .................... H01L 51/0072 257/40
2015/0001489 A1* 1/2015 Lee ........................ C09K 11/06 257/40

(Continued)

FOREIGN PATENT DOCUMENTS

CN 102702072 * 3/2012 ........... C07D 209/80
CN 104649954 * 5/2015 ........... C07D 209/80
KR 1020140021294 * 2/2014 ........... C07D 405/14

OTHER PUBLICATIONS

Machine translation of CN-102702072, translation generated Jan. 2021, 19 pages. (Year: 2021).*

(Continued)

*Primary Examiner* — Robert S Loewe

(57) ABSTRACT

The present invention discloses an organic compound and an organic electroluminescence device employing the organic compound as the fluorescent host or guest material in the light emitting layer of the organic electroluminescence device. The organic electroluminescence device employing the organic compound of the present invention can operate under reduced driving voltage, increased current efficiency, or prolong half-life time.

11 Claims, 1 Drawing Sheet

(56) References Cited

U.S. PATENT DOCUMENTS

| | | | | |
|---|---|---|---|---|
| 2016/0072073 | A1* | 3/2016 | Lee | C07D 409/14 257/40 |
| 2016/0133844 | A1* | 5/2016 | Kim | H01L 51/0054 257/40 |
| 2016/0133853 | A1* | 5/2016 | Cho | H01L 51/0059 257/40 |
| 2016/0141512 | A1* | 5/2016 | Jung | H01L 51/0072 257/40 |
| 2016/0322569 | A1* | 11/2016 | Yen | H01L 51/0072 |
| 2017/0207397 | A1* | 7/2017 | Lee | C07D 405/14 |
| 2019/0229275 | A1* | 7/2019 | Lee | C07D 307/77 |
| 2020/0190065 | A1* | 6/2020 | Yen | H01L 51/0072 |
| 2020/0203632 | A1* | 6/2020 | Yen | H01L 51/0067 |

OTHER PUBLICATIONS

Machine translation of CN-104649954, translation generated Jan. 2021, 35 pages. (Year: 2021).*
Machine translation of KR-1020140021294, translation generated Jan. 2021, 53 pages. (Year: 2021).*

* cited by examiner

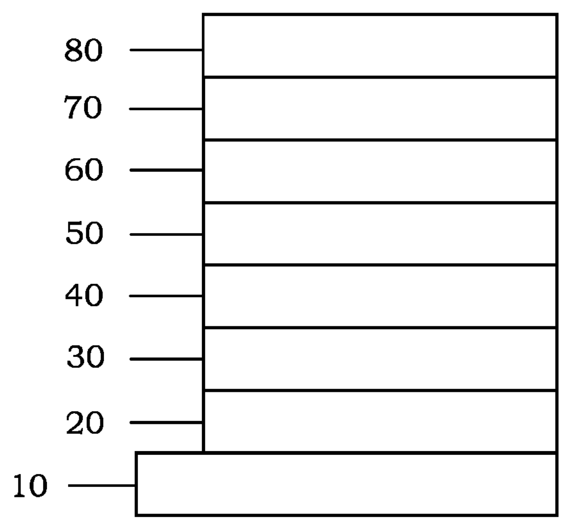
80
70
60
50
40
30
20
10

ORGANIC COMPOUND AND ORGANIC ELECTROLUMINESCENCE DEVICE USING THE SAME

FIELD OF INVENTION

The present invention relates to an organic compound, and more particularly, to an organic electroluminescence device using the organic compound.

BACKGROUND OF THE INVENTION

An organic electroluminescence (organic EL) device is an organic light-emitting diode (OLED) in which the light emitting layer is a film made from organic compounds, which emits light in response to the electric current. The light emitting layer containing the organic compound is sandwiched between two electrodes. The organic EL device is applied to flat panel displays due to its high illumination, low weight, ultra-thin profile, self-illumination without back light, low power consumption, wide viewing angle, high contrast, simple fabrication methods and rapid response time.

Typically, the organic EL device is composed of organic material layers sandwiched between two electrodes. The organic material layers include, e.g., hole injection layer (HIL), hole transporting layer (HTL), emitting layer (EML), electron transporting layer (ETL), and electron injection layer (EIL). The basic mechanism of organic EL involves the injection, transport, and recombination of carriers as well as exciton formation for emitting light. When an external voltage is applied across the organic EL device, electrons and holes are injected from the cathode and the anode, respectively. Electrons will be injected from the cathode into a LUMO (lowest unoccupied molecular orbital) and holes will be injected from the anode into a HOMO (highest occupied molecular orbital). Subsequently, the electrons recombine with holes in the light emitting layer to form excitons, which then deactivate to emit light. When luminescent molecules absorb energy to achieve an excited state, the exciton may either be in a singlet state or a triplet state, depending on how the spins of the electrons and holes have been combined. It is well known that the excitons formed under electrical excitation typically include 25% singlet excitons and 75% triplet excitons. In the fluorescence materials, however, the electrically generated energy in the 75% triplet excitons will be dissipated as heat for decay from the triplet state is spin forbidden. Therefore, a fluorescent electroluminescence device has only 25% internal quantum efficiency, which leads to the theoretically highest external quantum efficiency (EQE) of only 5% due to only ~20% of the light out-coupling efficiency of the device. In contrast to fluorescent electroluminescence devices, phosphorescent organic EL devices make use of spin-orbit interactions to facilitate intersystem crossing between singlet and triplet states, thus obtaining emission from both singlet and triplet states and the internal quantum efficiency of electroluminescence devices from 25% to 100%.

However, there is still a need for improvement in the case of use of those organic materials in an organic EL device of some prior art displays, for example, in relation to the half-lifetime, current efficiency or driving voltage of the organic EL device.

SUMMARY OF THE INVENTION

Accordingly, an object of the present invention is to provide an organic compound, which can be used as a fluorescent host or guest material in the emitting layer of the organic EL device which may lower a driving voltage or increasing a current efficiency, or life time to the organic EL device.

Another object of the invention is to provide an organic compound and an organic EL device using the same, which can operate under reduced voltage and exhibit higher current efficiency and longer half-life time.

According to the present invention, an organic compound which may be used in organic EL devices is disclosed. The organic compound may be represented by the following formula (A):

formula (A)

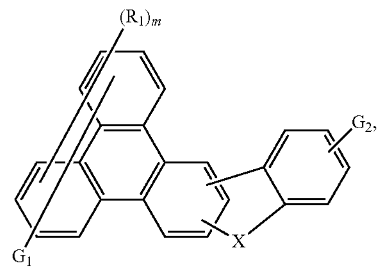

wherein at least one of $G_1$ and $G_2$ exists and represents formula (B) below:

formula (B)

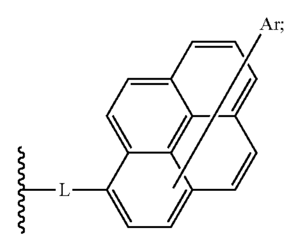

X may be a divalent bridge selected from the group consisting of O, S, Se, $NR_2$ and $SiR_3R_4$. The symbol m may represent an integer of 0, 1, 2, 3, 4, 5, 6, 7 or 8. L may represent a single bond, a substituted or unsubstituted divalent arylene group having 6 to 12 ring carbon atoms, or a substituted or unsubstituted divalent heteroarylene group having 6 to 12 ring carbon atoms. Ar may represent a hydrogen, a halogen (e.g., fluoride), a methyl group, a substituted or unsubstituted aryl group having 6 to 30 (e.g., 6, 10, 12, 14, 15, 16, 18, 19, 20, 22, 24, 26 or 30) carbon atoms, or a substituted or unsubstituted heteroaryl group having 3 to 30 (e.g., 11 or 16) carbon atoms, or a substituted or unsubstituted arylamine group having 6 to 30 (e.g., 12, 16, 17, 18, 20, 24, 27 or 28) carbon atoms, or a substituted or unsubstituted heteroarylamine group having 3 to 30 (e.g., 19, 22 or 25) carbon atoms; and $R_1$ to $R_4$ may represent a hydrogen atom, a halogen (e.g., fluoride), a substituted or unsubstituted alkyl group having 1 to 30 (e.g., 6, 7 or 8) carbon atoms, a substituted or unsubstituted aryl group having 6 to 30 (e.g., 6, 10, 12 or 18) carbon atoms, a substituted or unsubstituted aralkyl group having 7 to 30 (e.g., 12 or 24) carbon atoms, or a substituted or unsubstituted heteroaryl group having 3 to 30 (e.g., 5) carbon atoms. The heteroaryl group may comprise, for example, a heteroaromatic PAHs unit having two, three, four, five or six rings. The heteroaromatic PAHs may contain an oxygen atom, a sulfur atom or one, two or three N atoms.

The present invention further discloses an organic electroluminescence device. The organic electroluminescence device comprises a pair of electrodes composed of a cathode and an anode, and a light emitting layer between the pair of electrodes. The light emitting layer comprises the organic compound of formula (A).

The substituted aryl group may be an aryl group substituted by an alkoxy group or by a methyl or ethyl substituted heteroaromatic PAHs unit having two rings. The two-rings heteroaromatic PAHs may contain two N atoms.

$R_1$ to $R_4$ may also represent a phenyl group, a naphthyl group, a dibenzofuranyl group, a benzo[b]naphtho[2,3-d]furanyl group, an isopropyl-benzo[b]naphtho[2,1-d]furanyl group, a carbazole group, a N-phenylcarbazole group, a trifluoromethyl group, a cumene (isopropylbenzene) group, a phenyl-phenylpyrimidine group, a biphenyl-phenylpyrimidine group, a diphenyl-triazine group or a 4,6-diphenyl-1,3,5-triazine group.

The present invention further discloses an organic electroluminescence device. The organic electroluminescence (EL) device comprises a pair of electrodes having a cathode and an anode. The organic EL device may comprise a light emitting layer and one or more layers of organic thin film layers between the pair of electrodes. The light emitting layer and/or the one or more organic thin film layers comprise the organic compound of formula (A). The light emitting layer may be an emitting layer comprising an emitting host material and an emitting guest (dopant) material. The emitting host material may be doped with about 5% emitting guest material. The emitting layer may have a thickness of about 30 nm between the pair of electrodes. The light emitting layer may comprise an organic compound represented by formula (A).

The organic EL device of the present invention may comprise the organic compound of formula (A) as a dopant material of the light emitting layer. The organic EL device having the light emitting layer may have a driving voltage of about but not limited to 2.5-3.2 V, a current efficiency of about but not limited to 6.2-7.9 cd/A, or a half-life time of about but not limited to 510-750 hours.

An organic EL device of the present invention comprises an organic compound of formula (A) as a dopant material to collocate with, for example, a host material Comp. 6 to emit a blue light, thereby lowering a driving voltage to about but not limited to 2.5-2.7 V, increasing a current efficiency to about but not limited to 7.2-7.5 cd/A, or increasing a half-life time to about but not limited to 690-720 hours.

The organic EL device of may comprise an organic compound of formula (A) as a host material. The organic EL device may have a driving voltage of about but not limited to 3.1-4.3 V, a current efficiency of about but not limited to 4.6-6.3 cd/A, or a half-life time of about but not limited to 270-550 hours.

The organic EL device of may comprise an organic compound of formula (A) as a host material to collocate with, for example, a host material D1, thereby lowering a driving voltage to about but not limited to 3.2-3.4 V, increasing a current efficiency to about but not limited to 5.8-6.1 cd/A, or increasing a half-life time to about but not limited to 440-500 hours.

BRIEF DESCRIPTION OF THE DRAWINGS

The FIGURE is a schematic view showing an organic EL device according to an embodiment of the present invention.

DESCRIPTION OF THE PREFERRED EMBODIMENTS

What probed into the invention is the organic compound and organic EL device using the organic compound. Detailed descriptions of the production, structure and elements will be provided as follows such that the invention can be fully understood. Obviously, the application of the invention is not confined to specific details familiar to those skilled in the art. On the other hand, the common elements and procedures that are known to everyone are not described in details to avoid unnecessary limits of the invention. Some preferred embodiments of the present invention will now be described in greater detail as follows. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In one embodiment of the present invention, an organic compound which can be used as the fluorescent host or guest material of the light emitting layer in the organic EL device is disclosed. The organic compound is represented by the following formula (A):

formula (A)

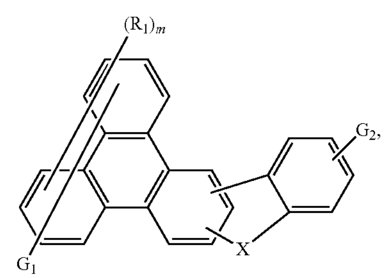

wherein at least one of $G_1$ and $G_2$ exists and represents formula (B) below:

formula (B)

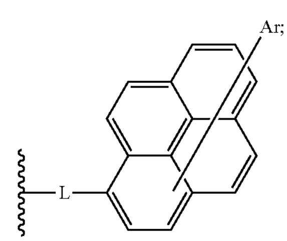

X may be a divalent bridge selected from the group consisting of O, S, Se, $NR_2$ and $SiR_3R_4$; m may represent an integer of 0 to 8; L may represent a single bond, a substituted or unsubstituted divalent arylene group having 6 to 12 ring carbon atoms, or a substituted or unsubstituted divalent heteroarylene group having 6 to 12 ring carbon atoms; Ar may represent a hydrogen, a halogen (e.g., fluoride), a methyl group, a substituted or unsubstituted aryl group having 6 to 30 (e.g., 6, 10, 12, 14, 15, 16, 18, 19, 20, 22, 24, 26 or 30) carbon atoms, or a substituted or unsubstituted heteroaryl group having 3 to 30 (e.g., 11 or 16) carbon atoms, or a substituted or unsubstituted arylamine group having 6 to 30 (e.g., 12, 16, 17, 18, 20, 24, 27 or 28) carbon atoms, or a substituted or unsubstituted heteroarylamine group having 3 to 30 (e.g., 19, 22 or 25) carbon atoms; and $R_1$ to $R_4$ may represent a hydrogen atom, a halogen (e.g., fluoride), a substituted or unsubstituted alkyl group having 1 to 30 (e.g., 6, 7 or 8) carbon atoms, a substituted or unsubstituted aryl group having 6 to 30 (e.g., 6, 10, 12 or 18) carbon atoms, a substituted or unsubstituted aralkyl group having 7 to 30 (e.g., 12 or 24) carbon atoms, or a substituted or unsubstituted heteroaryl group having 3 to 30 (e.g., 5) carbon atoms. The heteroaryl group may comprise, for example, a heteroaromatic PAHs unit having two, three, four, five or six rings. The heteroaromatic PAHs may contain an oxygen atom, a sulfur atom or one, two or three N atoms.

In some embodiments, the organic compound can be represented by one of the following formula (1) to formula (12):

formula (1)

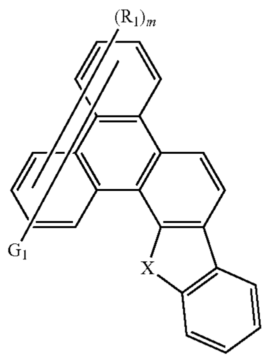

formula (2)

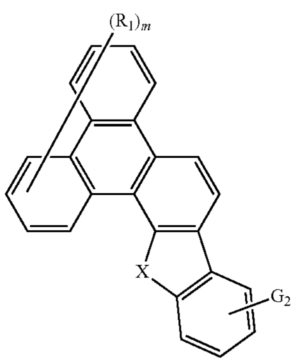

formula (3)

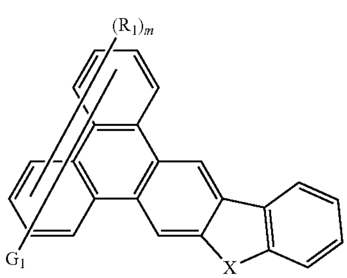

-continued formula (4)

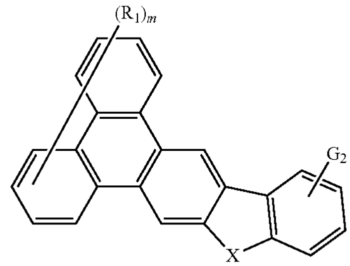

formula (5)

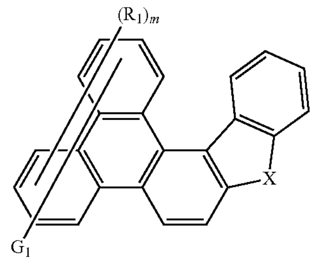

formula (6)

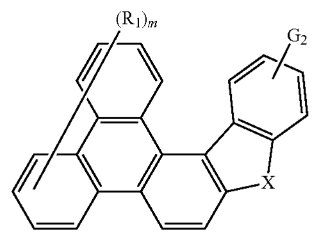

formula (7)

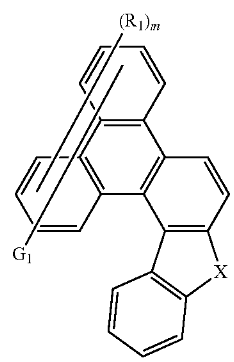

formula (8)

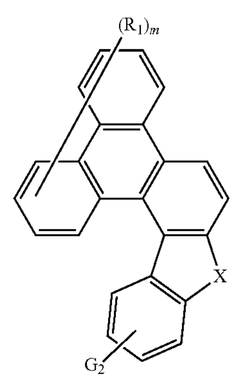

-continued formula (9)

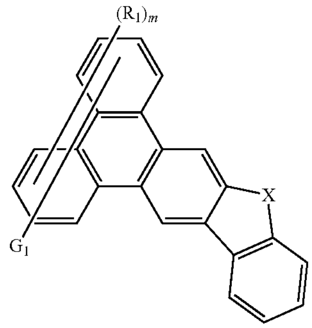

formula (10)

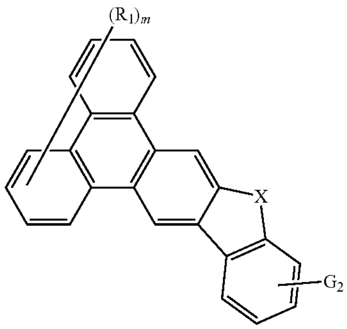

formula (11)

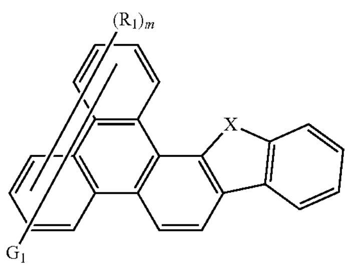

formula (12)

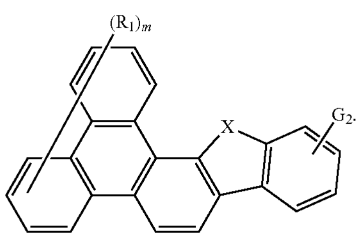

In some embodiments, the alkyl group, aralkyl group, aryl group, or heteroaryl group may be substituted by a halogen, an alkyl group, an aryl group, or a heteroaryl group.

In some embodiments, Ar may represent a substituted or unsubstituted phenyl group, a substituted or unsubstituted biphenyl group, a substituted or unsubstituted terphenyl group, a substituted or unsubstituted fluorene group, a substituted or unsubstituted benzofluorene group, a substituted or unsubstituted naphthyl group, a substituted or unsubstituted anthracenyl group, a substituted or unsubstituted phenanthrenyl group, a substituted or unsubstituted pyrenyl group, or a substituted or unsubstituted chrysenyl group, a substituted or unsubstituted diphenylamine group, a substituted or unsubstituted triphenylamine group, a substituted or unsubstituted phenyldibenzofuranylamine group, or a substituted or unsubstituted phenyldibenzothiophenylamine group, or a substituted or unsubstituted diphenylfluorenylamine group, or a substituted or unsubstituted diphenylspirobifluorenylamine group.

In some embodiments, Ar may represent one of the following substituents:

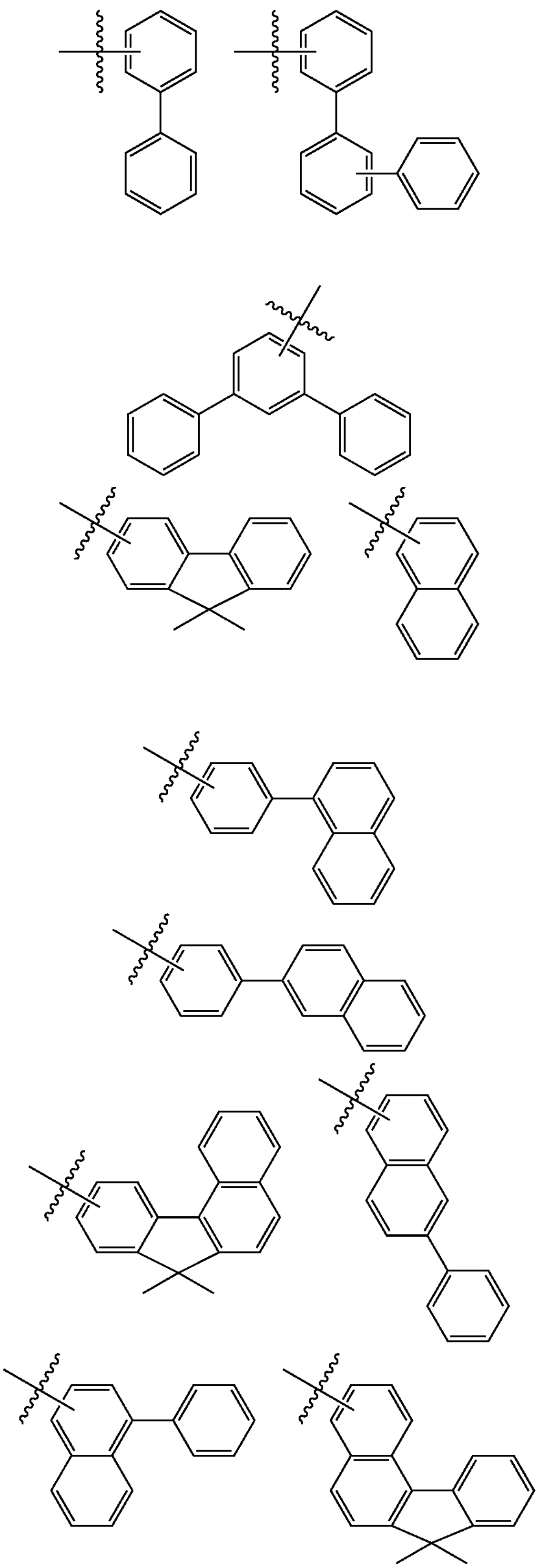

-continued
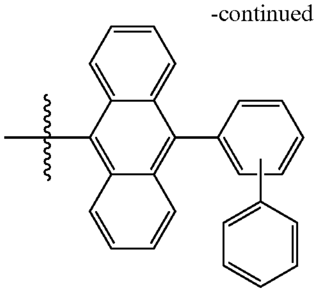
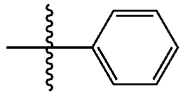
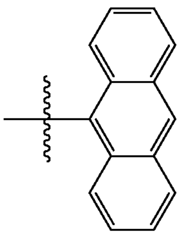
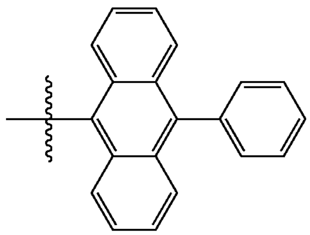
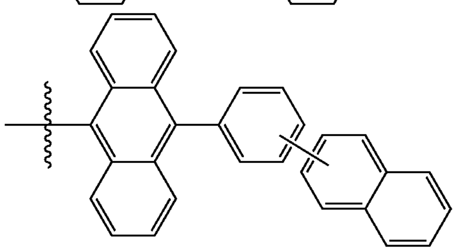
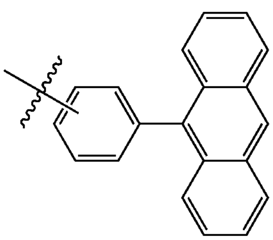
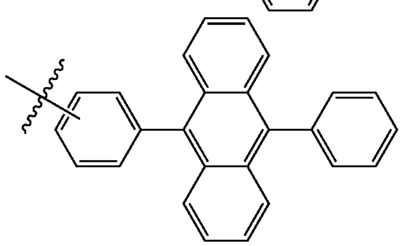
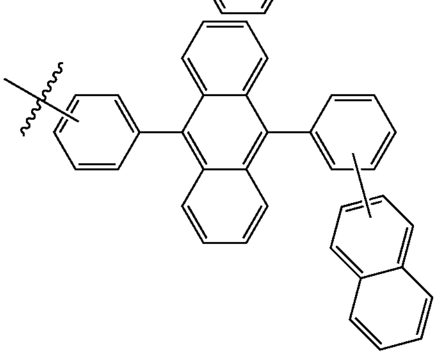
-continued
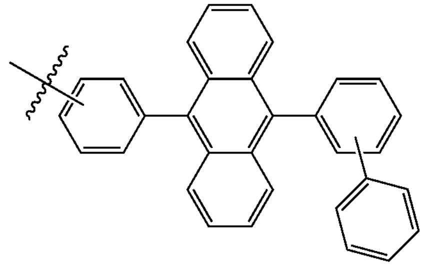
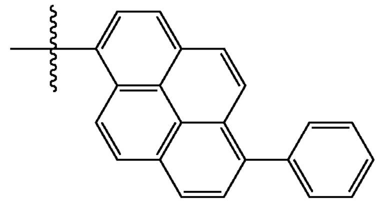
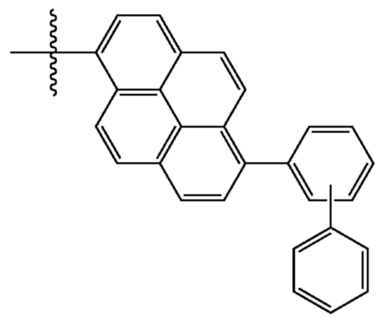
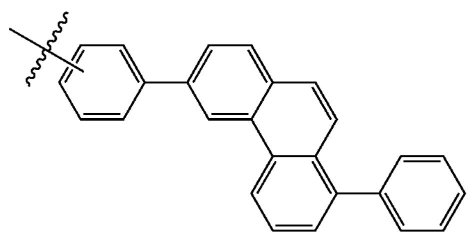
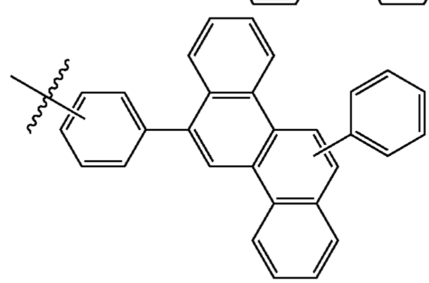
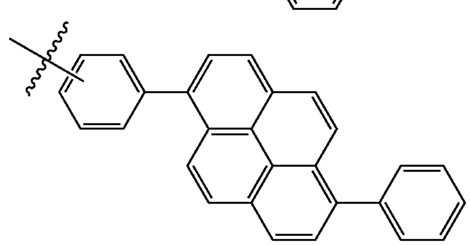

-continued
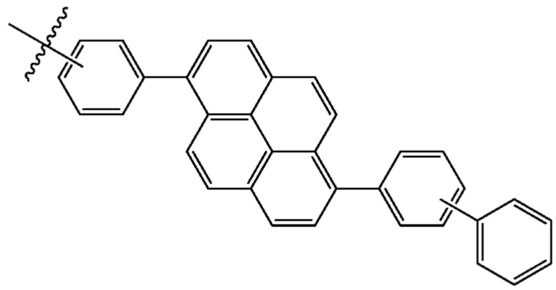
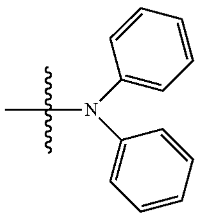
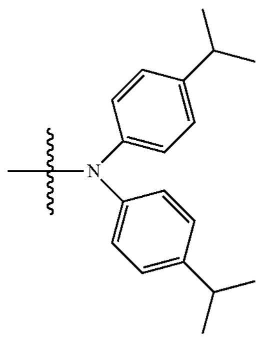
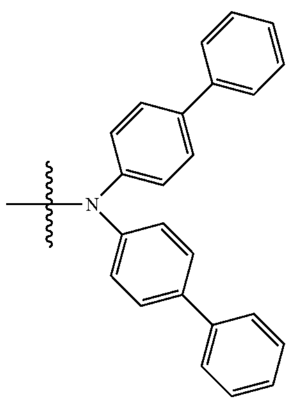
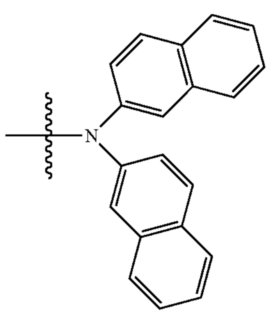
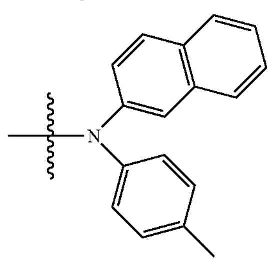
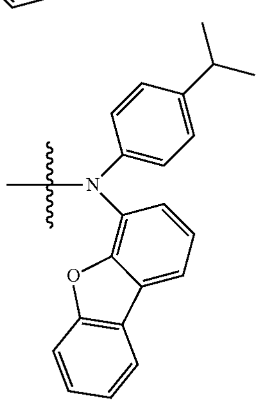
-continued
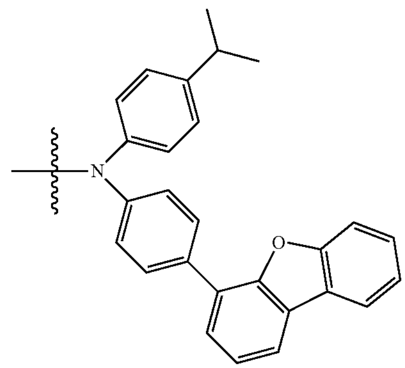
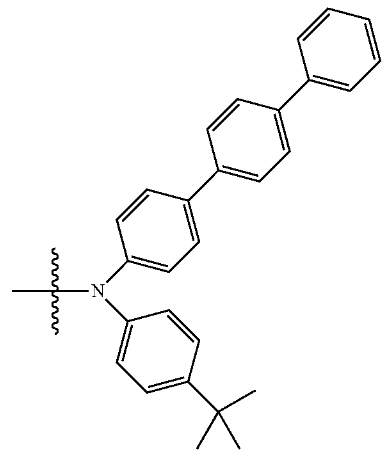
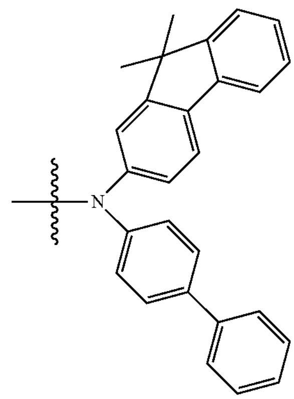
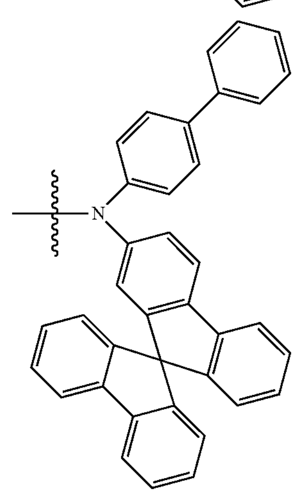
.

The organic compound may be one of the following compounds:
Compound 1
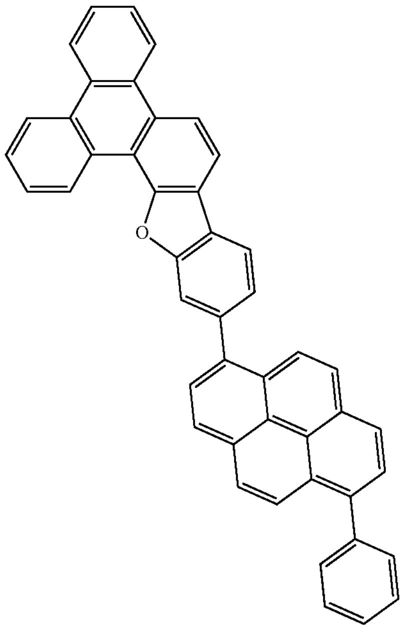
Compound 2
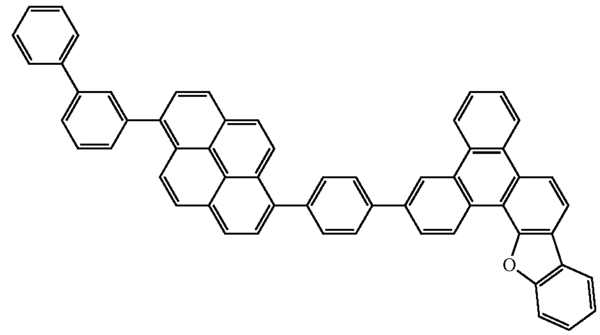
Compound 3
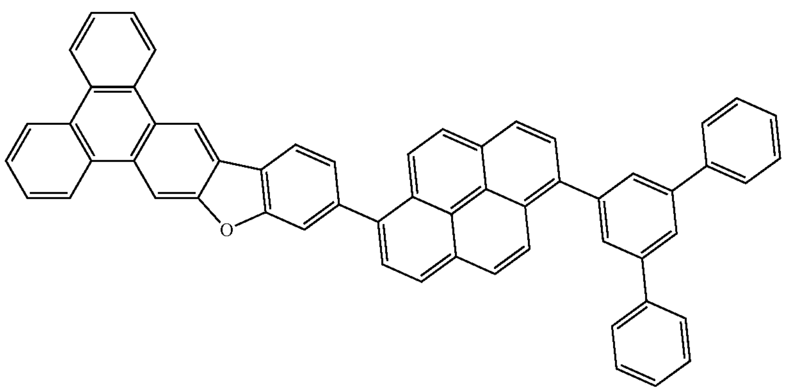
Compound 4
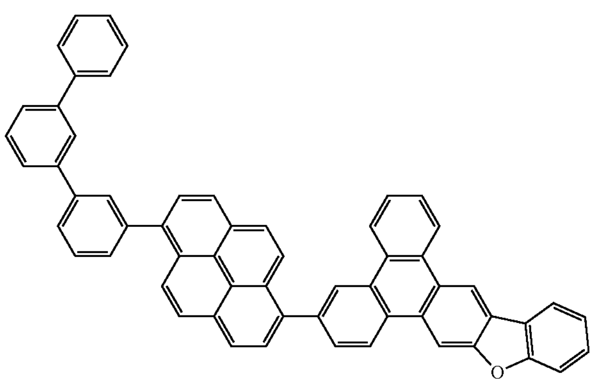
Compound 5
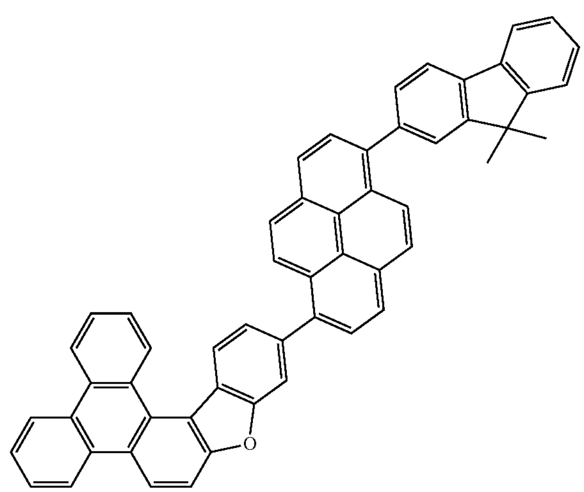

-continued
Compound 6
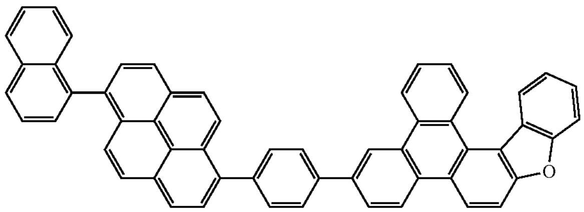
Compound 7
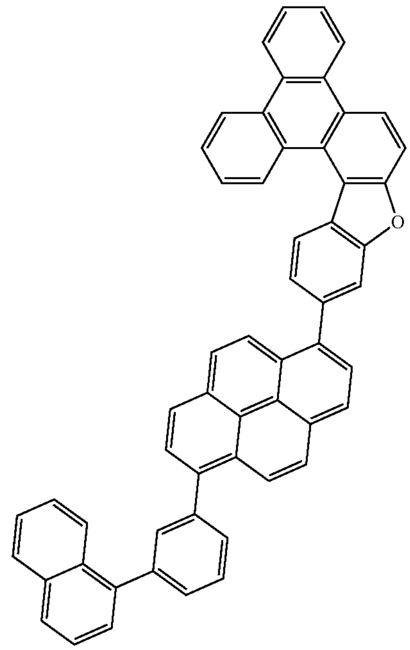
Compound 8
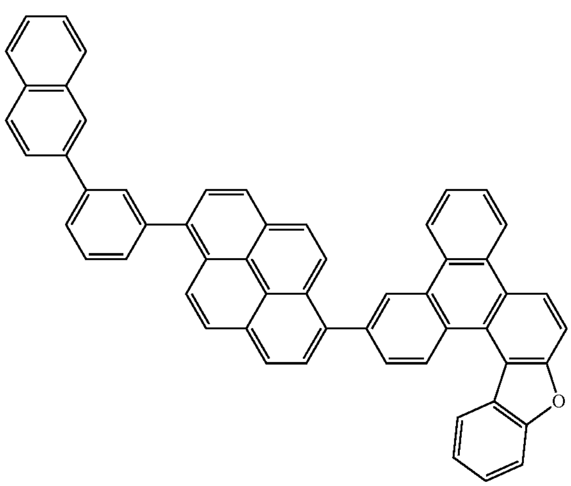
Compound 9
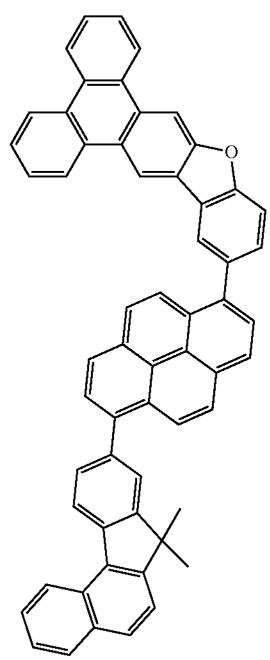

-continued
Compound 10
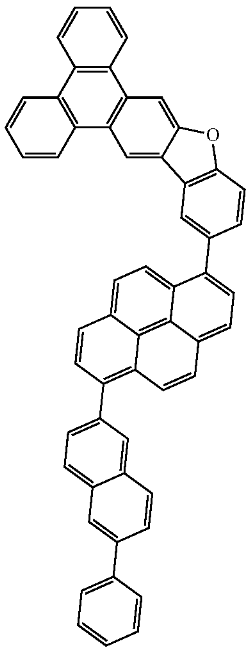
Compound 11
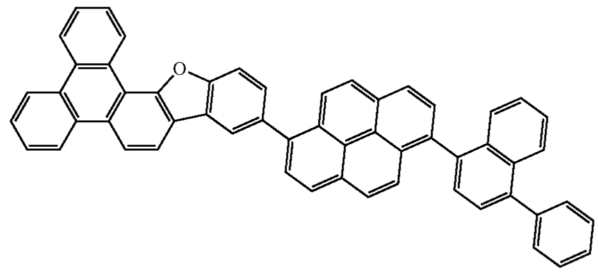
Compound 12
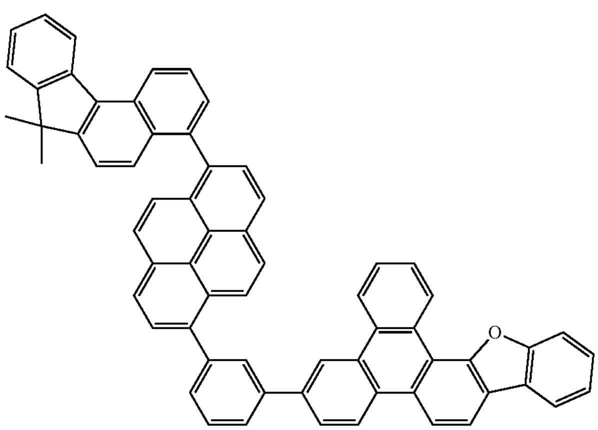
Compound 13
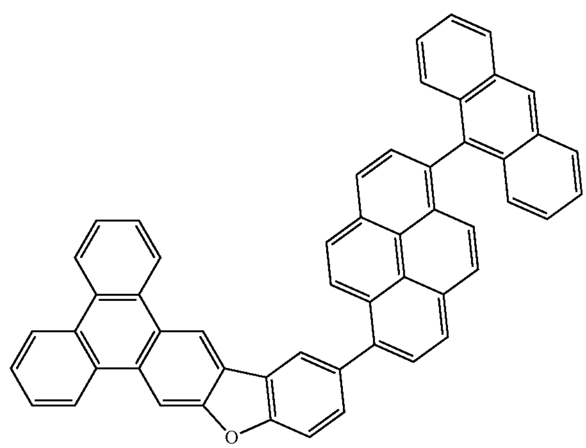
Compound 14
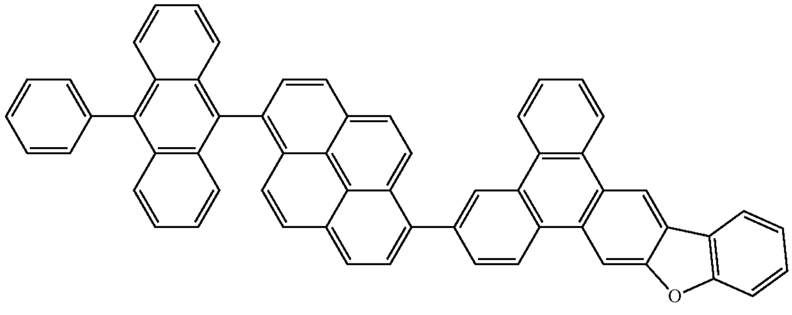

-continued
Compound 15
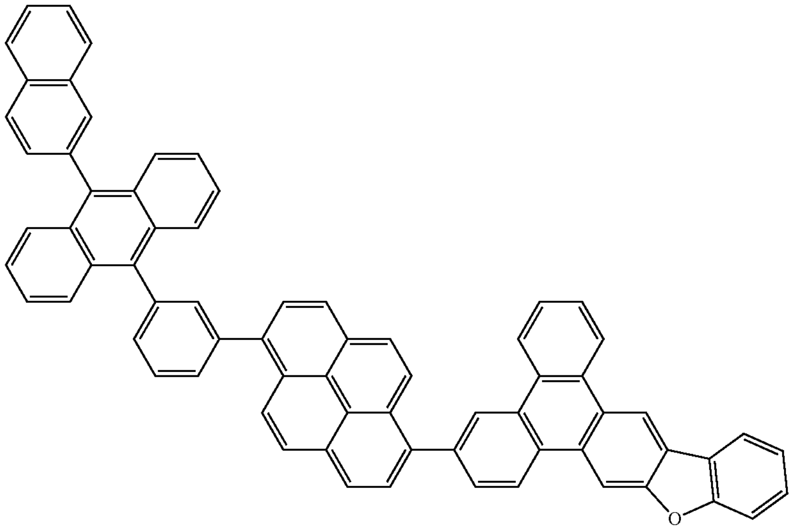
Compound 16
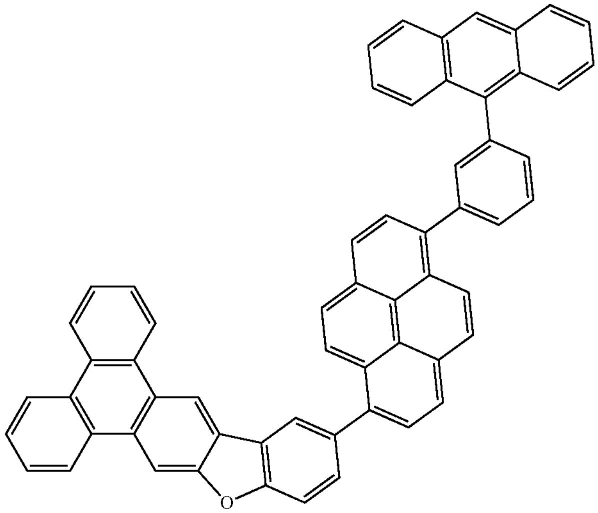
Compound 17
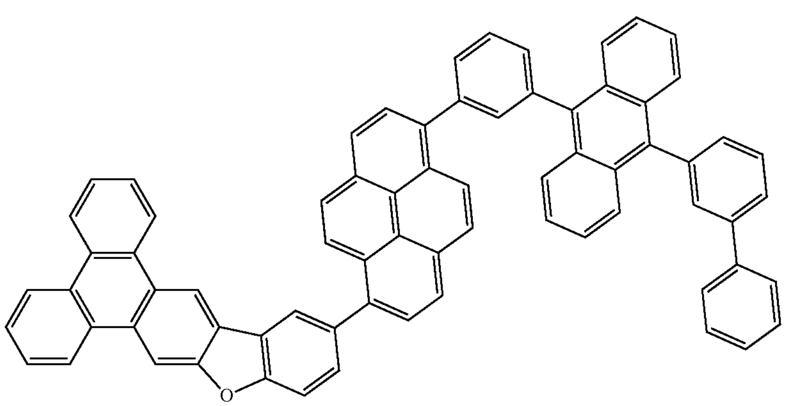

-continued
Compound 18
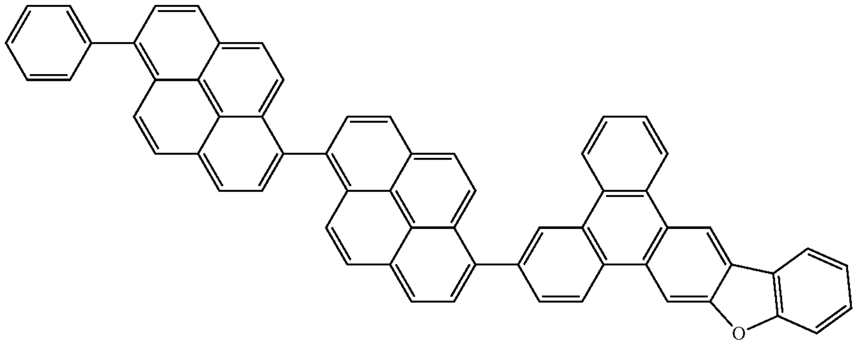
Compound 19
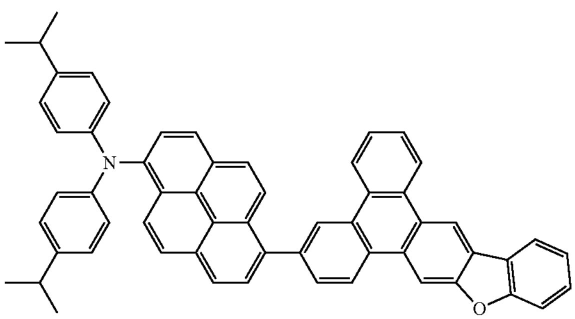
Compound 20
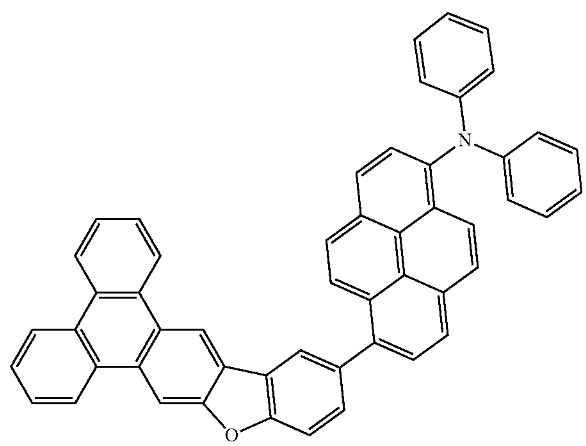
Compound 21
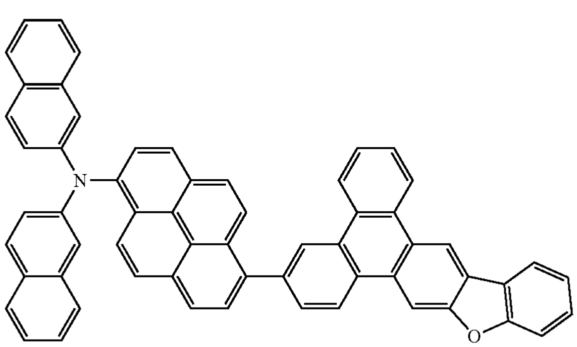
Compound 22
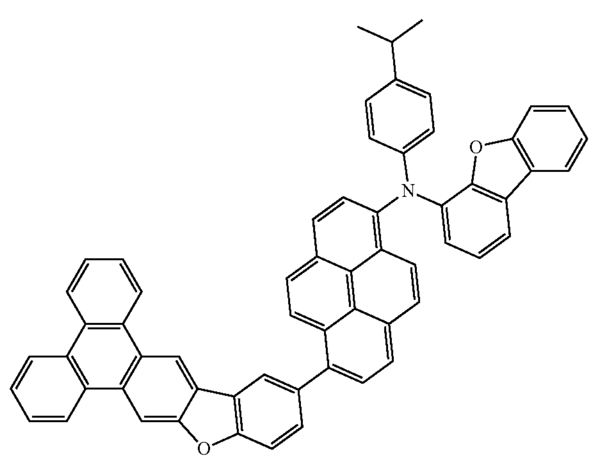

-continued
Compound 23
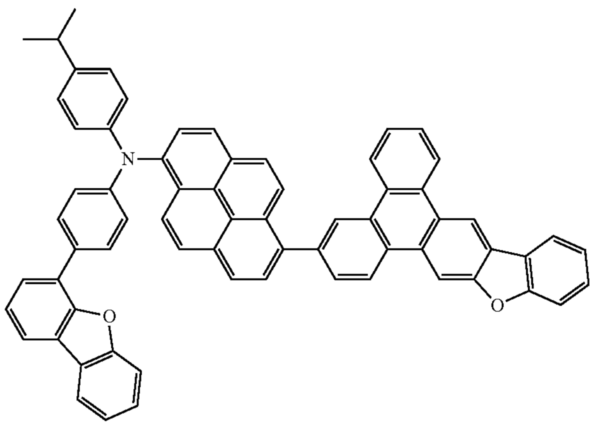
Compound 24
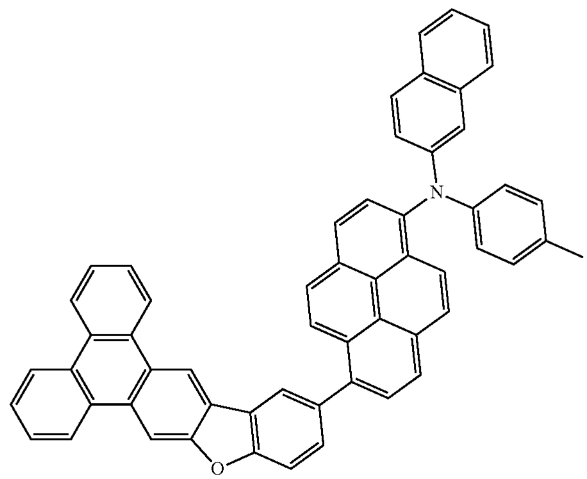
Compound 25
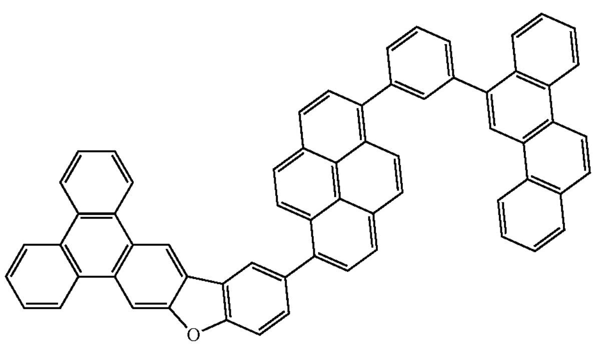
Compound 26
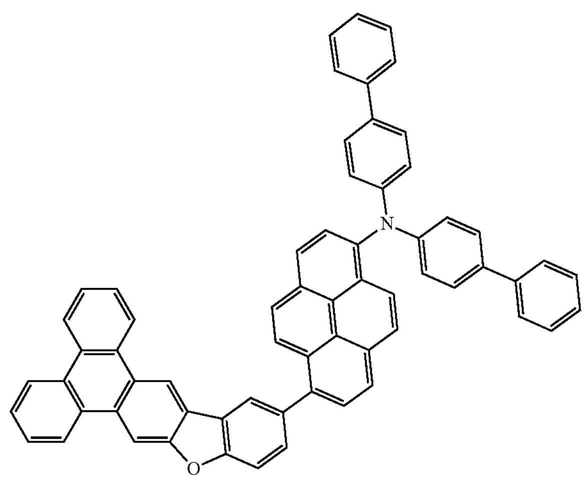
Compound 27
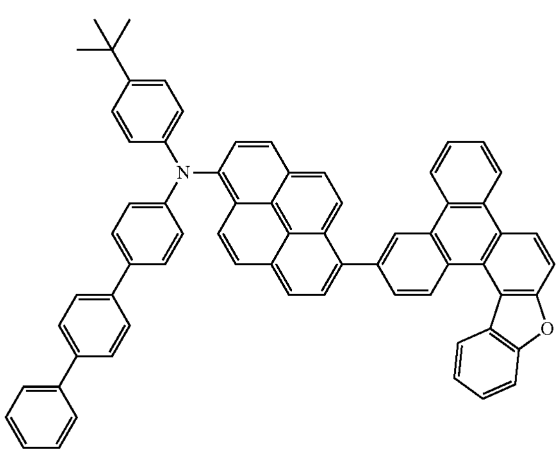
Compound 28
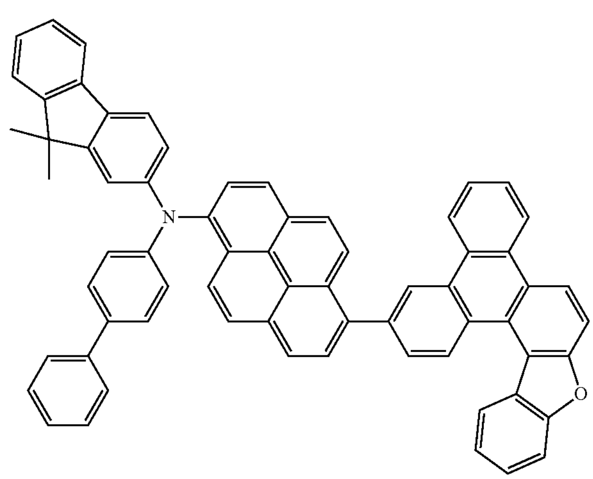

-continued
Compound 29
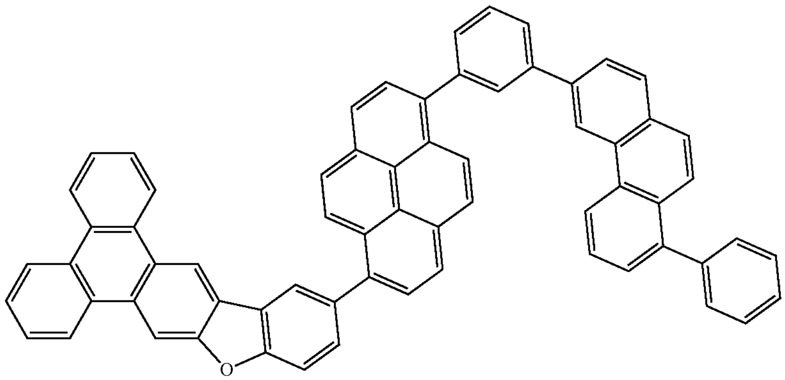
Compound 30
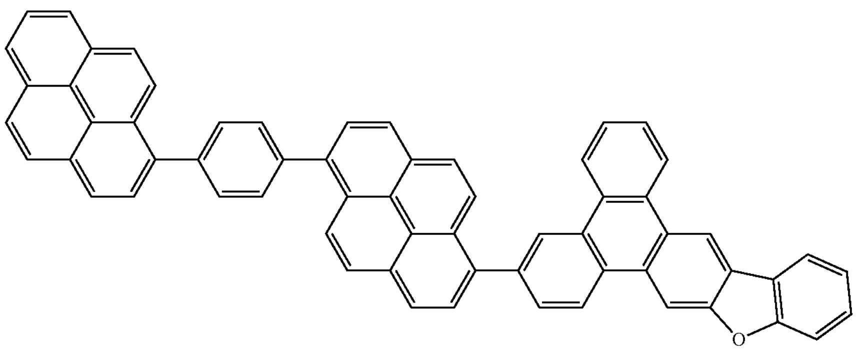
Compound 31
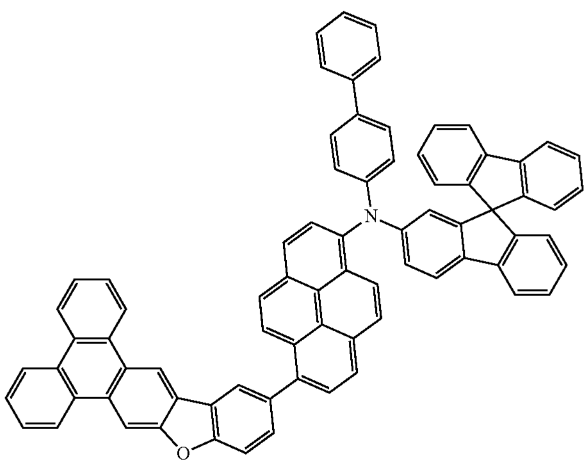
Compound 32
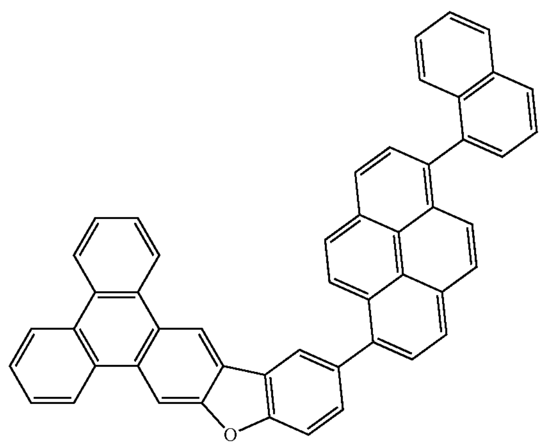
Compound 33
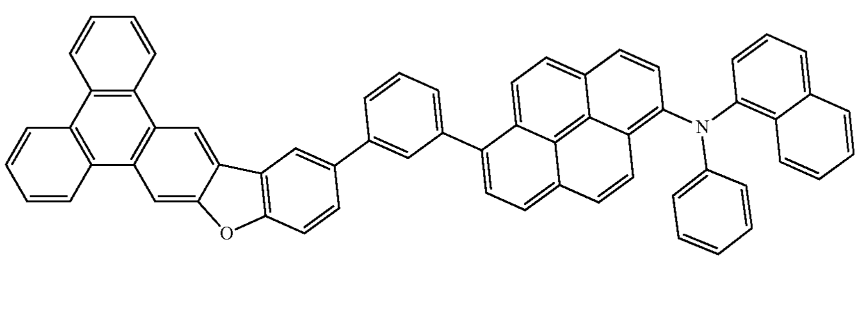

-continued
Compound 34
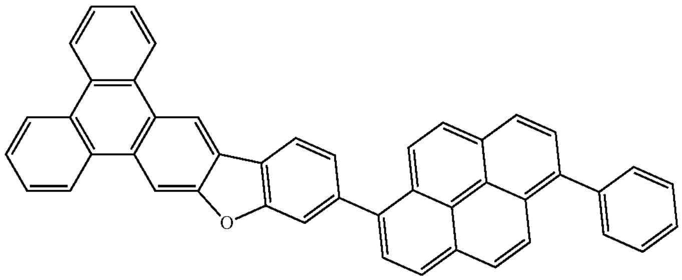
Compound 35
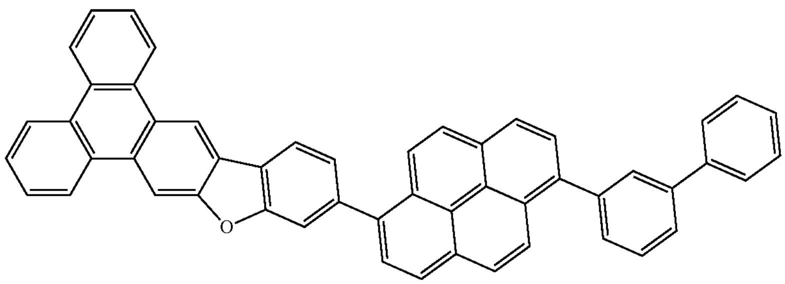
Compound 36
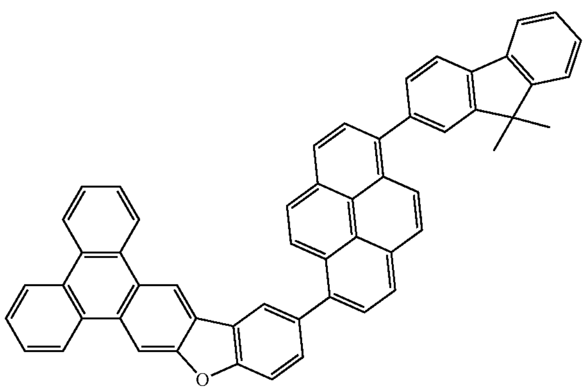
Compound 37
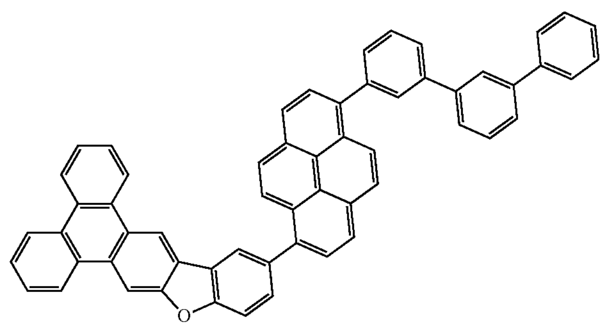
Compound 38
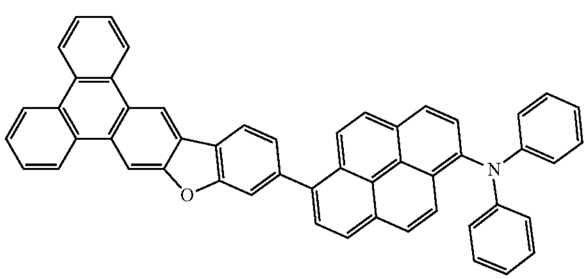
Compound 39
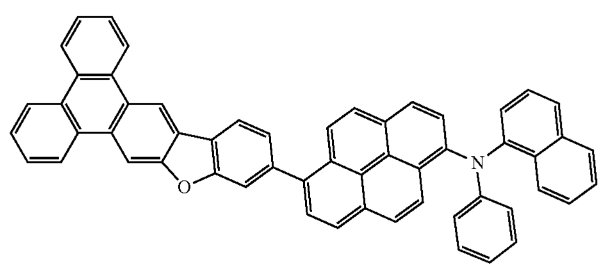
Compound 40
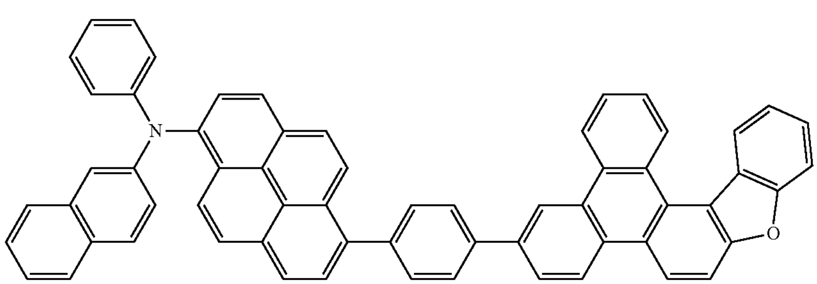

-continued
Compound 41
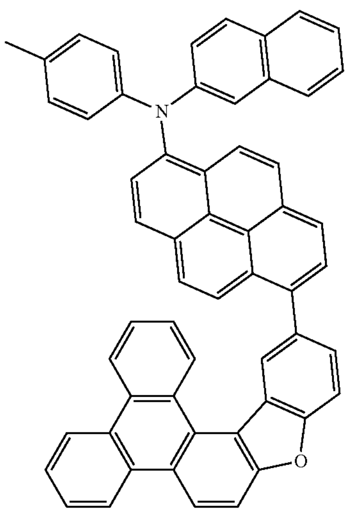
Compound 42
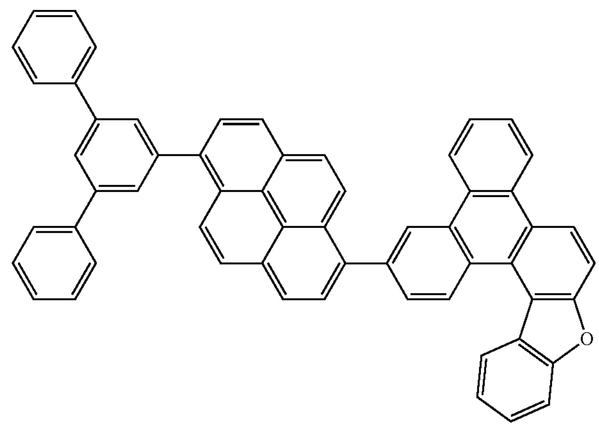
Compound 43
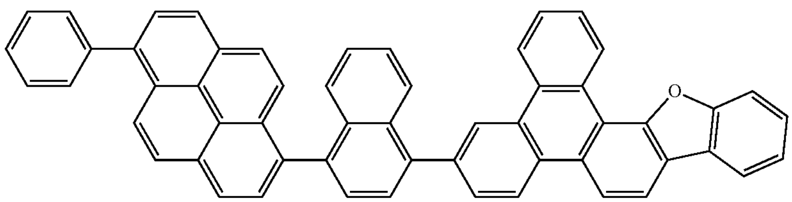
Compound 44
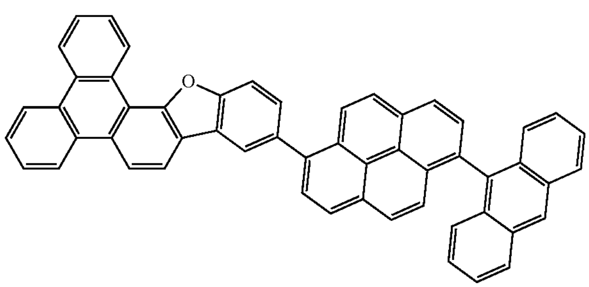
Compound 45
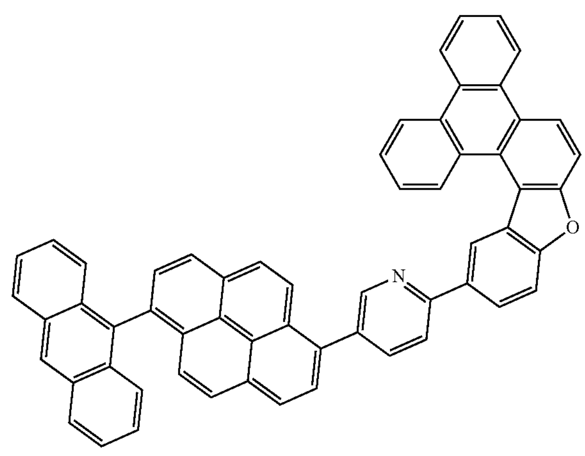
Compound 46
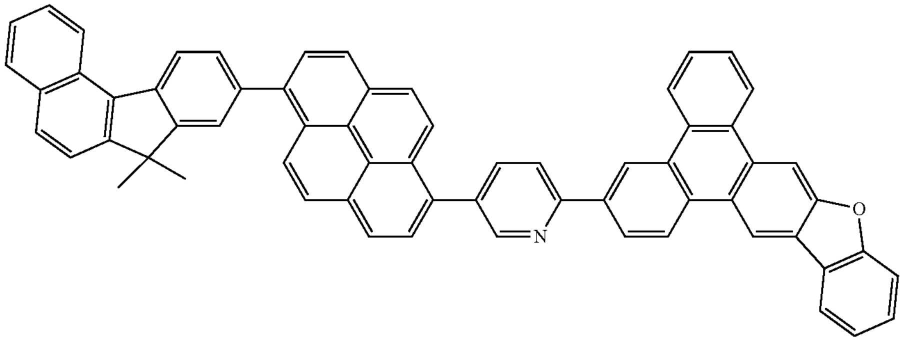

-continued
Compound 47
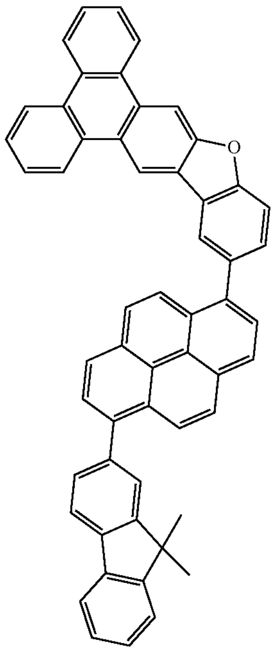
Compound 48
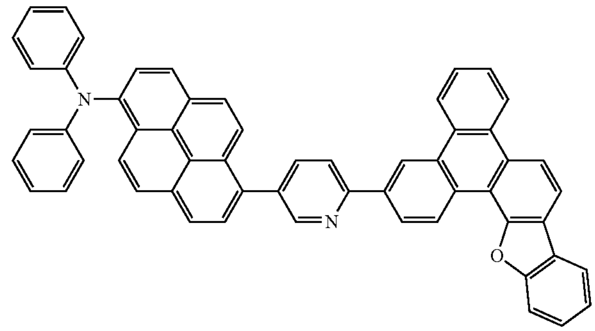
Compound 49
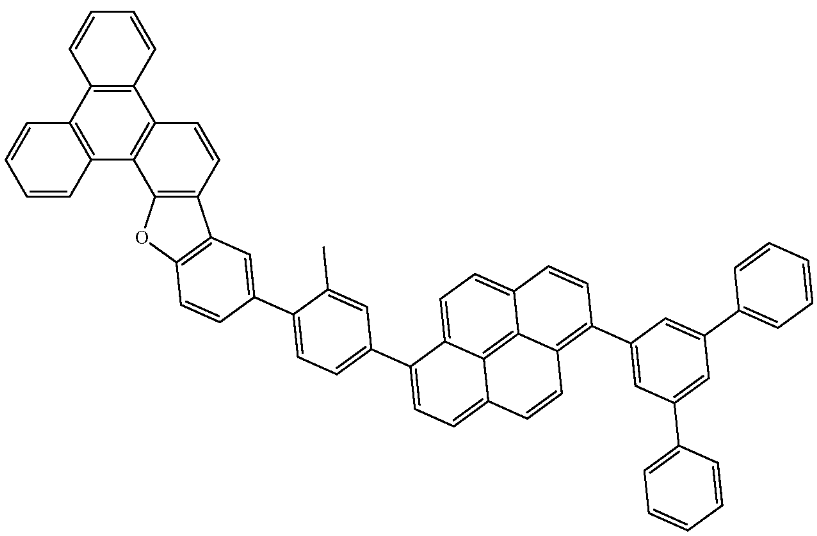
Compound 50
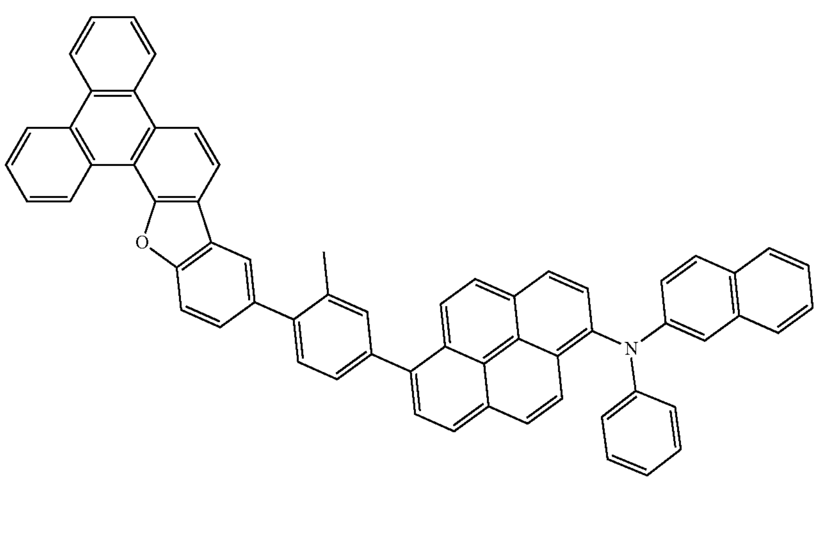

-continued
Compound 51
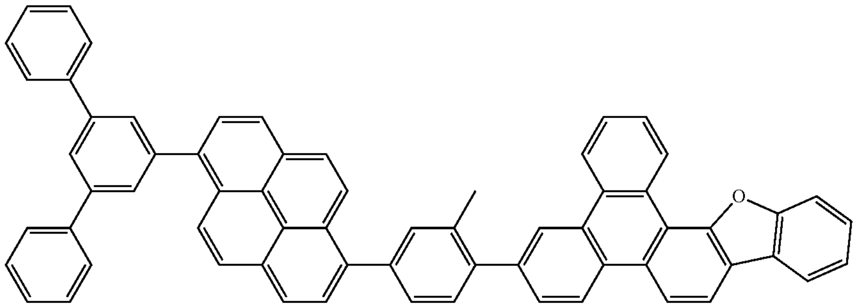
Compound 52
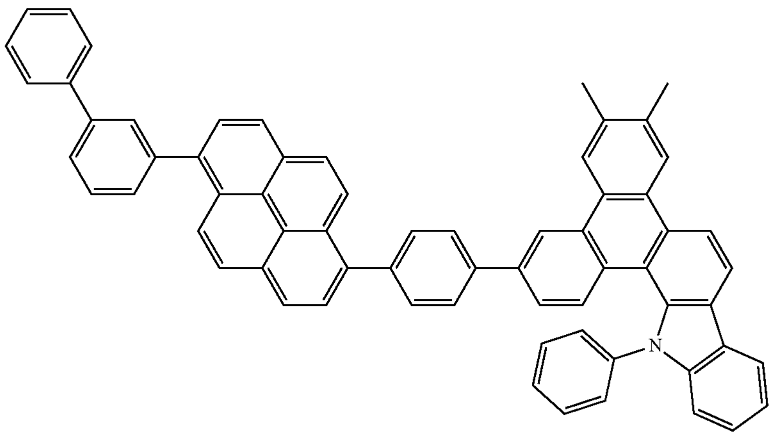
Compound 53
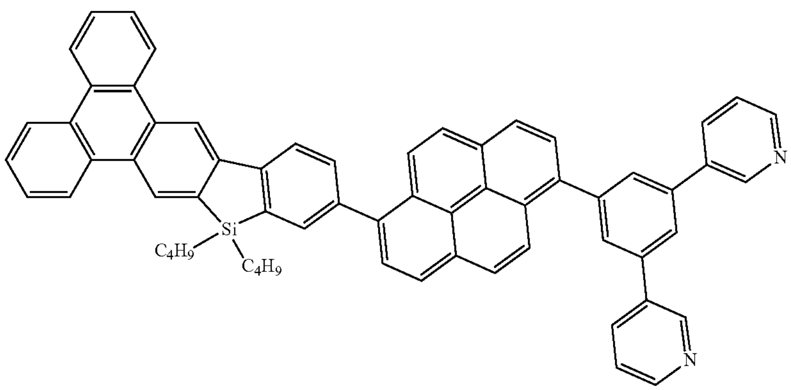
Compound 54
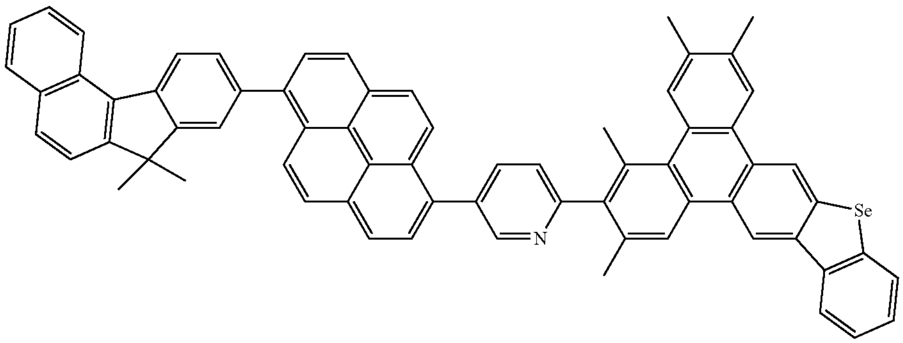

-continued
Compound 55
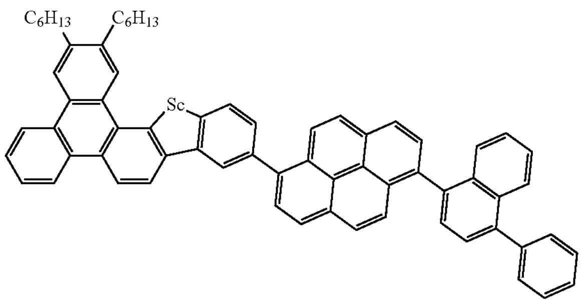
Compound 56
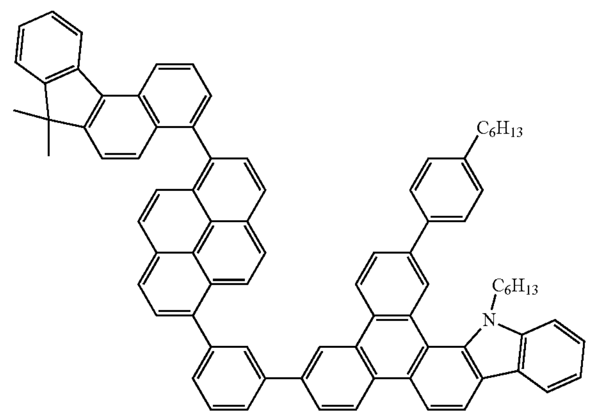
Compound 57
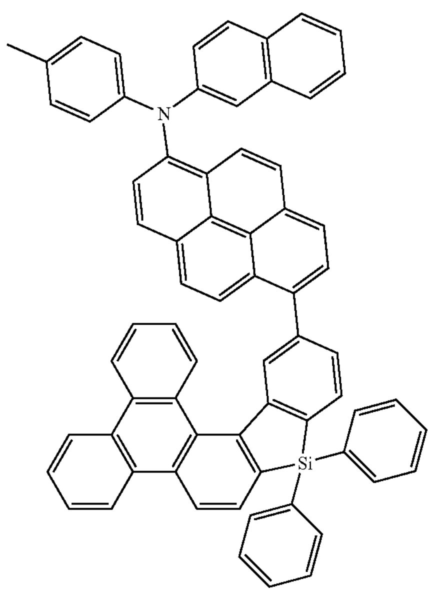
Compound 58
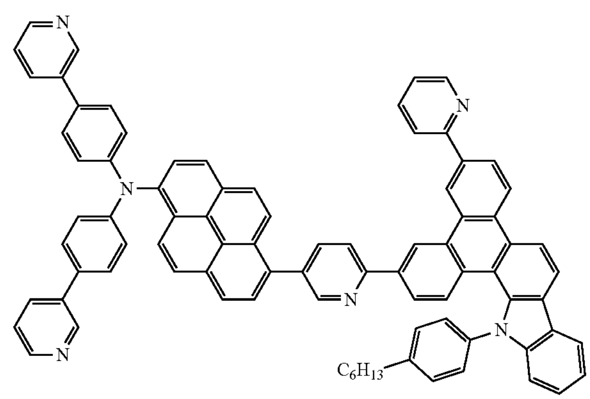
Compound 59
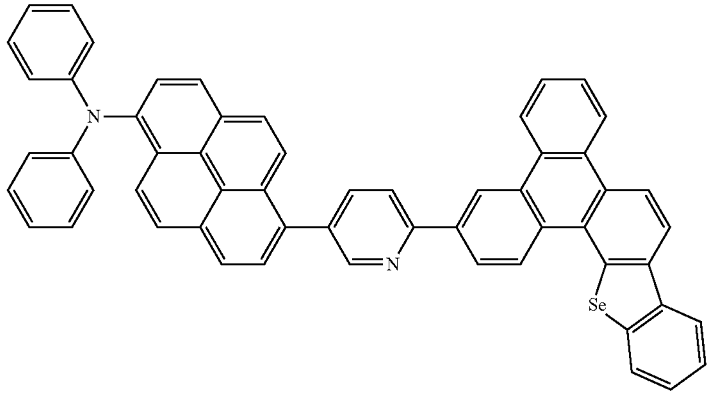

-continued
Compound 60
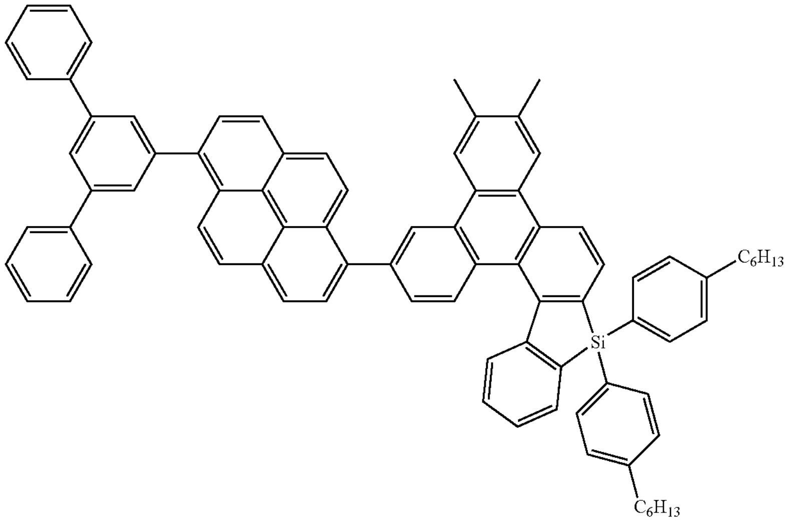
Compound 61
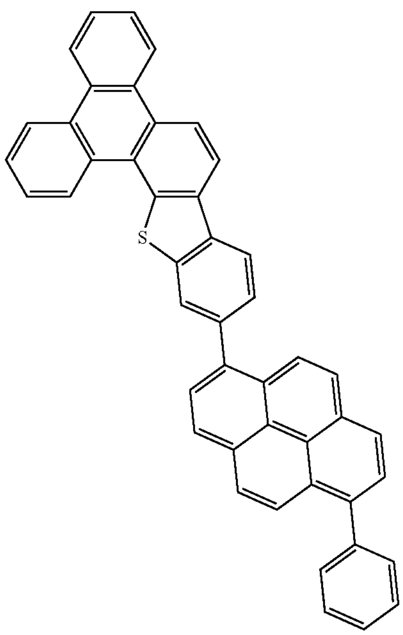
Compound 62
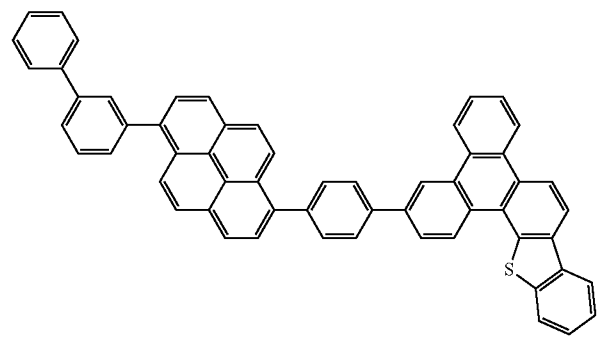
Compound 63
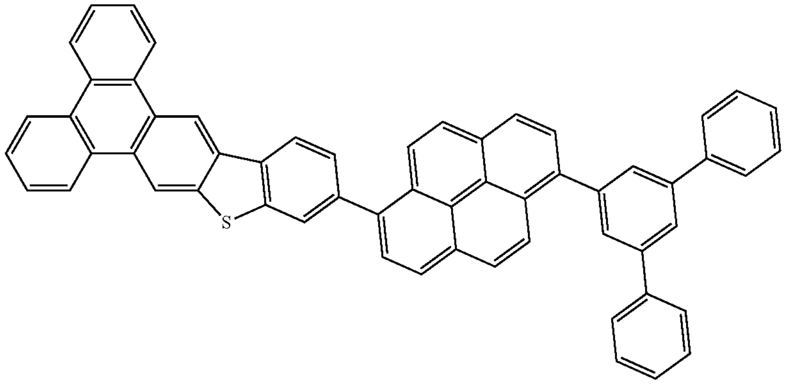

-continued
Compound 64
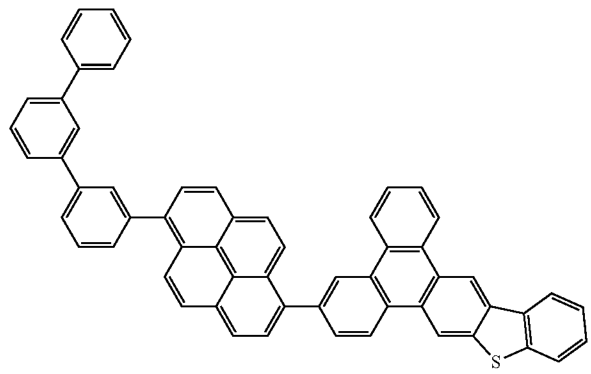
Compound 65
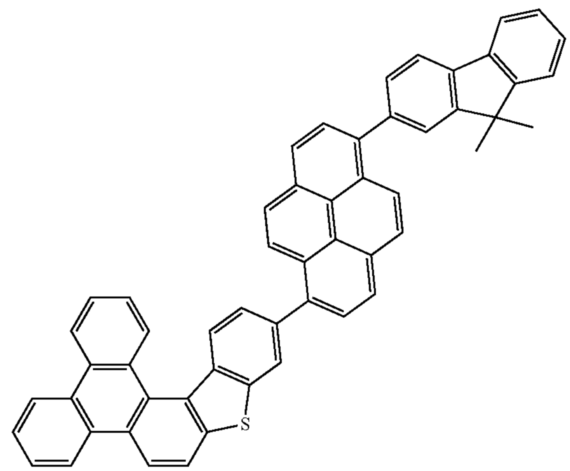
Compound 66
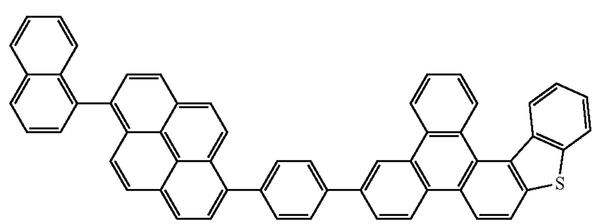
Compound 67
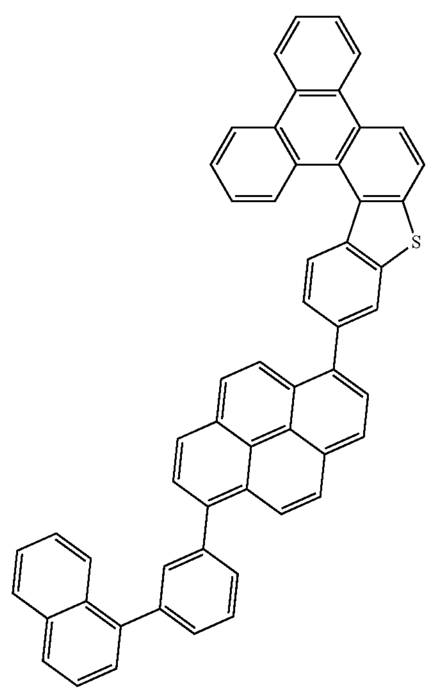

-continued
Compound 68
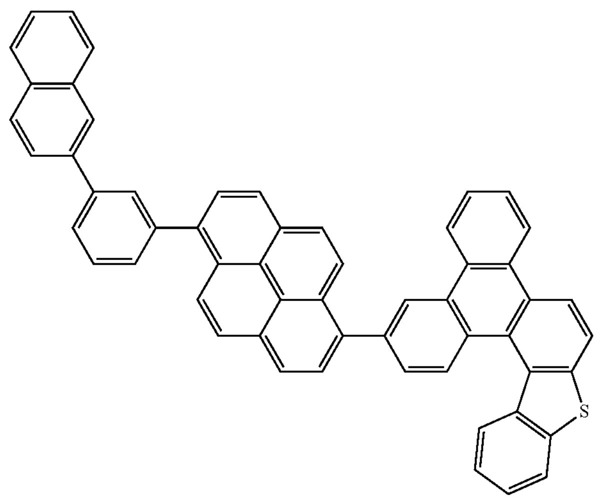
Compound 69
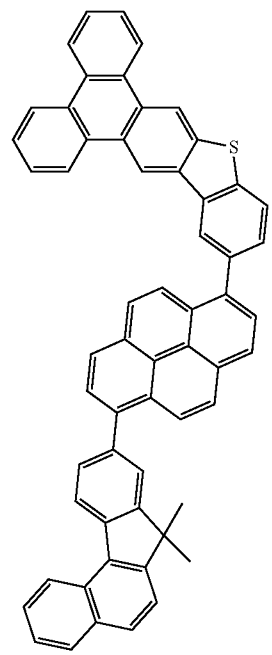
Compound 70
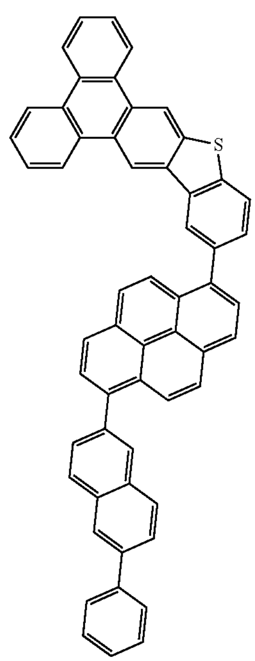
Compound 71
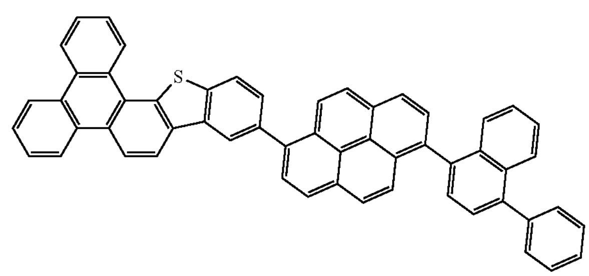

-continued
Compound 72
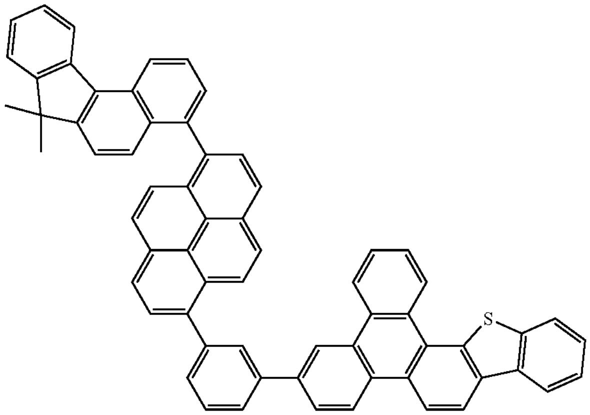
Compound 73
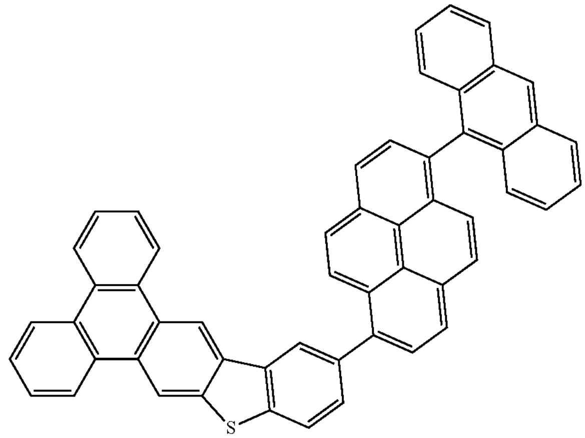
Compound 74
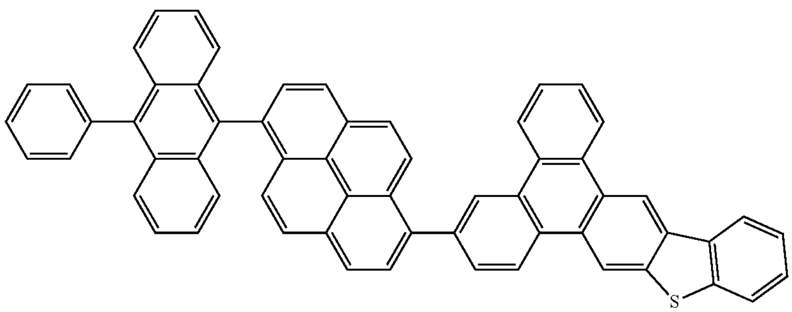
Compound 75
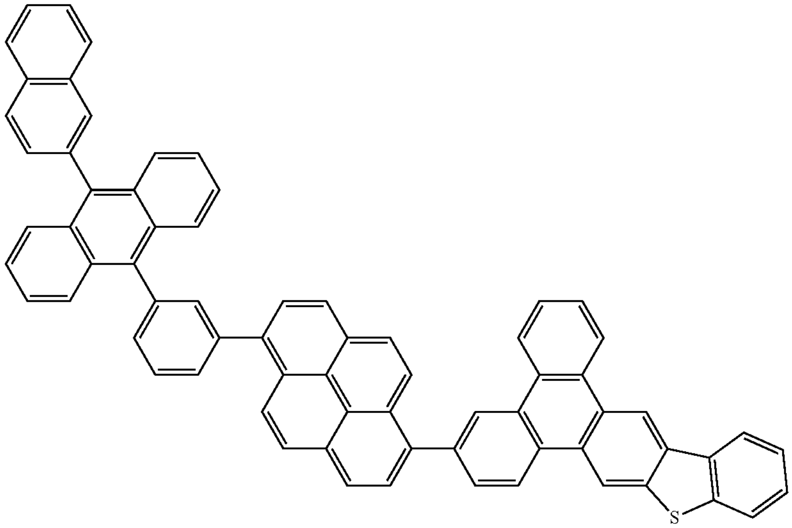

-continued
Compound 76
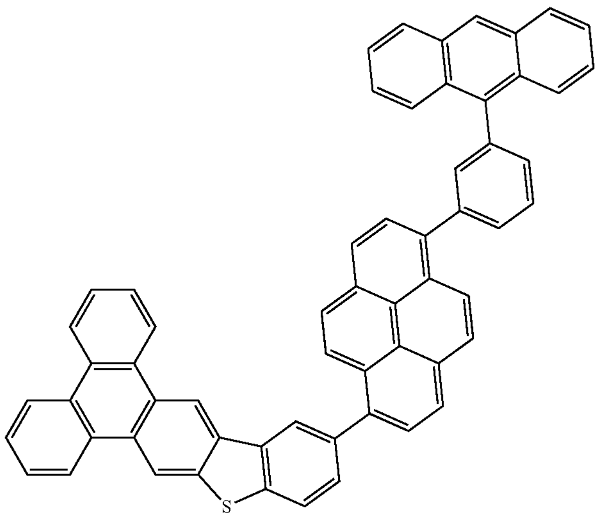
Compound 77
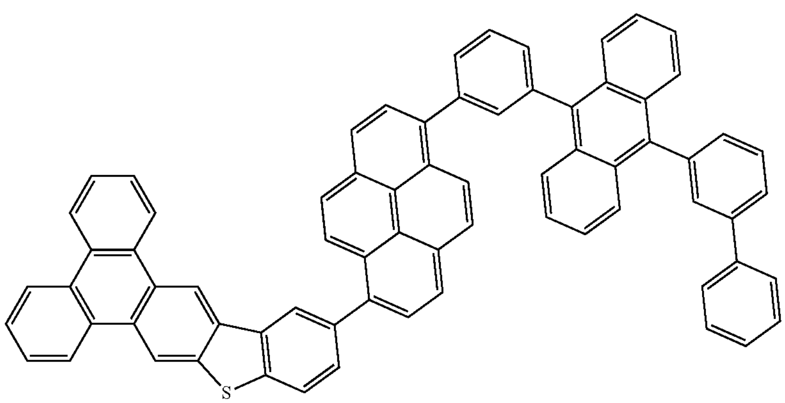
Compound 78
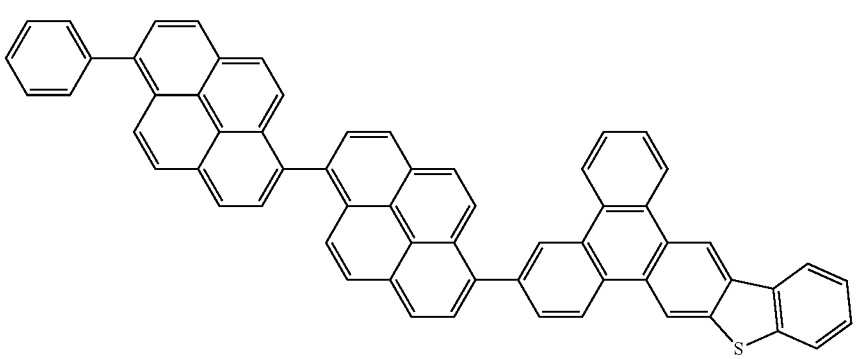

-continued
Compound 79
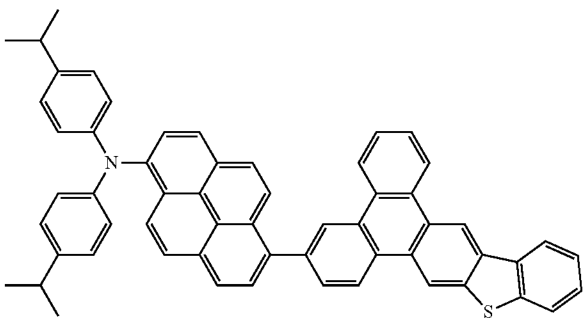
Compound 80
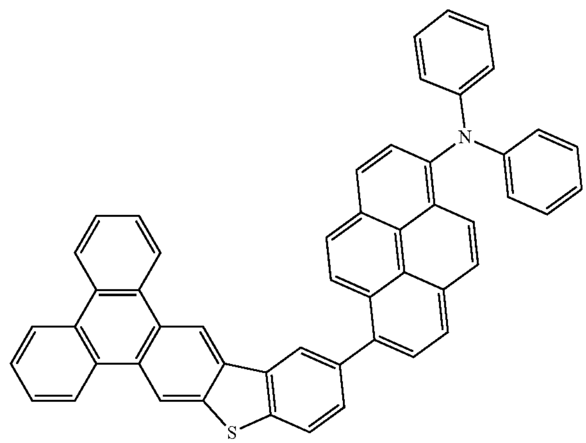
Compound 81
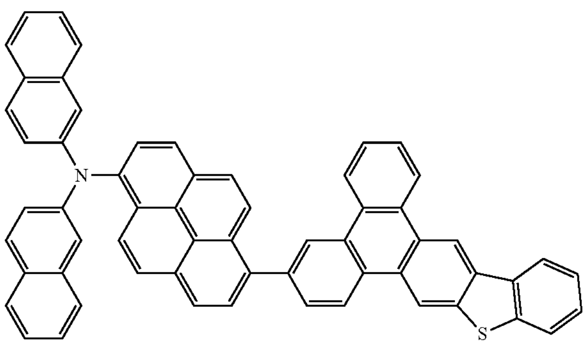
Compound 82
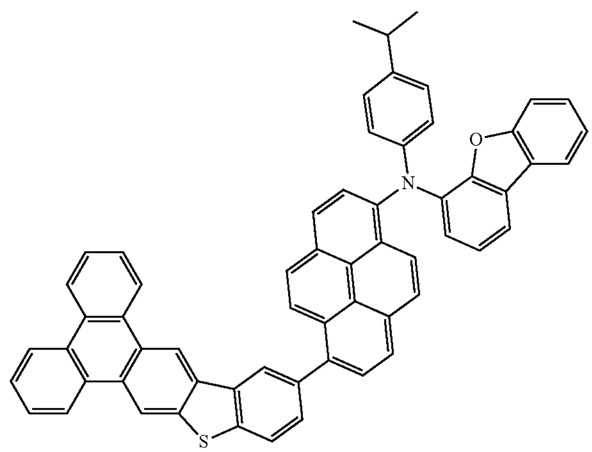
Compound 83
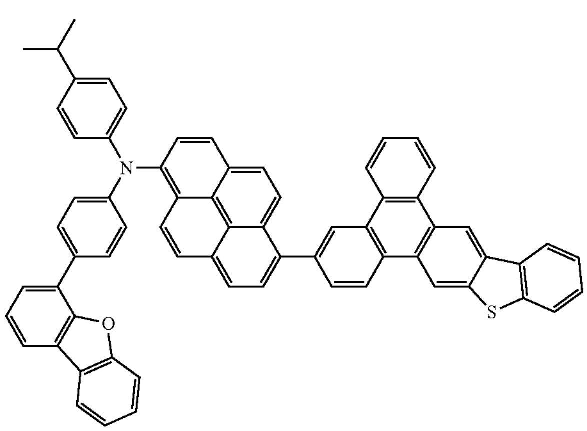
Compound 84
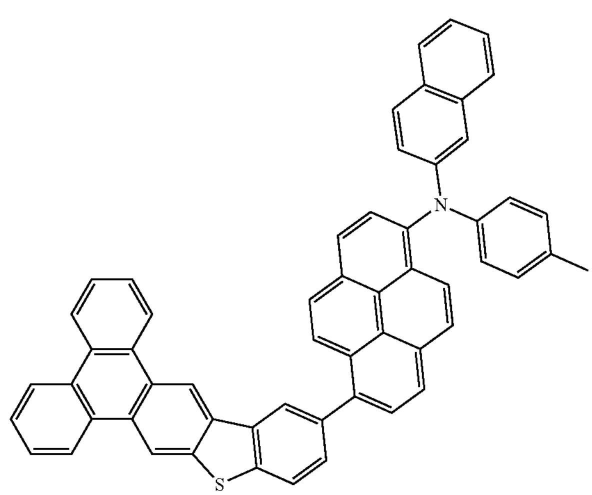

-continued
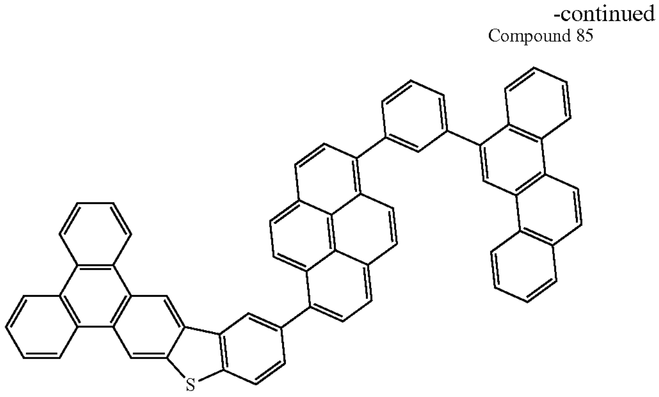
Compound 85
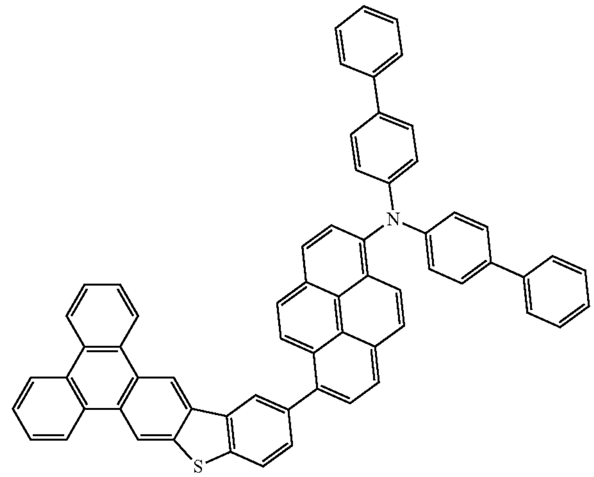
Compound 86
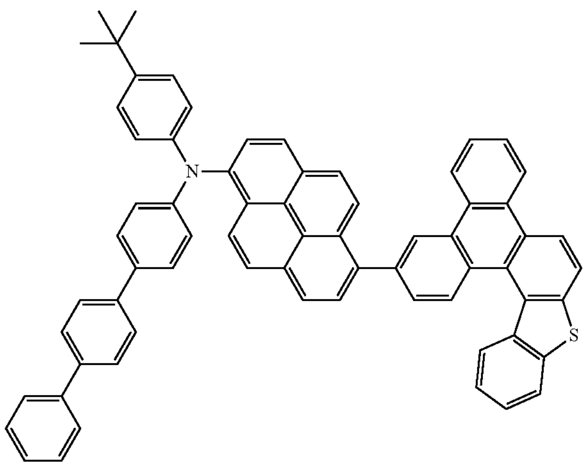
Compound 87
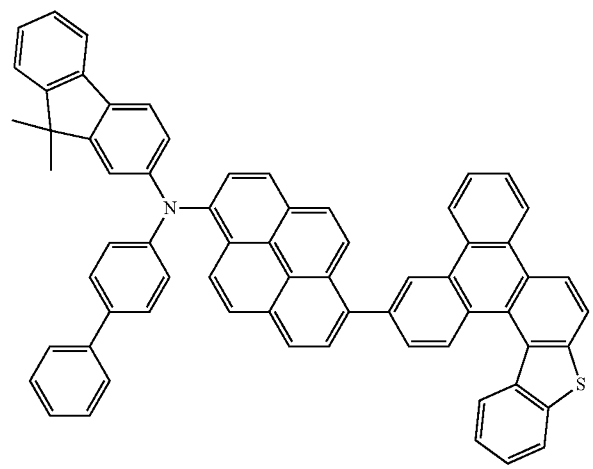
Compound 88
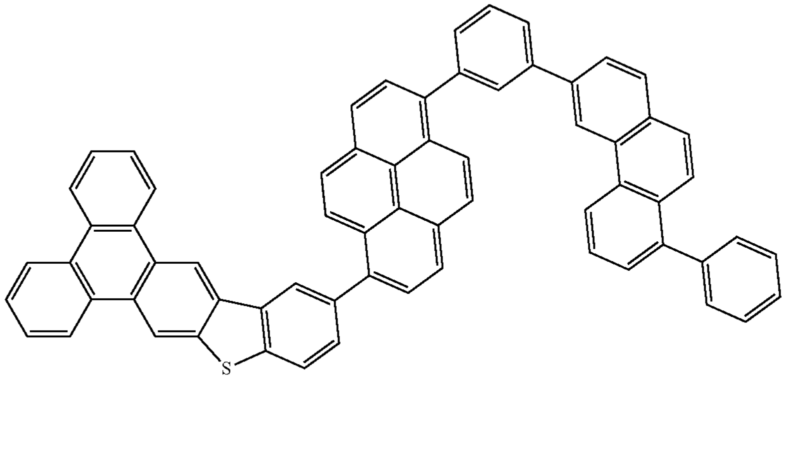
Compound 89

-continued
Compound 90
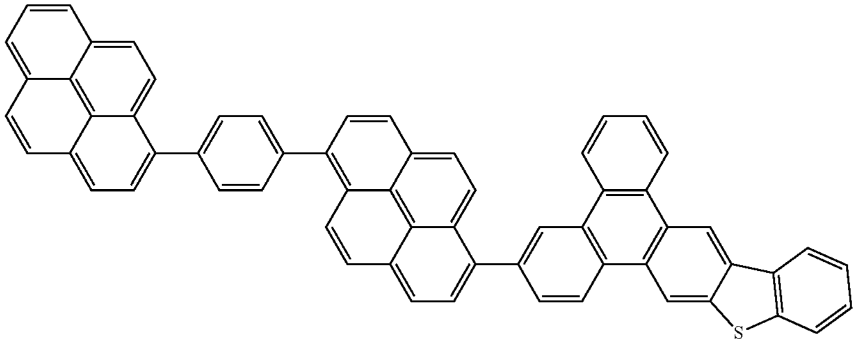
Compound 91
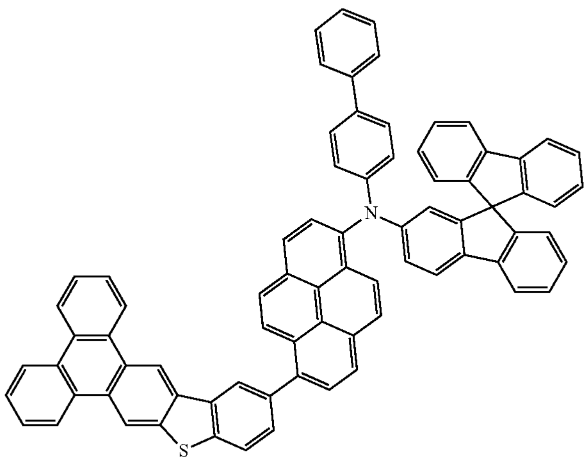
Compound 92
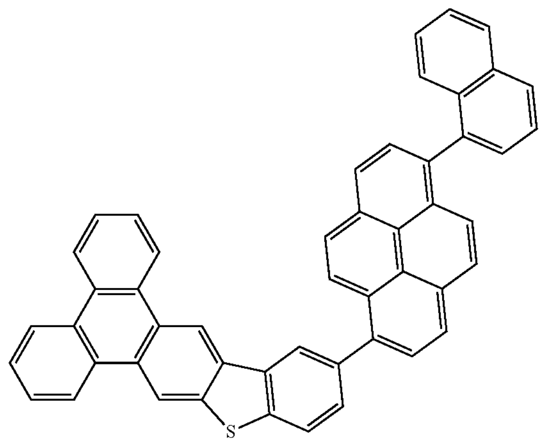
Compound 93
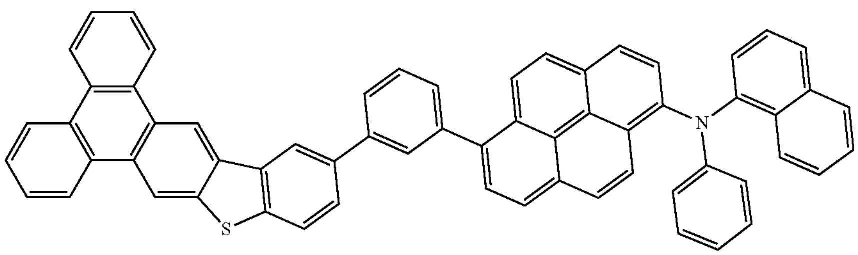
Compound 94
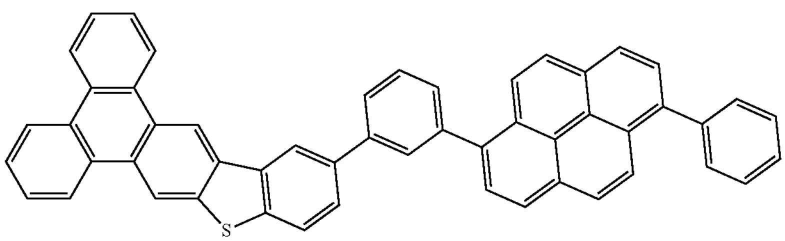
Compound 95
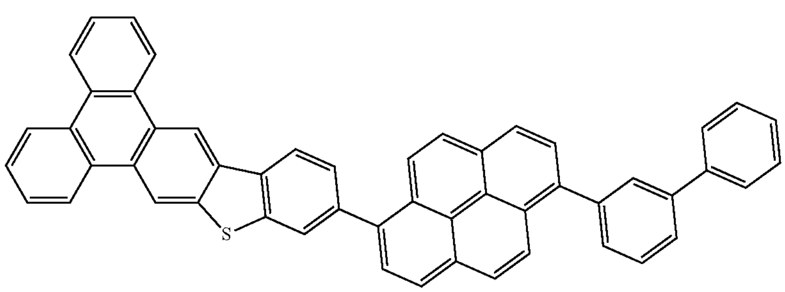

-continued
Compound 96
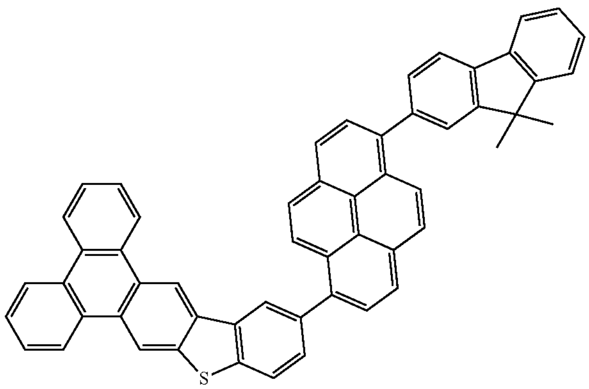
Compound 97
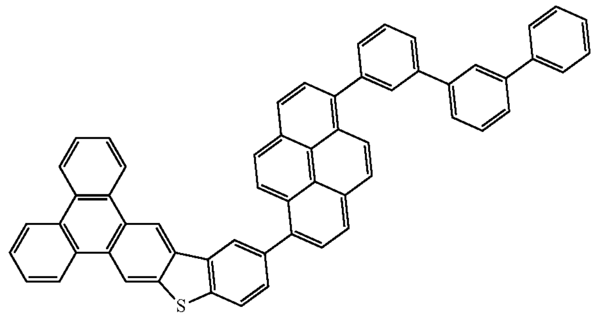
Compound 98
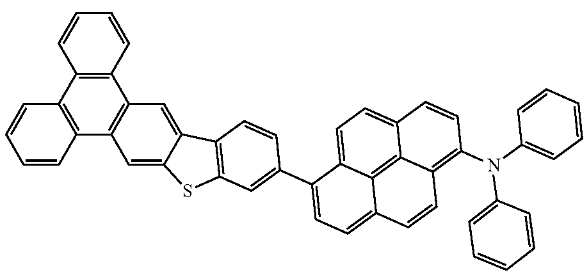
Compound 99
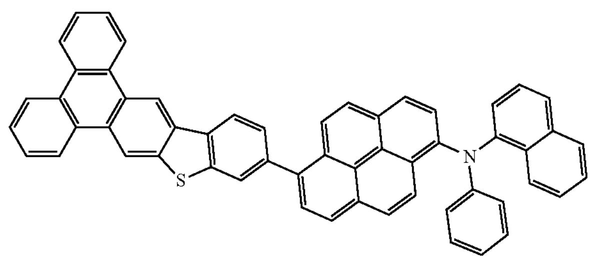
Compound 100
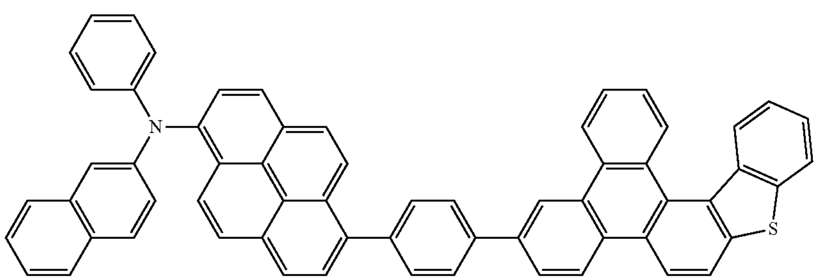
Compound 101
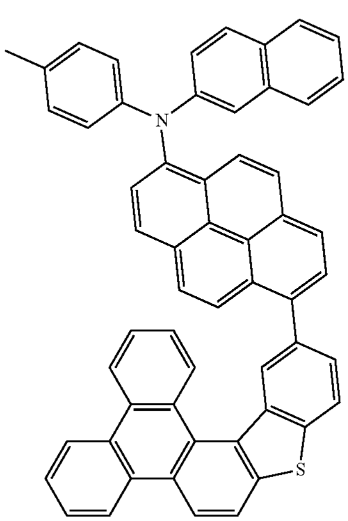
Compound 102
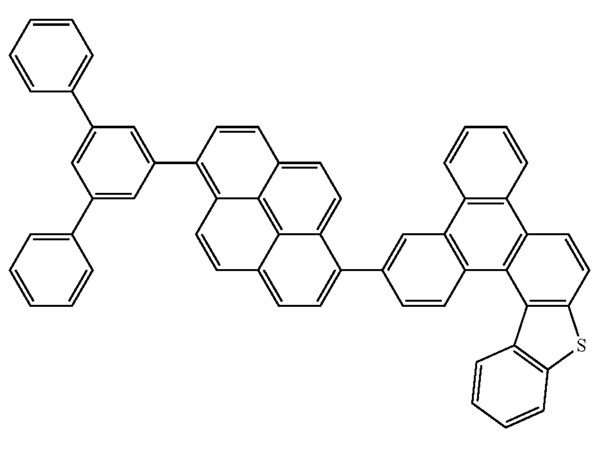

-continued
Compound 103
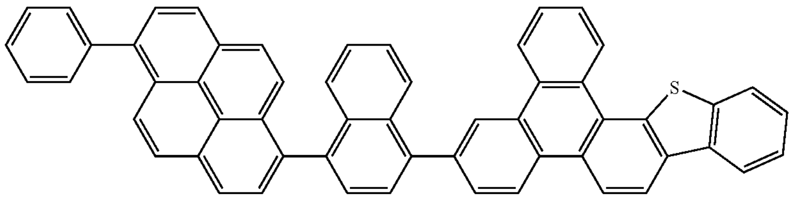
Compound 104
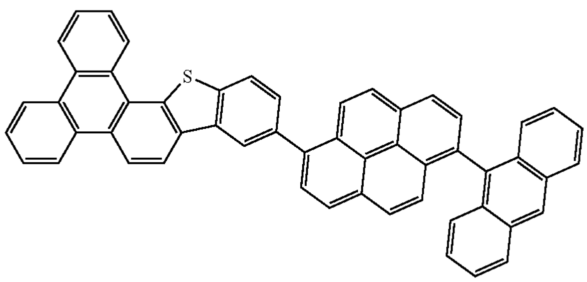
Compound 105
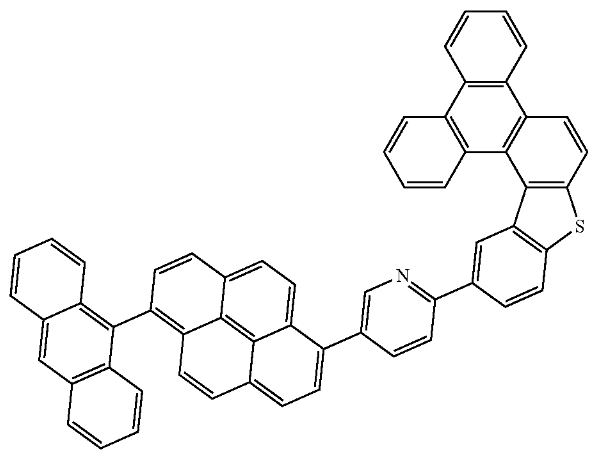
Compound 106
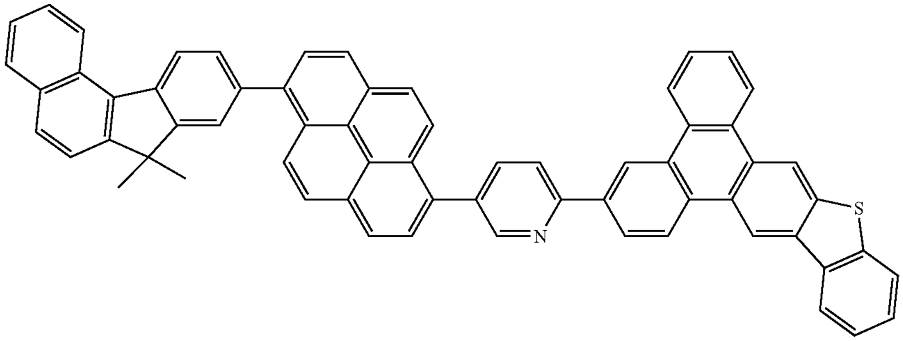

-continued
Compound 107
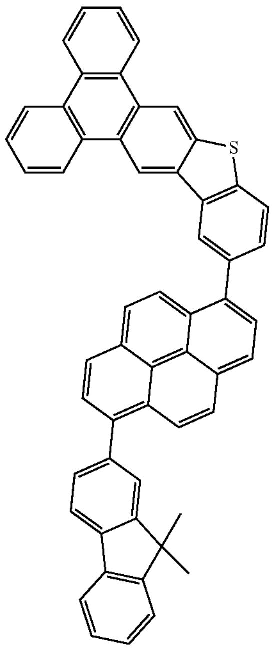
Compound 108
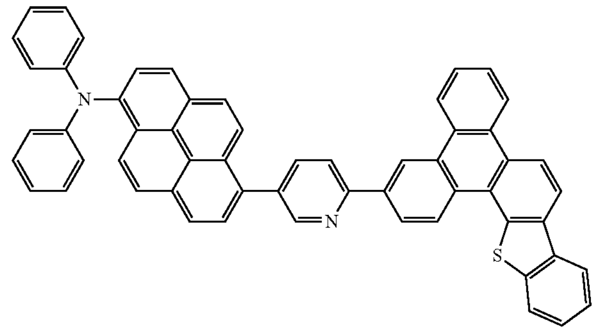
Compound 109
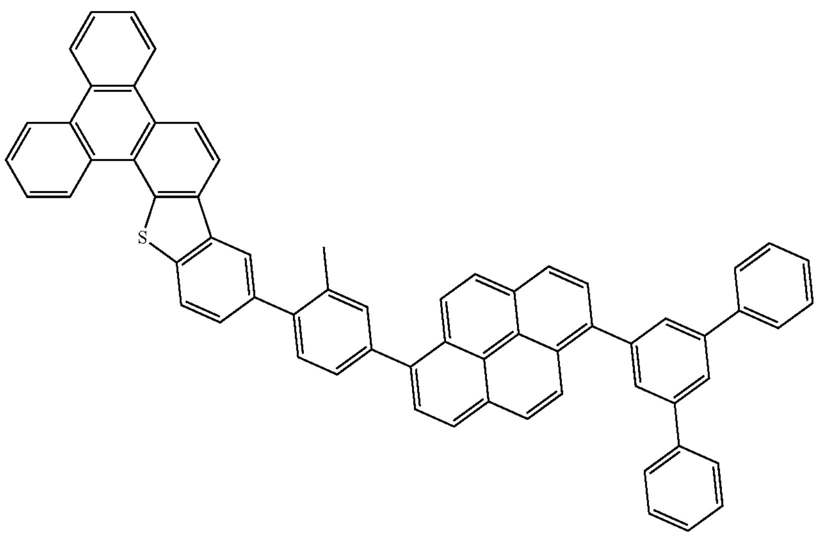
Compound 110
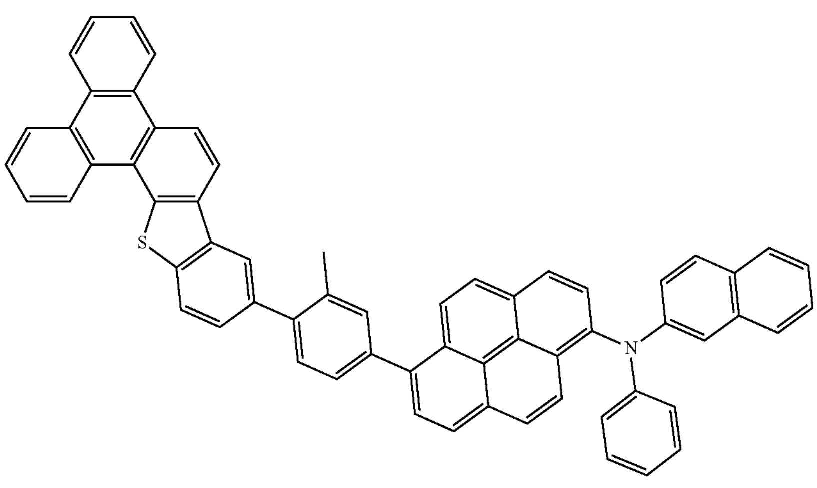

-continued
Compound 111
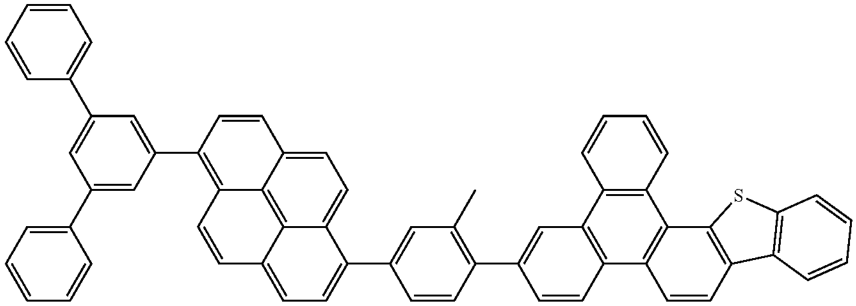
Compound 112
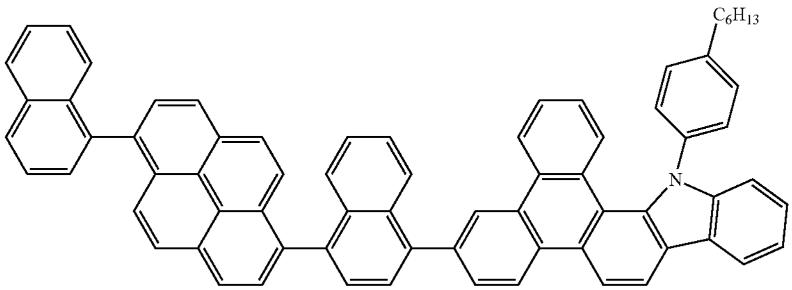
Compound 113
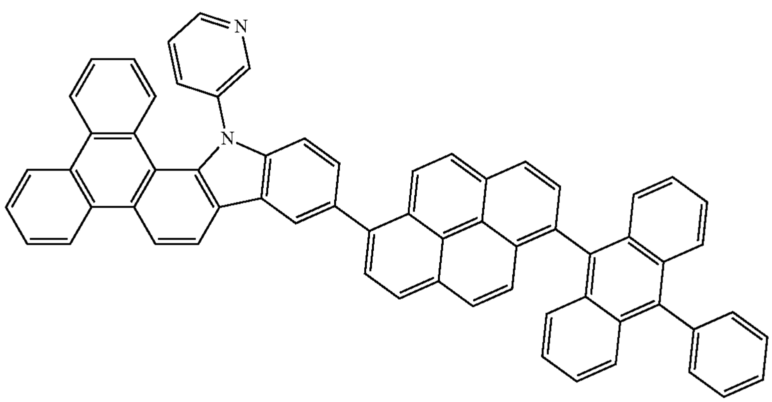
Compound 114
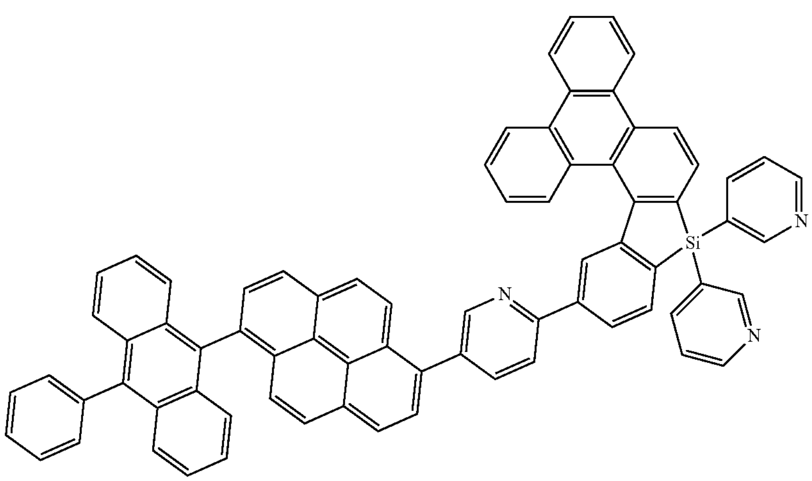

-continued
Compound 115
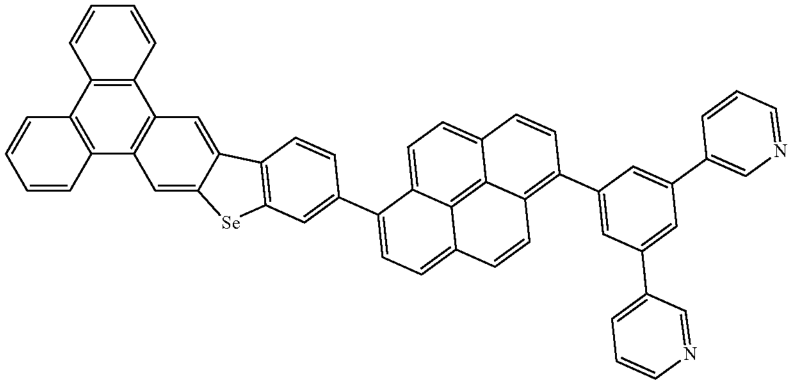
Compound 116
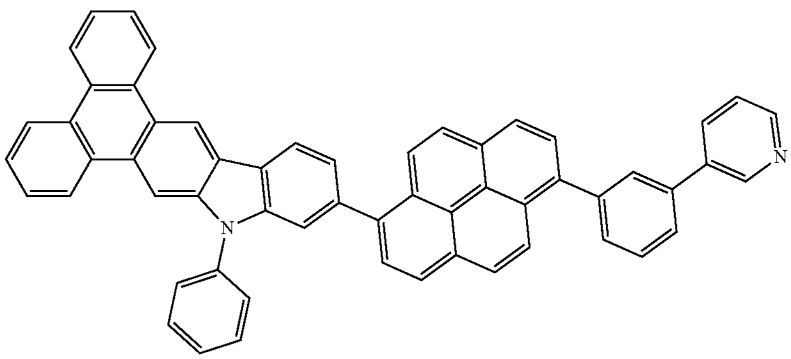
Compound 117
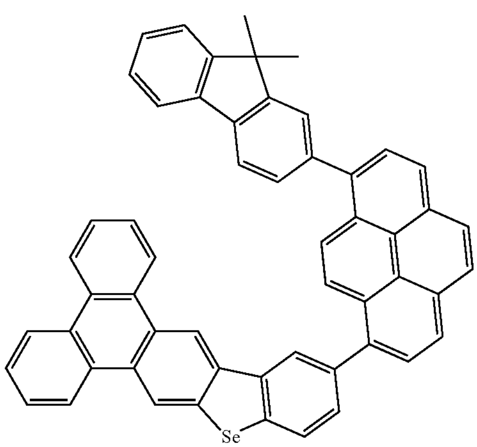
Compound 118
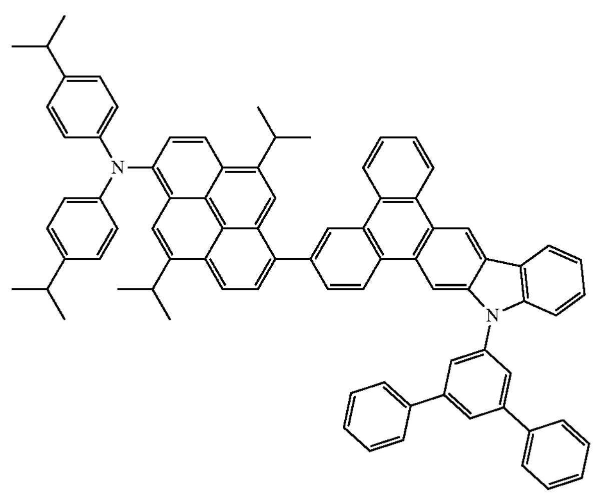

-continued
Compound 119
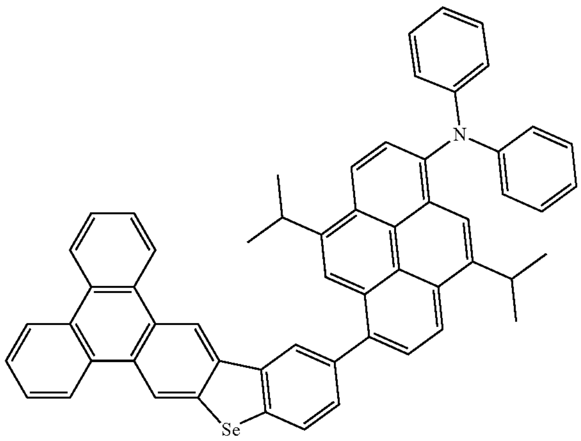
Compound 120
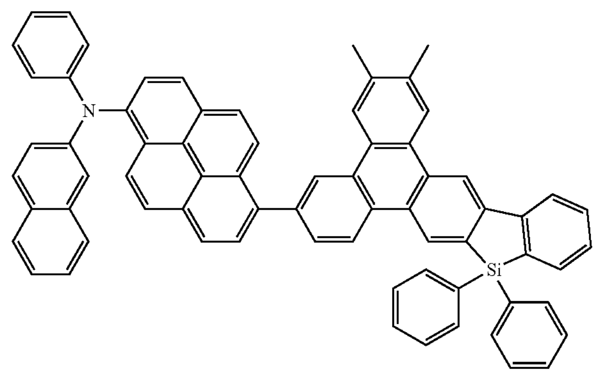
Compound 121
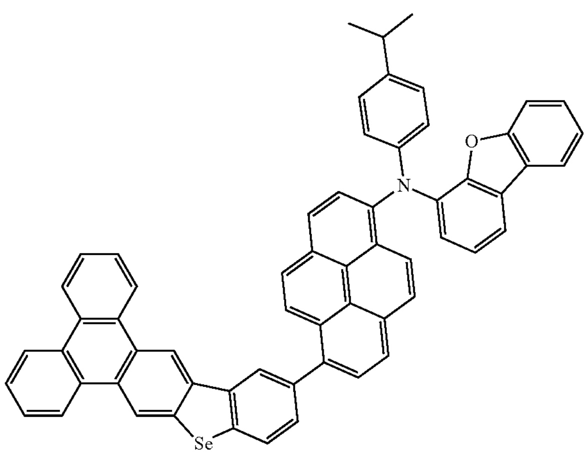
Compound 122
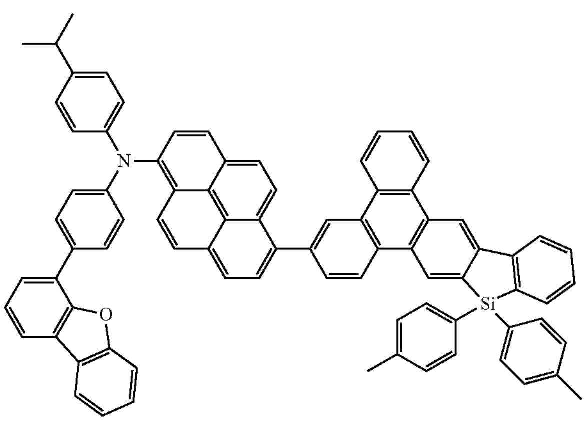
Compound 123
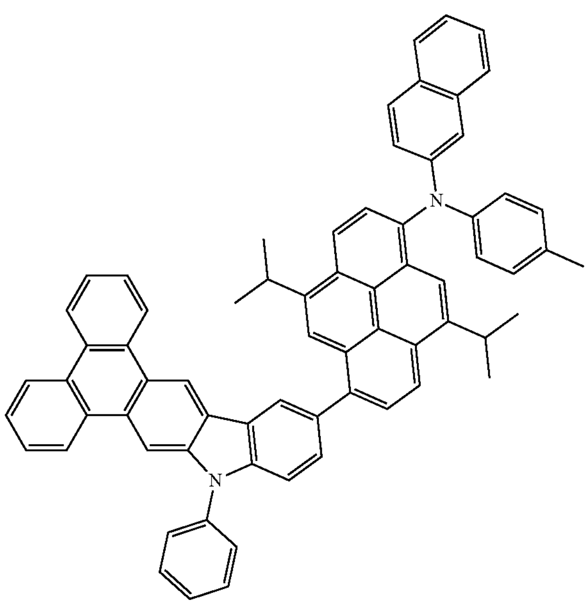
Compound 124
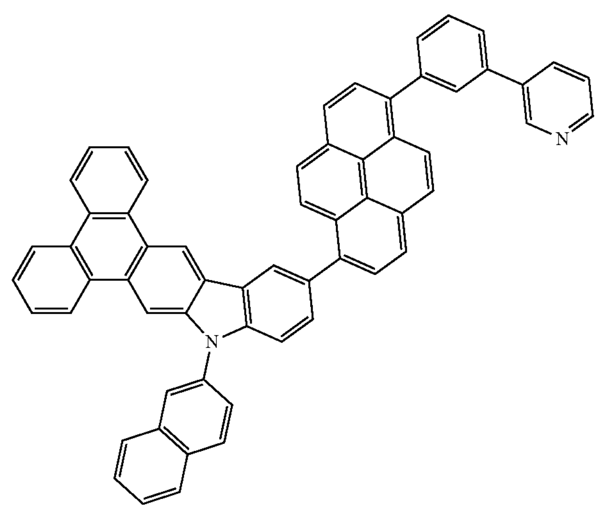

-continued

Compound 125

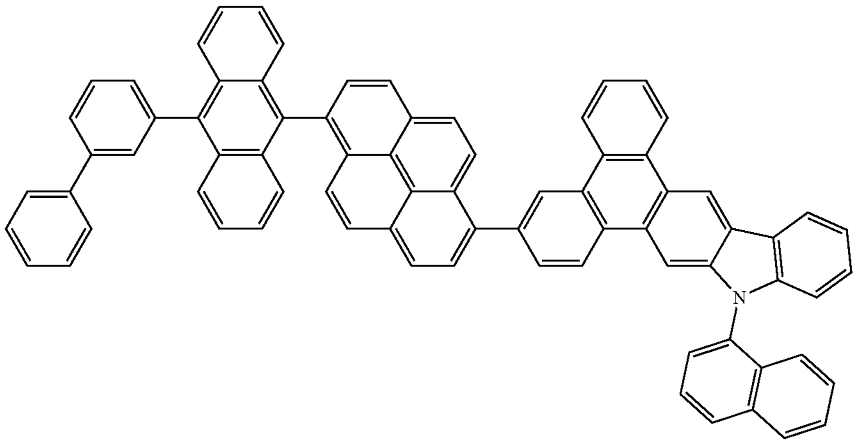

and

Compound 126

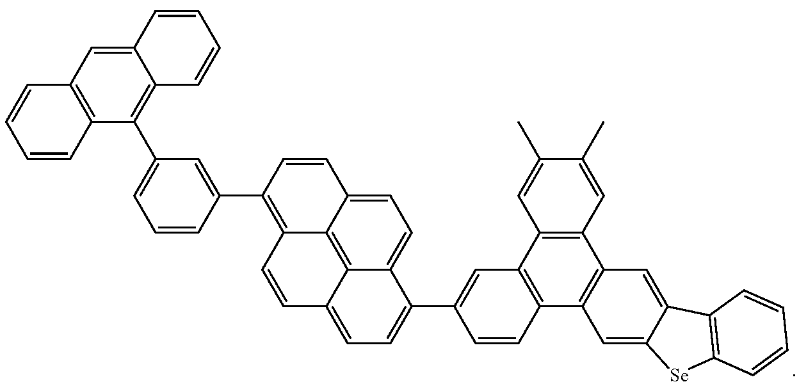

In another embodiment of the present invention, an organic electroluminescence device is disclosed. The organic electroluminescence device comprises a pair of electrodes composed of a cathode and an anode, and a light emitting layer between the pair of electrodes. The light emitting layer comprises the organic compound of formula (A).

In some embodiments, the light emitting layer comprising the organic compound of formula (A) is a host material, a fluorescent dopant material, an electron transporting material, or a hole blocking material.

In a further embodiment of the present invention, the organic electroluminescence device is a lighting panel. In other embodiment of the present invention, the organic electroluminescence device is a backlight panel.

Detailed preparation of the organic compounds of the present invention will be clarified by exemplary embodiments below, but the present invention is not limited thereto. EXAMPLES 1 to 35 show the preparation of the organic compounds of the present invention, and EXAMPLE 36 shows the fabrication and test reports of the organic EL devices.

Example 1

Synthesis of 2-([1,1'-biphenyl]-2-yl)-8-bromodibenzo[b,d]furan

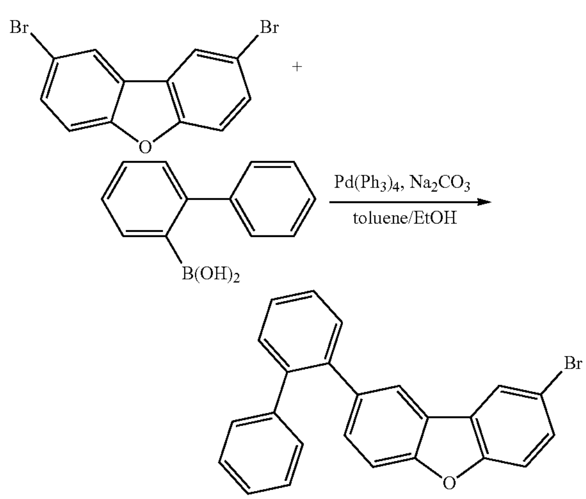

A mixture of 10 g (30.7 mmol) of 2,8-dibromodibenzo[b,d]furan, 6.07 g (30.7 mmol) of [1,1'-biphenyl]-2-ylboronic acid, 0.35 g (0.3 mmol) of $Pd(Ph_3)_4$, 30.7 ml of 2M $Na_2CO_3$, 80 ml of EtOH and 160 ml of toluene was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 6.8 g of 2-([1,1'-biphenyl]-2-yl)-8-bromodibenzo[b,d]furan as whitesolid (55.5%). $^1$H NMR ($CDCl_3$, 400 MHz): chemical shift (ppm) 8.19 (s, 1H), 7.88-7.81 (m, 5H), 7.74-7.72 (s, 2H), 7.52-7.39 (m, 7H).

Synthesis of 13-bromotriphenyleno[2,3-b]benzofuran

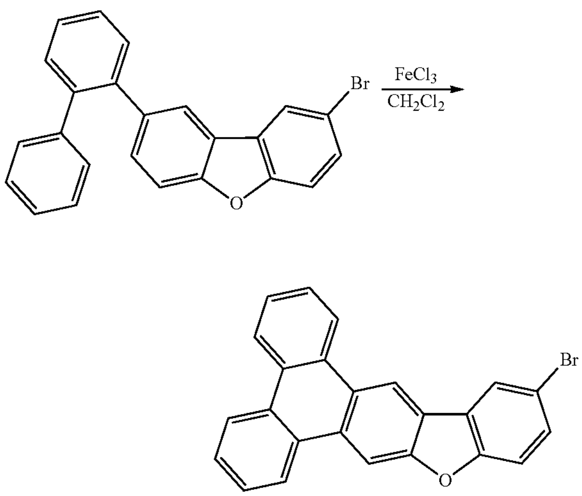

The compound 2-([1,1'-biphenyl]-2-yl)-8-bromodibenzo[b,d]furan (6.8 g, 17 mmol) was mixed with 100 ml of $CH_2Cl_2$. To the mixture, 27.6 g of $FeCl_3$ (170 mmol) was added and the mixture was stirred for 1 hrs. After the reaction finished, the solvent was removed under reduced pressure, and the crude product was purified by column chromatography, yielding 2.9 g of 13-bromotriphenyleno[2,3-b]benzofuran as white solid (43%). $^1$H NMR ($CDCl_3$, 400 MHz): chemical shift (ppm) 8.95-8.91 (m, 3H), 8.19-8.14 (m, 4H), 7.87-7.83 (m, 4H), 7.58 (d, 1H), 7.39 (d, 1H).

Synthesis of 4,4,5,5-tetramethyl-2-(triphenyleno[2,3-b]benzofuran-13-yl)-1,3,2-dioxaborolane

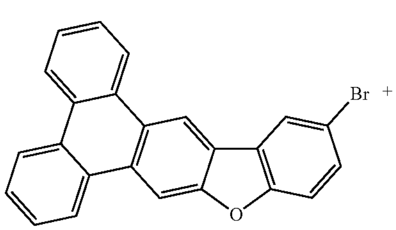

-continued

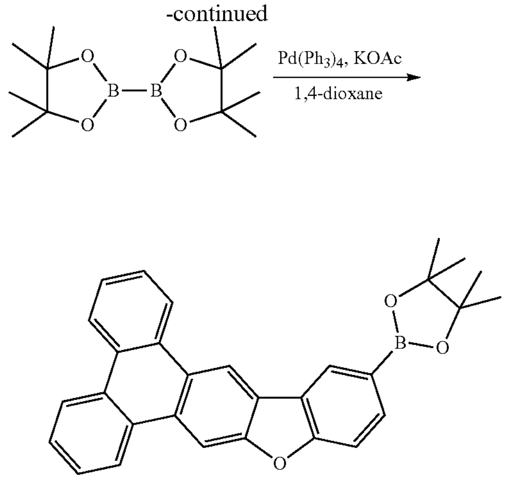

A mixture of 5 g (12.6 mmol) of 13-bromotriphenyleno[2,3-b]-benzofuran, 3.84 g (15.1 mmol) of bis(pinacolato)diboron, 0.58 g (0.5 mmol) of $Pd(Ph_3)_4$, 2.47 g (25.1 mmol) of potassium acetate, and 50 ml of 1,4-dioxane was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 4.1 g of 4,4,5,5-tetramethyl-2-(triphenyleno[2,3-b]benzofuran-13-yl)-1,3,2-dioxaborolane as white solid (73.2%). $^1$H NMR ($CDCl_3$, 400 MHz): chemical shift (ppm) 8.93-8.89 (m, 3H), 8.14-8.12 (m, 3H), 7.89-7.83 (m, 5H), 7.64 (d, 1H), 7.48 (d, 1H), 1.28 (s, 12H).

Synthesis of 13-(6-(anthracen-9-yl)pyren-1-yl)triphenyleno-[2,3-b]benzofuran (Compound 13)

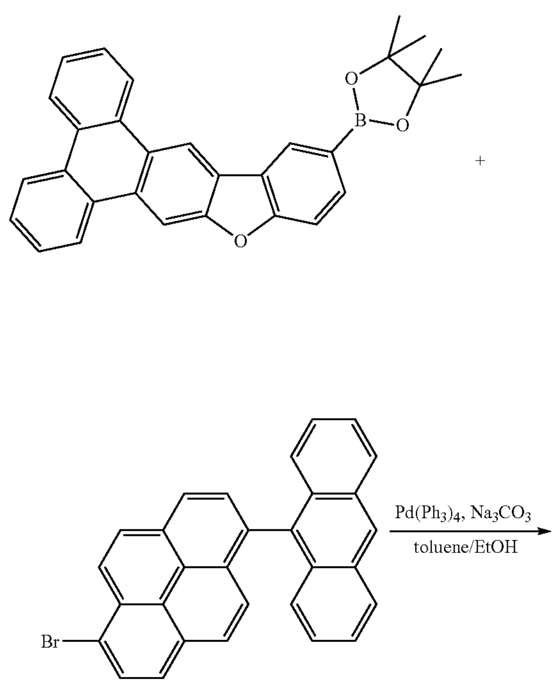

-continued

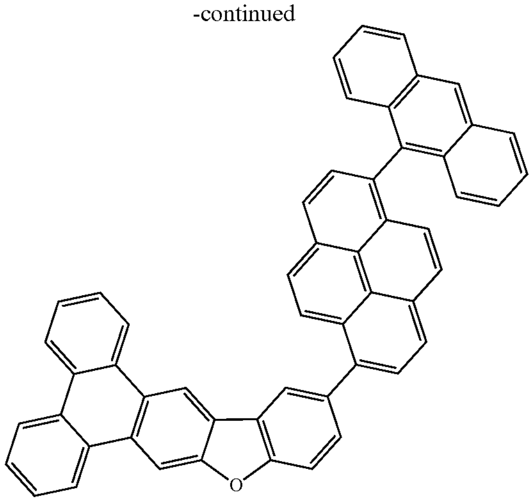

A mixture of 3 g (6.75 mmol) of 4,4,5,5-tetramethyl-2-(triphenyleno[2,3-b]benzofuran-13-yl)-1,3,2-dioxaborolane, 3.7 g (8.1 mmol) of 9-bromo-10-phenylanthracene, 0.16 g (0.14 mmol) of $Pd(Ph_3)_4$, 6.8 ml of 2M $Na_2CO_3$, 20 ml of EtOH and 40 ml of toluene was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 2.2 g of 13-(6-(anthracen-9-yl)pyren-1-yl)triphenyleno[2,3-b]benzofuran as white solid (46.9%). $^1H$ NMR ($CDCl_3$, 400 MHz): chemical shift (ppm) 8.94-8.88 (m, 3H), 8.23-8.13 (m, 5H), 8.05 (m, 2H), 7.93-7.85 (m, 7H), 7.81-7.77 (m, 3H), 7.70-7.65 (m, 6H), 7.40-7.36 (m, 4H).

Example 2-17

We have used the same synthesis methods to get a series of intermediates and the following compounds are synthesized analogously.

| Ex. | Intermediate I | Intermediate II | Product | Yield |
|---|---|---|---|---|
| 2 | 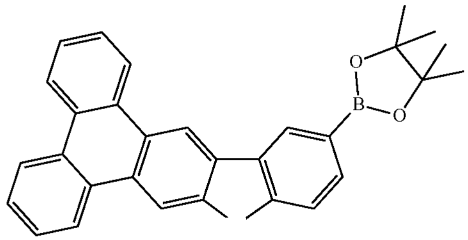 [SMILES: CC1(C)OB(c2ccc3c(c2)-c2cc4c5ccccc5c5ccccc5c4cc2C3)OC1(C)C] | 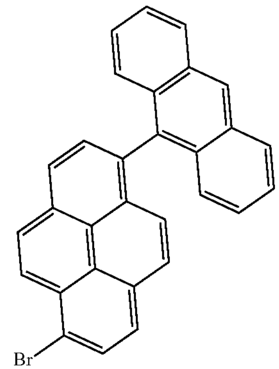 [SMILES: Brc1ccc2ccc3c(-c4c5ccccc5cc5ccccc45)ccc4ccc1c2c43] | 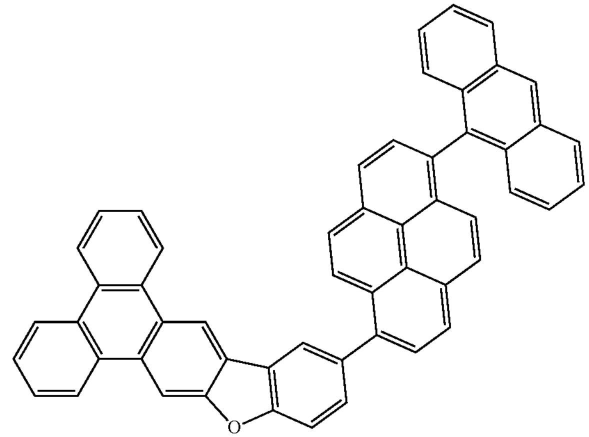 Compound 13 | 41% |
| 3 | 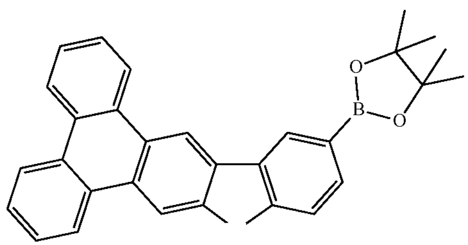 [SMILES: CC1(C)OB(c2ccc3c(c2)-c2cc4c5ccccc5c5ccccc5c4cc2C3)OC1(C)C] | 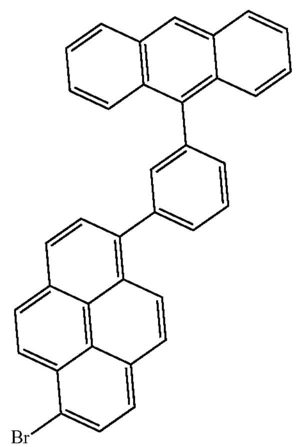 [SMILES: Brc1ccc2ccc3c(-c4cccc(-c5c6ccccc6cc6ccccc56)c4)ccc4ccc1c2c43] | 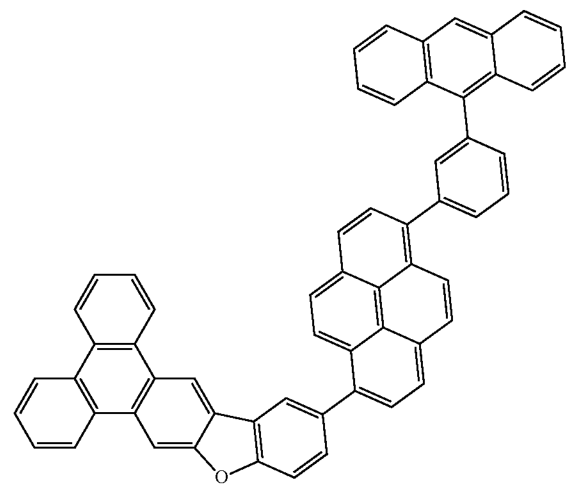 Compound 16 | 39% |

-continued
| Ex. | Intermediate I | Intermediate II | Product | Yield |
| --- | --- | --- | --- | --- |
| 4 | 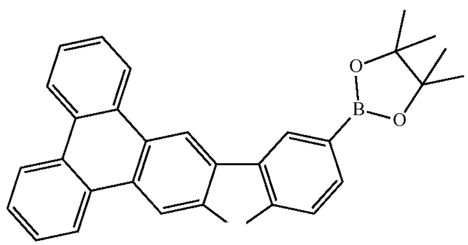 [SMILES: CC1(C)OB(c2ccc3c(c2)-c2cc4c5ccccc5c5ccccc5c4cc2C3)OC1(C)C] | 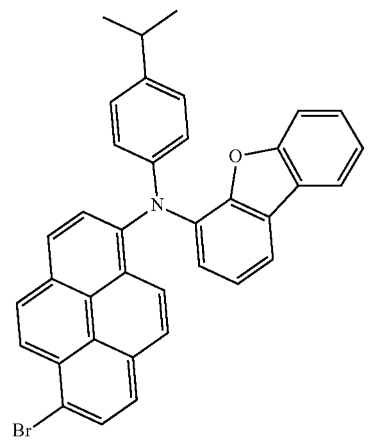 [SMILES: CC(C)c1ccc(N(c2ccc3ccc4c(Br)ccc5ccc2c3c54)c2cccc3c2oc2ccccc23)cc1] | 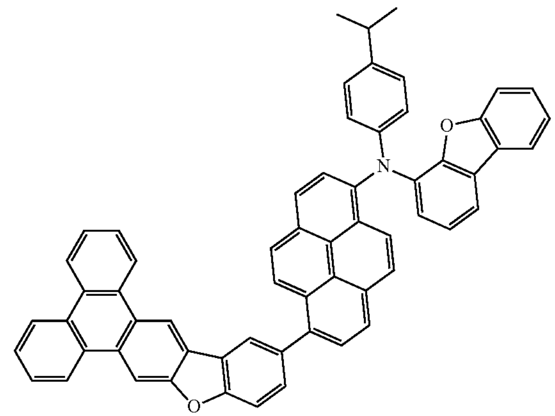 Compound 22 | 43% |
| 5 | 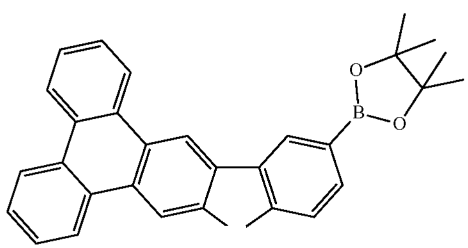 [SMILES: CC1(C)OB(c2ccc3c(c2)-c2cc4c5ccccc5c5ccccc5c4cc2C3)OC1(C)C] | 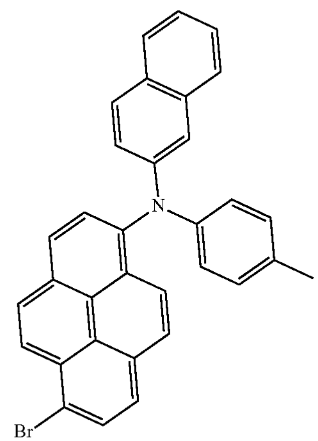 [SMILES: Cc1ccc(N(c2ccc3ccccc3c2)c2ccc3ccc4c(Br)ccc5ccc2c3c54)cc1] | 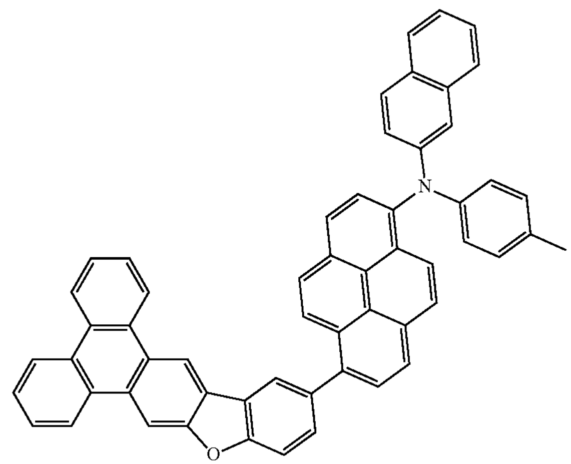 Compound 24 | 47% |

-continued
| Ex. | Intermediate I | Intermediate II | Product | Yield |
|---|---|---|---|---|
| 6 | 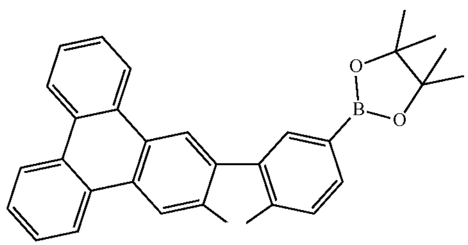 [SMILES: CC1(C)OB(c2ccc3c(c2)-c2cc4c5ccccc5c5ccccc5c4cc2C3)OC1(C)C] | 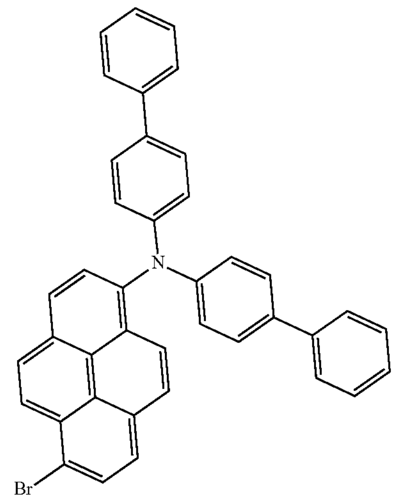 [SMILES: Brc1ccc2ccc3c(N(c4ccc(-c5ccccc5)cc4)c4ccc(-c5ccccc5)cc4)ccc4ccc1c2c43] | 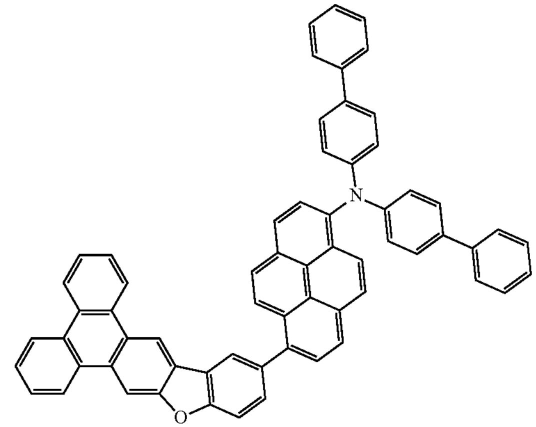 Compound 26 | 45% |
| 7 | 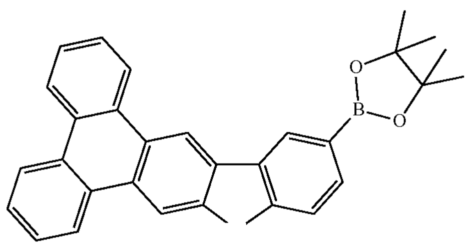 [SMILES: CC1(C)OB(c2ccc3c(c2)-c2cc4c5ccccc5c5ccccc5c4cc2C3)OC1(C)C] | 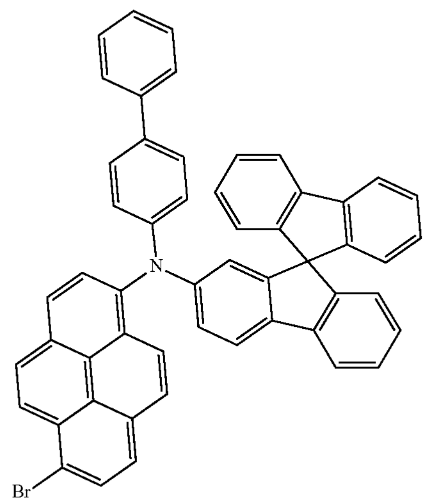 [SMILES: Brc1ccc2ccc3c(N(c4ccc(-c5ccccc5)cc4)c4ccc5c(c4)C4(c6ccccc6-c6ccccc64)c4ccccc4-5)ccc4ccc1c2c43] | 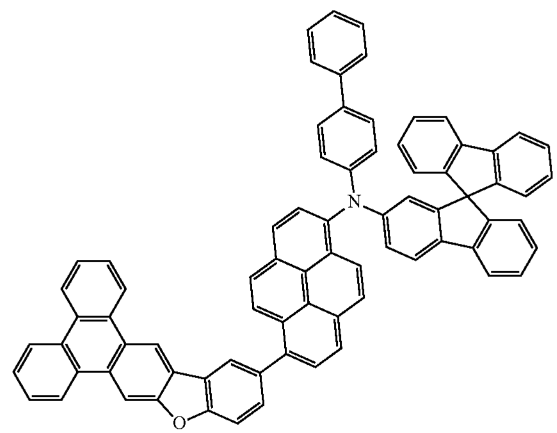 Compound 31 | 48% |

-continued
| Ex. | Intermediate I | Intermediate II | Product | Yield |
| --- | --- | --- | --- | --- |
| 8 | 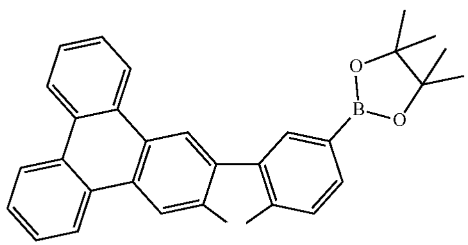 [SMILES: CC1(C)OB(c2ccc3c(c2)-c2cc4c5ccccc5c5ccccc5c4cc2C3)OC1(C)C] | 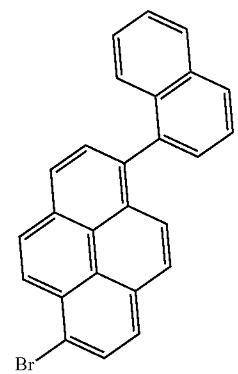 [SMILES: Brc1ccc2ccc3c(-c4cccc5ccccc45)ccc4ccc1c2c43] | 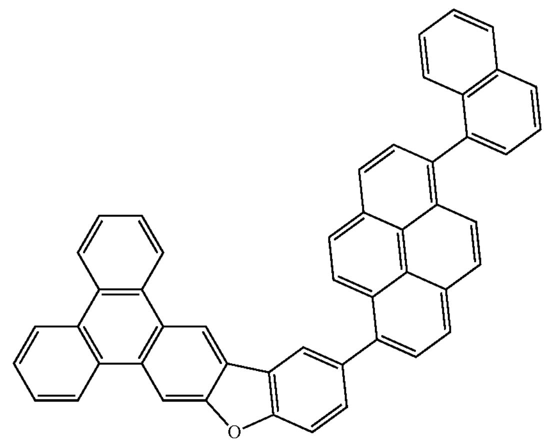 Compound 32 | 45% |
| 9 | 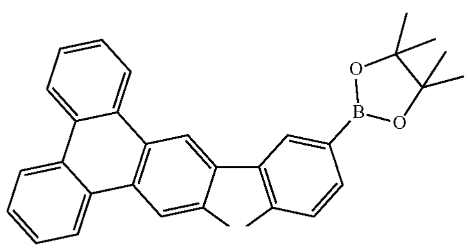 [SMILES: CC1(C)OB(c2ccc3c(c2)-c2cc4c5ccccc5c5ccccc5c4cc2C3)OC1(C)C] | 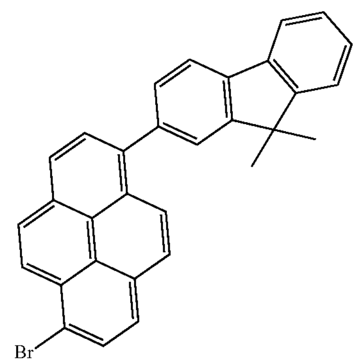 [SMILES: CC1(C)c2ccccc2-c2ccc(-c3ccc4ccc5c(Br)ccc6ccc3c4c65)cc21] | 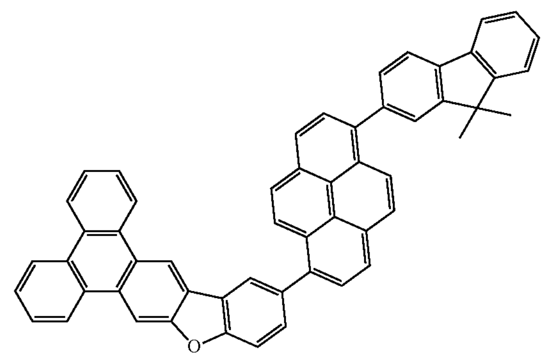 Compound 36 | 40% |

-continued
| Ex. | Intermediate I | Intermediate II | Product | Yield |
| --- | --- | --- | --- | --- |
| 10 | 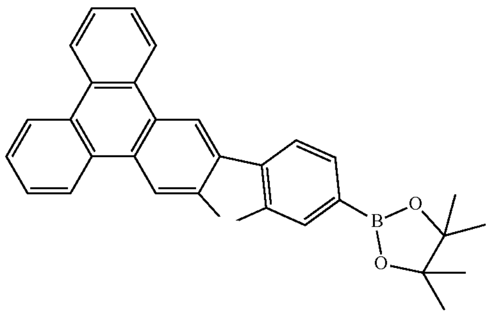 [SMILES: CC1(C)OB(c2ccc3c(c2)Cc2cc4c5ccccc5c5ccccc5c4cc2-3)OC1(C)C] | 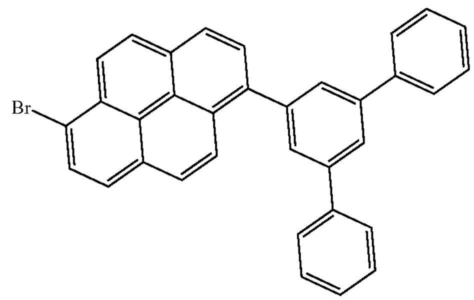 [SMILES: Brc1ccc2ccc3c(-c4cc(-c5ccccc5)cc(-c5ccccc5)c4)ccc4ccc1c2c43] | 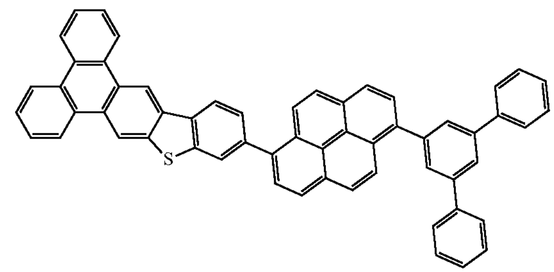 Compound 63 | 42% |
| 11 | 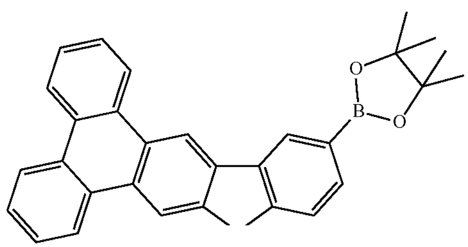 [SMILES: CC1(C)OB(c2ccc3c(c2)-c2cc4c5ccccc5c5ccccc5c4cc2C3)OC1(C)C] | 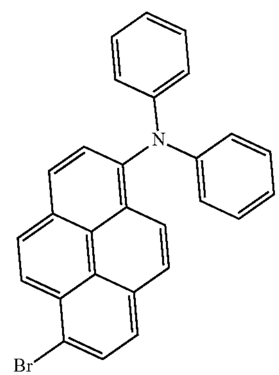 [SMILES: Brc1ccc2ccc3c(N(c4ccccc4)c4ccccc4)ccc4ccc1c2c43] | 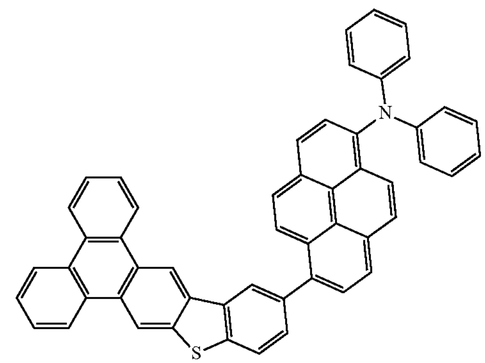 Compound 80 | 44% |

-continued
| Ex. | Intermediate I | Intermediate II | Product | Yield |
|---|---|---|---|---|
| 12 | 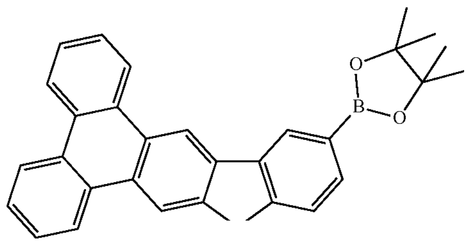 [SMILES: CC1(C)OB(c2ccc3c(c2)-c2cc4c5ccccc5c5ccccc5c4cc2C3)OC1(C)C] | 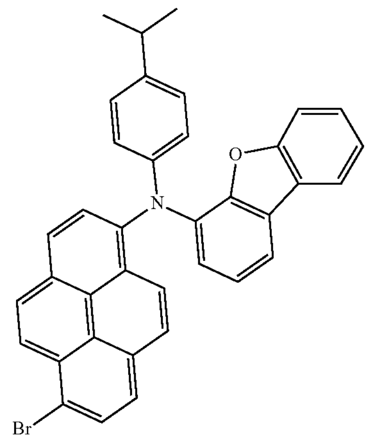 [SMILES: CC(C)c1ccc(N(c2ccc3ccc4c(Br)ccc5ccc2c3c54)c2cccc3c2oc2ccccc23)cc1] | 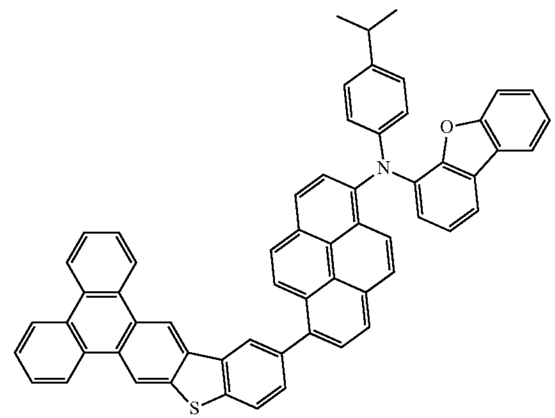 Compound 82 | 42% |
| 13 | 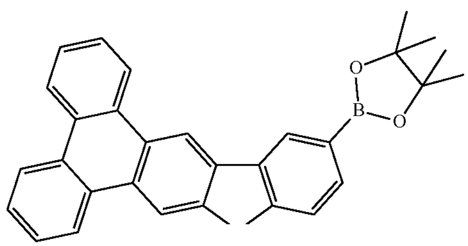 [SMILES: CC1(C)OB(c2ccc3c(c2)-c2cc4c5ccccc5c5ccccc5c4cc2C3)OC1(C)C] | 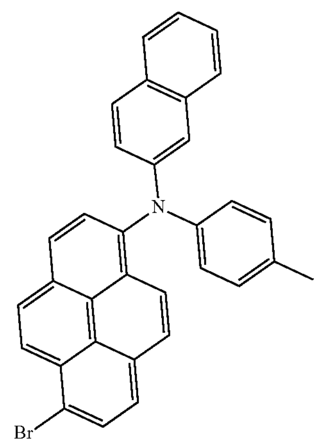 [SMILES: Cc1ccc(N(c2ccc3ccccc3c2)c2ccc3ccc4c(Br)ccc5ccc2c3c54)cc1] | 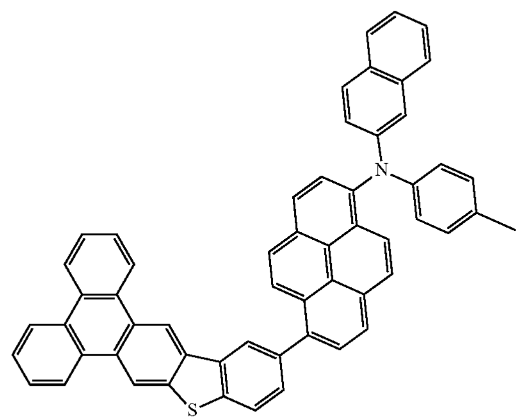 Compound 84 | 40% |

-continued
| Ex. | Intermediate I | Intermediate II | Product | Yield |
|---|---|---|---|---|
| 14 | 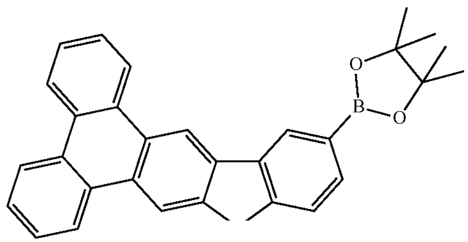 [SMILES: CC1(C)OB(c2ccc3c(c2)-c2cc4c5ccccc5c5ccccc5c4cc2C3)OC1(C)C] | 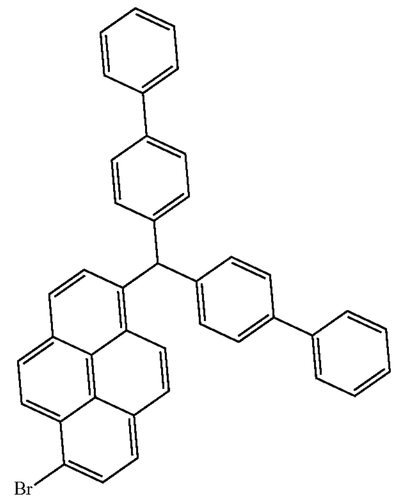 [SMILES: Brc1ccc2ccc3c(C(c4ccc(-c5ccccc5)cc4)c4ccc(-c5ccccc5)cc4)ccc4ccc1c2c43] | 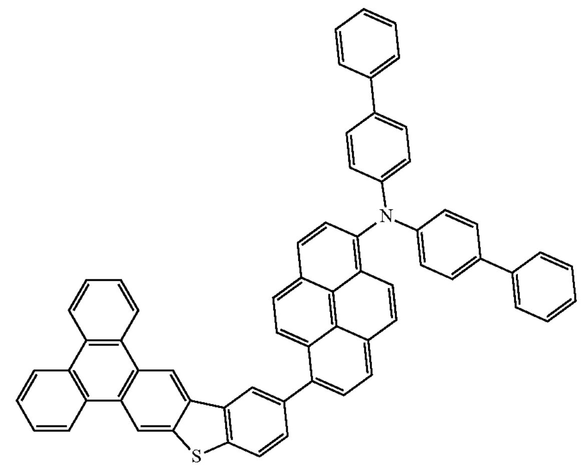 Compound 86 | 41% |
| 15 | 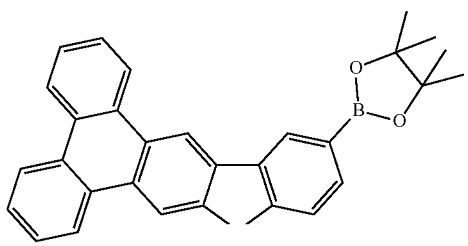 [SMILES: CC1(C)OB(c2ccc3c(c2)-c2cc4c5ccccc5c5ccccc5c4cc2C3)OC1(C)C] | 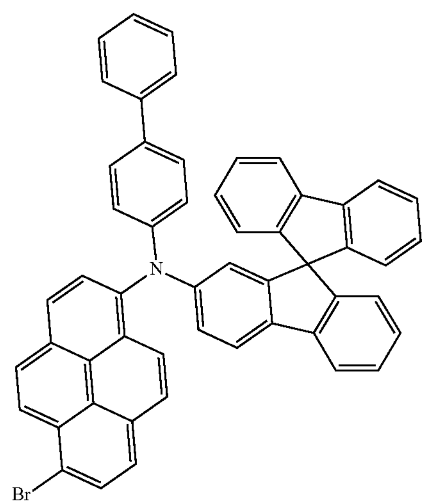 [SMILES: Brc1ccc2ccc3c(N(c4ccc(-c5ccccc5)cc4)c4ccc5c(c4)C4(c6ccccc6-c6ccccc64)c4ccccc4-5)ccc4ccc1c2c43] | 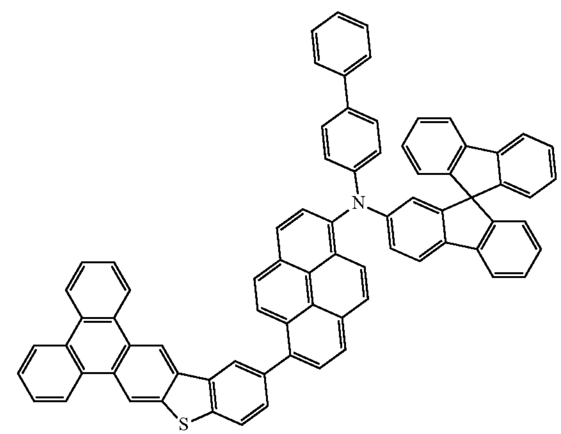 Compound 91 | 37% |

-continued
| Ex. | Intermediate I | Intermediate II | Product | Yield |
|---|---|---|---|---|
| 16 | 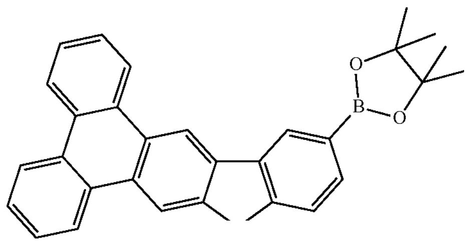 [SMILES: CC1(C)OB(c2ccc3c(c2)-c2cc4c5ccccc5c5ccccc5c4cc2C3)OC1(C)C] | 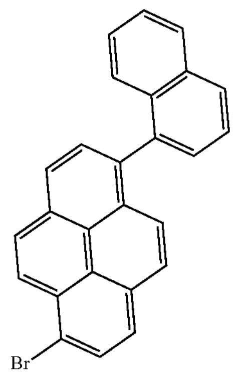 [SMILES: Brc1ccc2ccc3c(-c4cccc5ccccc45)ccc4ccc1c2c43] | 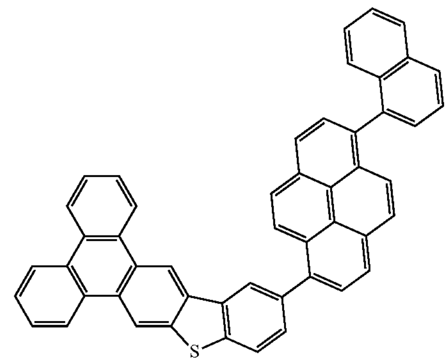 Compound 92 | 44% |
| 17 | 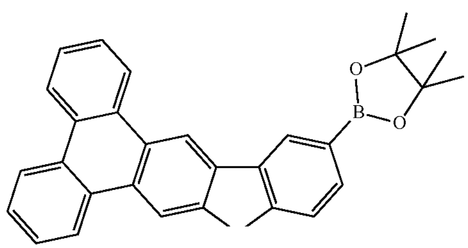 [SMILES: CC1(C)OB(c2ccc3c(c2)-c2cc4c5ccccc5c5ccccc5c4cc2C3)OC1(C)C] | 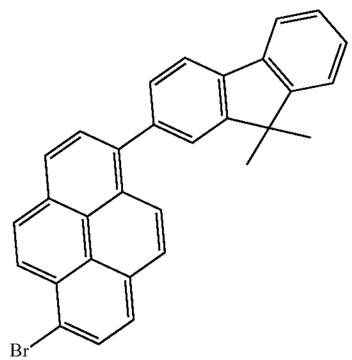 [SMILES: CC1(C)c2ccccc2-c2ccc(-c3ccc4ccc5c(Br)ccc6ccc3c4c65)cc21] | 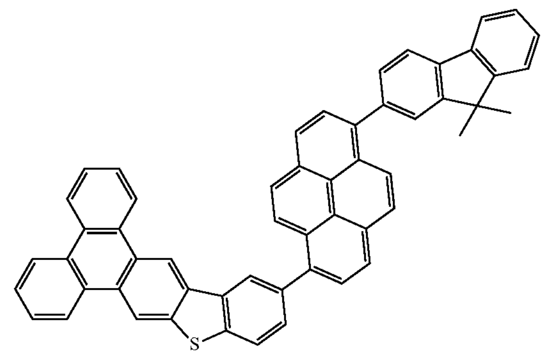 Compound 96 | 41% |

Example 18

Synthesis of 1-bromo-2-iodo-4-methoxybenzene

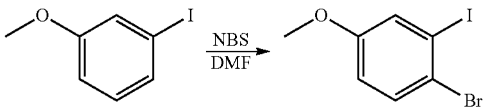

A mixture of 40 g (171 mmol) of 1-iodo-3-methoxybenzene, 32 g (179 mmol) of N-bromosuccinimide, and 600 ml of DMF was degassed and placed under nitrogen, and then heated at 80° C. for 12 hrs. After the reaction finished, the mixture was allowed to cool to room temperature. Subsequently, the solvent was removed under reduced pressure, and the crude product was purified by column chromatography, yielding 45 g of 1-bromo-2-iodo-4-methoxybenzene as yellow oil (84.1%). $^1$H NMR ($CDCl_3$, 400 MHz): chemical shift (ppm) 7.43 (dd, 1H), 7.35 (dd, 1H), 6.73 (dd, 1H), 3.74 (s, 3H).

Synthesis of 2-bromo-5-methoxy-1,1'-biphenyl

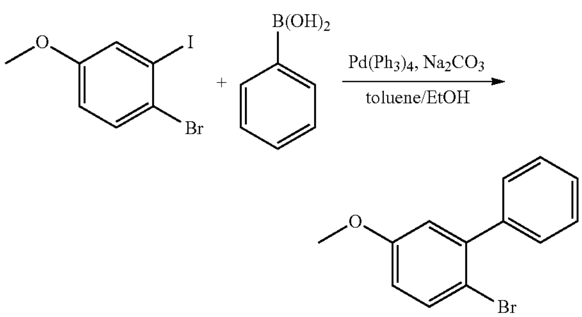

A mixture of 40 g (127.8 mmol) of 1-bromo-2-iodo-4-methoxybenzene, 15.6 g (127.8 mmol) of phenylboronic acid, 2.95 g (2.56 mmol) of $Pd(Ph_3)_4$, 155 ml of 2M $Na_2CO_3$, 100 ml of EtOH and 300 ml of toluene was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 30 g of 2-bromo-5-methoxy-1,1'-biphenyl as colorless liquid (89.2%). $^1$H NMR ($CDCl_3$, 400 MHz): chemical shift (ppm) 7.55 (d, 1H), 7.46-7.38 (m, 5H), 6.89 (d, 1H), 6.79 (dd, 1H), 3.81 (s, 3H).

Synthesis of (5-methoxy-[1,1'-biphenyl]-2-yl) Boronic Acid

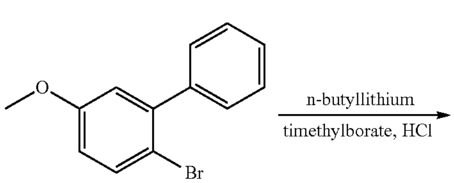

-continued

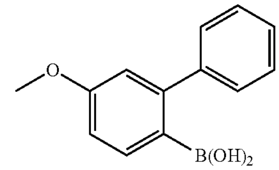

The compound 2-bromo-5-methoxy-1,1'-biphenyl (30 g, 114 mmol) was mixed with 600 ml of dry THF. To the mixture, 54.7 ml of N-butyllithium (137 mmol) was added at −60° C. and the mixture was stirred for 1 hrs. After the reaction finished, 17.8 g (171 mmol) of trimethyl borate was added and the mixture was stirred overnight. 228 ml (228 mmole) of 1M HCl was added and the mixture was stirred for 1 hrs. The mixture was extracted with ethyl acetate/$H_2O$, and the organic layer was removed under reduced pressure. The crude product was washed by hexane, yielding 19.5 g of (5-methoxy-[1,1'-biphenyl]-2-yl) boronic acid as white solid (75%).

Synthesis of 3-(5-methoxy-[1,1'-biphenyl]-2-yl) dibenzo[b,d]-thiophene

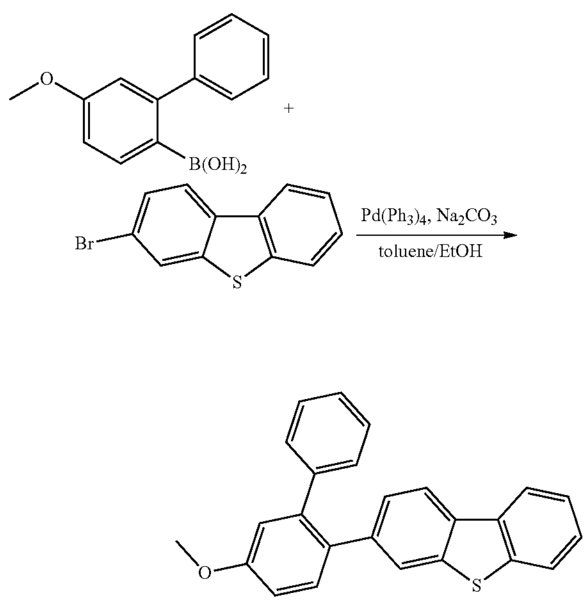

A mixture of 20 g (87.7 mmol) of (5-methoxy-[1,1'-biphenyl]-2-yl)-boronic acid, 25.4 g (96.5 mmol) of 3-bromodibenzo[b,d]thiophene, 2.03 g (1.75 mmol) of $Pd(Ph_3)_4$, 87.7 ml of 2M $Na_2CO_3$, 200 ml of EtOH and 400 ml of toluene was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 23.1 g of 3-(5-methoxy-[1,1'-biphenyl]-2-yl)-dibenzo[b,d]thiophene as white solid (71.9%). $^1$H NMR ($CDCl_3$, 400 MHz): chemical shift (ppm) 8.47 (d, 1H), 8.12-8.06 (m, 3H), 8.01 (d, 1H), 7.77-7.74 (m, 3H), 7.49-7.45 (m, 4H), 7.41-7.38 (m, 2H), 7.02 (d, 1H), 3.81 (s, 3H).

Synthesis of 6-methoxybenzo[b]triphenyleno[2,3-d] thiophene

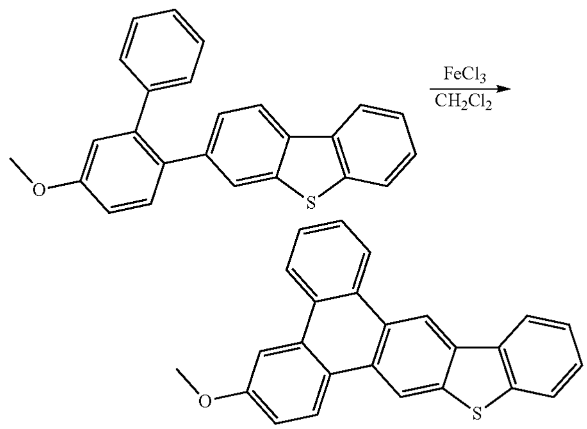

The compound 3-(5-methoxy-[1,1'-biphenyl]-2-yl) dibenzo[b,d]-thiophene (20 g, 54.6 mmol) was mixed with 700 ml of $CH_2Cl_2$. To the mixture, 88.5 g of $FeCl_3$ (546 mmol) was added and the mixture was stirred for 1 hrs. After the reaction finished, the solvent was removed under reduced pressure, and the crude product was purified by column chromatography, yielding 8.5 g of 6-methoxybenzo [b]triphenyleno[2,3-d]-thiophene as white solid (42.7%). $^1$H NMR ($CDCl_3$, 400 MHz): chemical shift (ppm) 8.91-8.89 (m, 2H), 8.81 (d, 1H), 8.49 (d, 1H), 8.14 (m, 2H), 7.99 (d, H), 7.89-7.85 (m, 2H), 7.62 (s, 1H), 7.54-7.51 (m, 2H), 7.36 (d, 1H), 3.82 (s, 3H).

Synthesis of benzo[b]triphenyleno[2,3-d]thiophen-6-ol

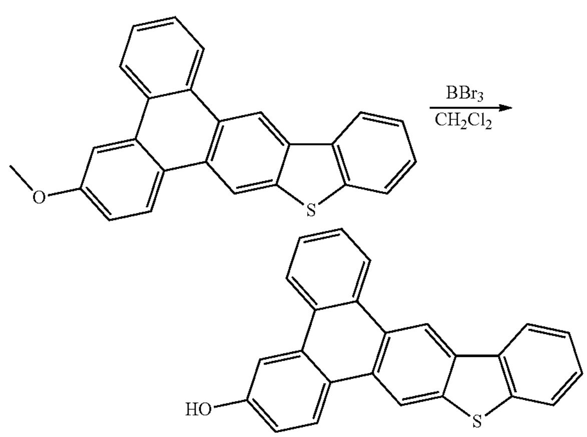

The compound 6-methoxybenzo[b]triphenyleno[2,3-d]-thiophene (10 g, 27.4 mmol) was mixed with 400 ml of $CH_2Cl_2$. To the mixture, 8.25 g of $BBr_3$ (32.9 mmol) was added and the mixture was stirred overnight. After the reaction finished, the solvent was removed under reduced pressure, and the crude product was purified by column chromatography, yielding 8.8 g of benzo[b]triphenyleno[2, 3-d]thiophen-6-ol as white solid (91.5%). $^1$H NMR ($CDCl_3$, 400 MHz): chemical shift (ppm) 8.89-8.87 (m, 2H), 8.78 (d, 1H), 8.45 (d, 1H), 8.09 (m, 2H), 7.94 (d, H), 7.86-7.83 (m, 2H), 7.58 (s, 1H), 7.51-7.48 (m, 2H), 7.31 (d, 1H), 5.41 (s, 1H).

Synthesis of benzo[b]triphenyleno[2,3-d]thiophen-6-yl trifluoro-methanesulfonate

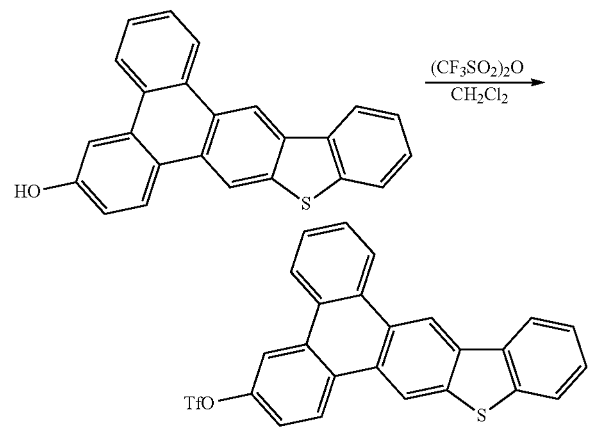

The compound benzo[b]triphenyleno[2,3-d]thiophen-6-ol (10 g, 28.5 mmol) was mixed with 450 ml of $CH_2Cl_2$. To the mixture, 3.4 g of pyridine (42.8 mmol) was added and the mixture was stirred for 1 hrs. To the mixture, 13.7 g of $(CF_3SO_2)_2O$ (48.5 mmol) was added and the mixture was stirred for 1 hrs. After the reaction finished, the solvent was removed under reduced pressure, and the crude product was purified by column chromatography, yielding 10.5 g of benzo[b]triphenyleno[2,3-d]thiophen-6-yltrifluoro-methanesulfonate as yellow solid (55.9%). $^1$H NMR ($CDCl_3$, 400 MHz): chemical shift (ppm) 8.99-8.95 (m, 3H), 8.47 (d, 1H), 8.14-8.11 (m, 3H), 7.97 (d, H), 7.88-7.85 (m, 2H), 7.58 (s, 1H), 7.53-7.51 (m, 2H).

Synthesis of 2-(benzo[b]triphenyleno[2,3-d]thiophen-6-yl)-4,4,5,5-tetramethyl-1,3,2-dioxaborolane

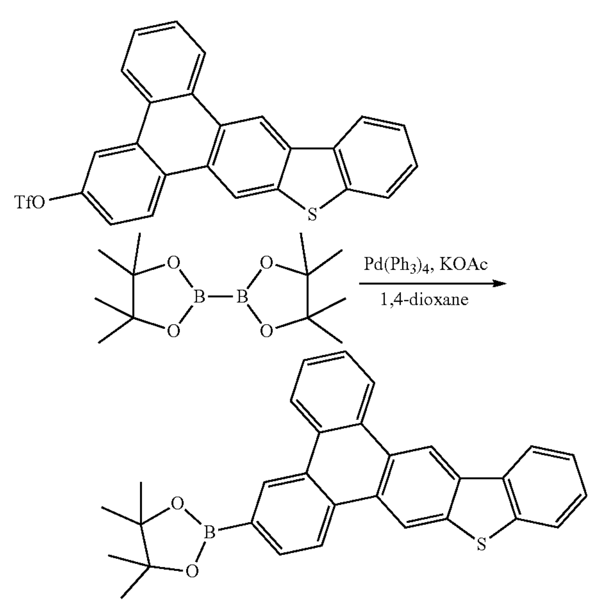

A mixture of 5 g (10.4 mmol) of benzo[b]triphenyleno[2,3-d]thiophen-6-yl trifluoromethanesulfonate, 3.16 g (12.4 mmol) of bis(pinacolato)diboron, 0.48 g (0.4 mmol) of $Pd(Ph_3)_4$, 2.04 g (20.8 mmol) of potassium acetate, and 60 ml of 1,4-dioxane was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 3.1 g of 2-(benzo[b]triphenyleno[2,3-d]thiophen-6-yl)-4,4,5,5-tetramethyl-1,3,2-dioxaborolane as white solid (65%). $^1$H NMR ($CDCl_3$, 400 MHz): chemical shift (ppm) 8.94-8.88 (m, 3H), 8.47 (d, 1H), 8.15-8.12 (m, 3H), 7.99 (d,1H), 7.87-7.84 (m, 3H), 7.54-7.52 (m, 2H), 1.27 (s, 12H).

Synthesis of 6-(6-([1,1':3',1"-terphenyl]-3-yl)pyren-1-yl)benzo[b]-triphenyleno[2,3-d]thiophene (Compound 64)

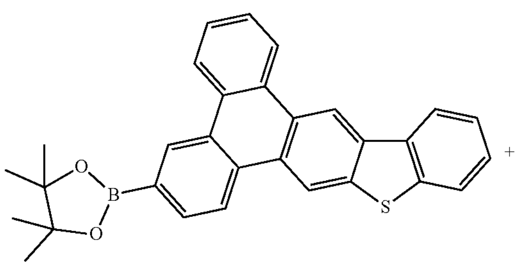

-continued

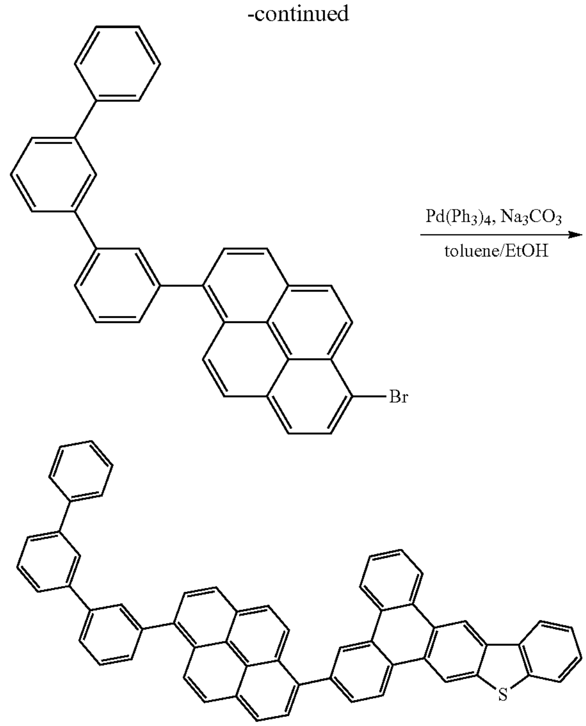

A mixture of 3 g (6.51 mmol) of 2-(benzo[b]triphenyleno[2,3-d]-thiophen-6-yl)-4,4,5,5-tetramethyl-1,3,2-dioxaborolane, 3.65 g (7.17 mmol) of 9-bromo-10-phenylanthracene, 0.15 g (0.13 mmol) of $Pd(Ph_3)_4$, 6.5 ml of 2M $Na_2CO_3$, 20 ml of EtOH and 40 ml of toluene was degassed and placed under nitrogen, and then heated to reflux for 12 hrs. After the reaction finished, the mixture was allowed to cool to room temperature. Subsequently, the solvent was removed under reduced pressure, and the crude product was purified by column chromatography, yielding 2.2 g of 6-(6-([1,1':3',1"-terphenyl]-3-yl)pyren-1-yl)benzo[b]triphenyleno[2,3-d]thiophene as yellow solid (44.2%). $^1$H NMR ($CDCl_3$, 400 MHz): chemical shift (ppm) 8.98-8.94 (m, 3H), 8.47 (d,1H), 8.36 (s,1H), 8.16-8.06 (m, 6H), 7.95-7.88 (m, 4H), 7.75-7.68 (m, 6H), 7.58-7.44 (m, 13H).

Example 19-34

We have used the same synthesis methods to get a series of intermediates and the following compounds are synthesized analogously.

| Ex. | Intermediate III | Intermediate IV | Product | Yield |
|---|---|---|---|---|
| 19 | 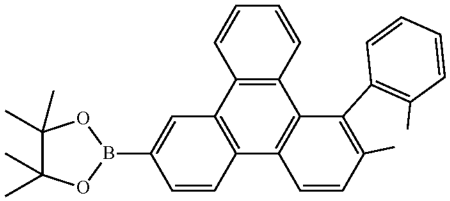 [SMILES: CC1(C)OB(c2ccc3c(c2)c2ccccc2c2c4c(ccc32)Cc2ccccc2-4)OC1(C)C] | 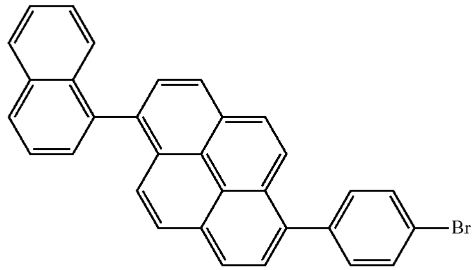 [SMILES: Brc1ccc(-c2ccc3ccc4c(-c5cccc6ccccc56)ccc5ccc2c3c54)cc1] | 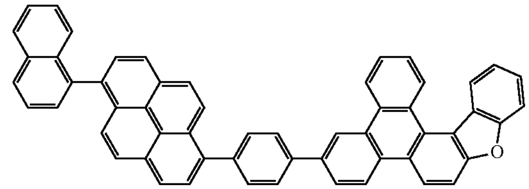 Compound 6 | 43% |
| 20 | 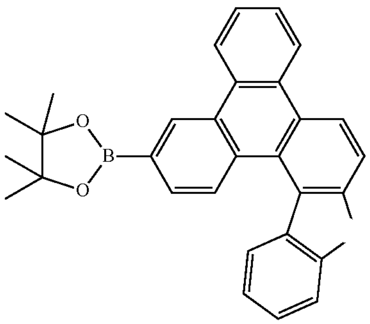 [SMILES: CC1(C)OB(c2ccc3c(c2)c2ccccc2c2ccc4c(c23)-c2ccccc2C4)OC1(C)C] | 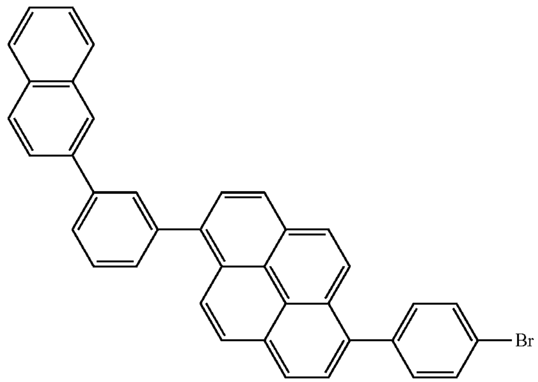 [SMILES: Brc1ccc(-c2ccc3ccc4c(-c5cccc(-c6ccc7ccccc7c6)c5)ccc5ccc2c3c54)cc1] | 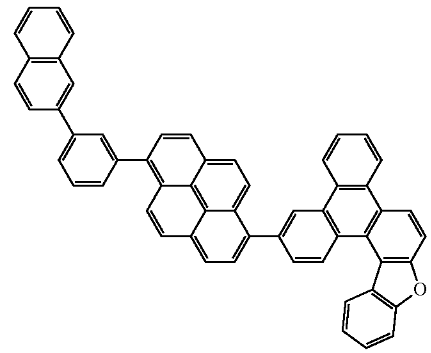 Compound 8 | 44% |
| 21 | 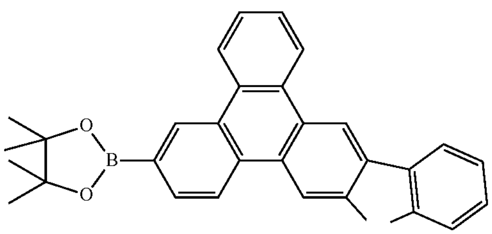 [SMILES: CC1(C)OB(c2ccc3c(c2)c2ccccc2c2cc4c(cc32)Cc2ccccc2-4)OC1(C)C] | 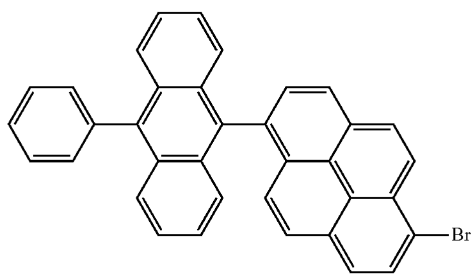 [SMILES: Brc1ccc2ccc3c(-c4c5ccccc5c(-c5ccccc5)c5ccccc45)ccc4ccc1c2c43] | 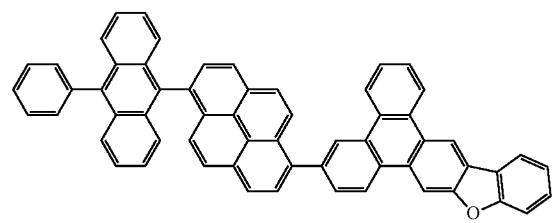 Compound 14 | 37% |

-continued
| Ex. | Intermediate III | Intermediate IV | Product | Yield |
|---|---|---|---|---|
| 22 | 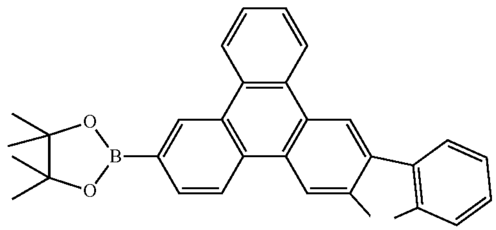 [SMILES: CC1(C)OB(c2ccc3c(c2)c2ccccc2c2cc4c(cc32)Cc2ccccc2-4)OC1(C)C] | 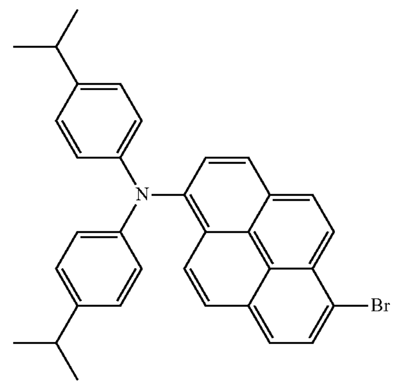 [SMILES: CC(C)c1ccc(N(c2ccc(C(C)C)cc2)c2ccc3ccc4c(Br)ccc5ccc2c3c54)cc1] | 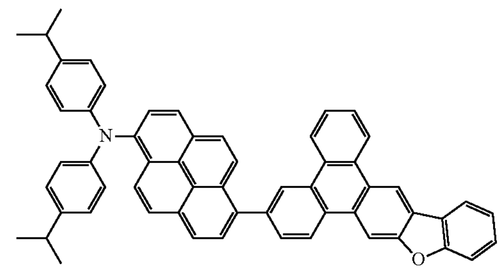 Compound 19 | 49% |
| 23 | 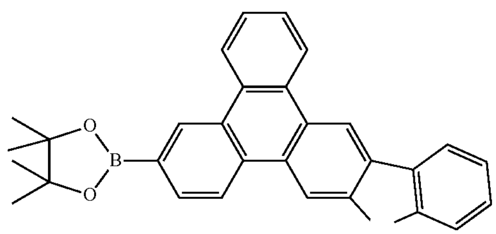 [SMILES: CC1(C)OB(c2ccc3c(c2)c2ccccc2c2cc4c(cc32)Cc2ccccc2-4)OC1(C)C] | 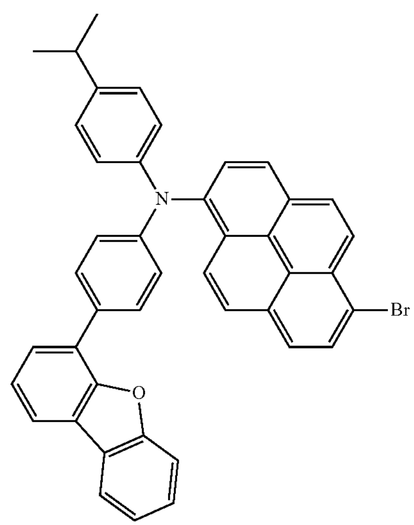 [SMILES: CC(C)c1ccc(N(c2ccc(-c3cccc4c3oc3ccccc34)cc2)c2ccc3ccc4c(Br)ccc5ccc2c3c54)cc1] | 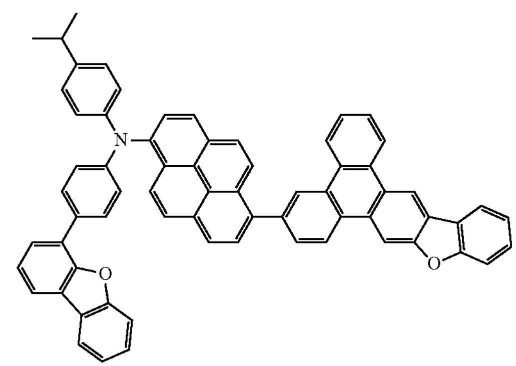 Compound 23 | 42% |

-continued
| Ex. | Intermediate III | Intermediate IV | Product | Yield |
|---|---|---|---|---|
| 24 | 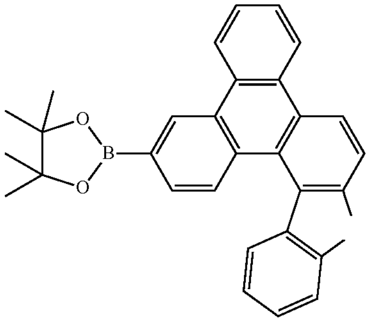 [SMILES: CC1(C)OB(c2ccc3c(c2)c2ccccc2c2ccc4c(c23)-c2ccccc2C4)OC1(C)C] | 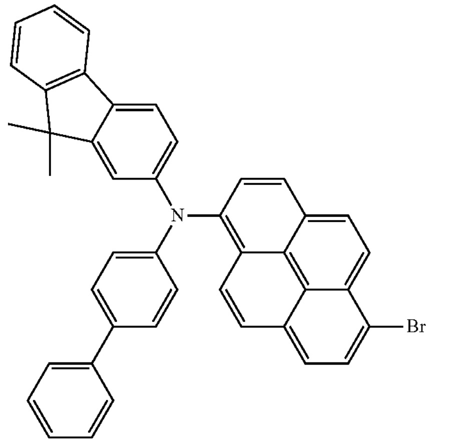 [SMILES: CC1(C)c2ccccc2-c2ccc(N(c3ccc(-c4ccccc4)cc3)c3ccc4ccc5c(Br)ccc6ccc3c4c65)cc21] | 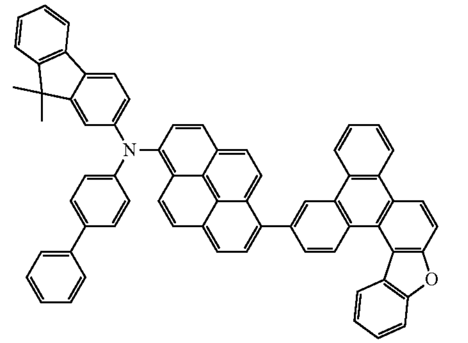 Compound 28 | 38% |
| 25 | 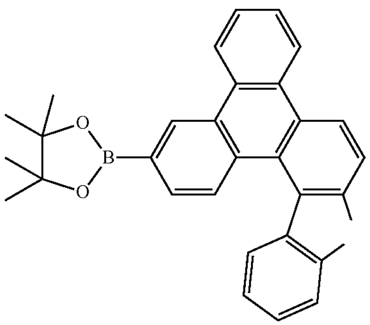 [SMILES: CC1(C)OB(c2ccc3c(c2)c2ccccc2c2ccc4c(c23)-c2ccccc2C4)OC1(C)C] | 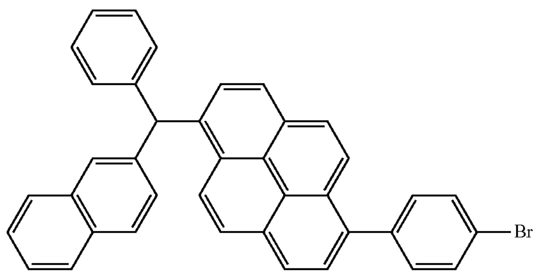 [SMILES: Brc1ccc(-c2ccc3ccc4c(C(c5ccccc5)c5ccc6ccccc6c5)ccc5ccc2c3c54)cc1] | 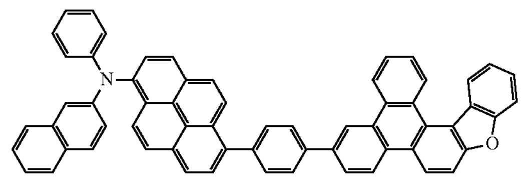 Compound 40 | 46% |

-continued
| Ex. | Intermediate III | Intermediate IV | Product | Yield |
|---|---|---|---|---|
| 26 | 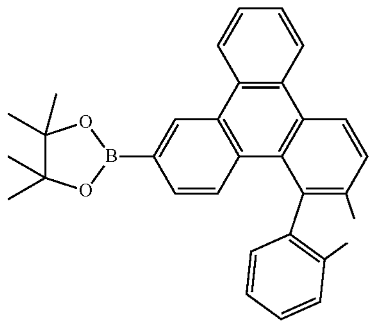 [SMILES: CC1(C)OB(c2ccc3c(c2)c2ccccc2c2ccc4c(c23)-c2ccccc2C4)OC1(C)C] | 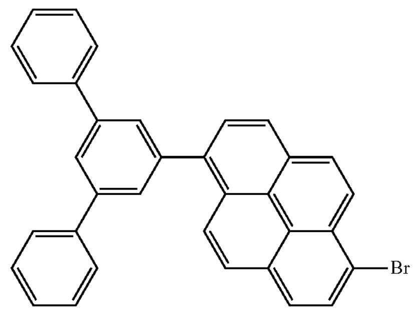 [SMILES: Brc1ccc2ccc3c(-c4cc(-c5ccccc5)cc(-c5ccccc5)c4)ccc4ccc1c2c43] | 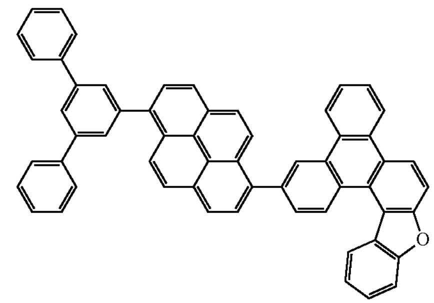 Compound 42 | 43% |
| 27 | 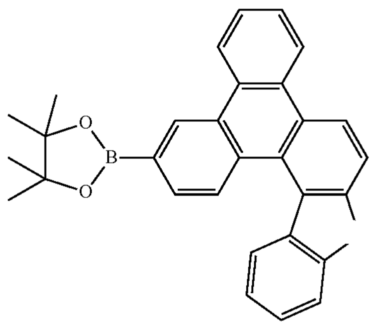 [SMILES: CC1(C)OB(c2ccc3c(c2)c2ccccc2c2ccc4c(c23)-c2ccccc2C4)OC1(C)C] | 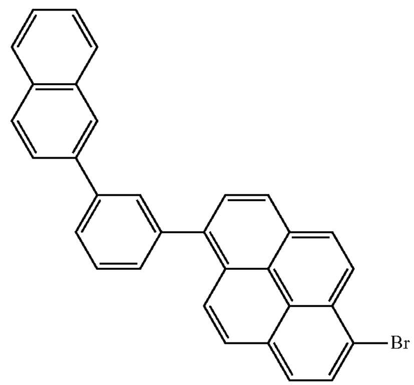 [SMILES: Brc1ccc2ccc3c(-c4cccc(-c5ccc6ccccc6c5)c4)ccc4ccc1c2c43] | 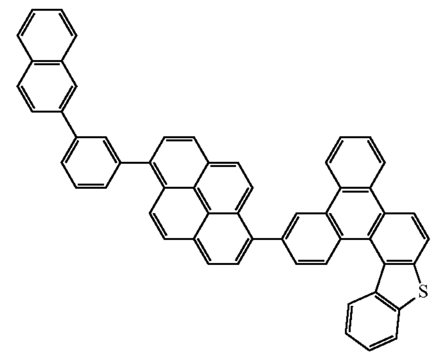 Compound 68 | 40% |
| 28 | 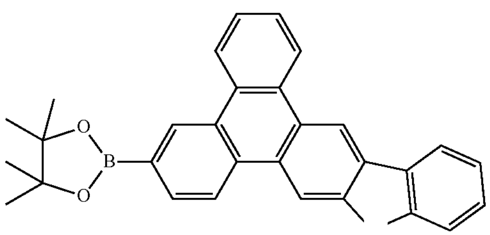 [SMILES: CC1(C)OB(c2ccc3c(c2)c2ccccc2c2cc4c(cc32)Cc2ccccc2-4)OC1(C)C] | 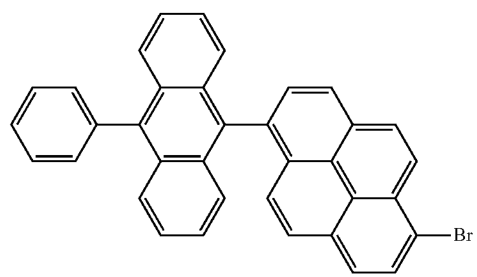 [SMILES: Brc1ccc2ccc3c(-c4c5ccccc5c(-c5ccccc5)c5ccccc45)ccc4ccc1c2c43] | 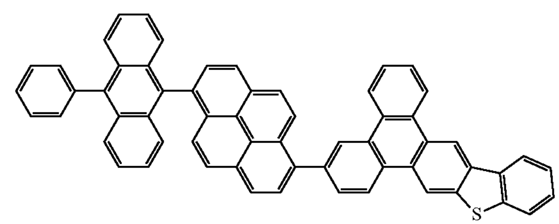 Compound 74 | 47% |

-continued
| Ex. | Intermediate III | Intermediate IV | Product | Yield |
|---|---|---|---|---|
| 29 | 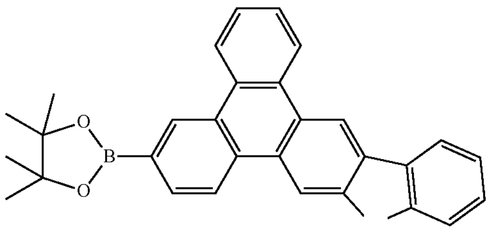 [SMILES: CC1(C)OB(c2ccc3c(c2)c2ccccc2c2cc4c(cc32)Cc2ccccc2-4)OC1(C)C] | 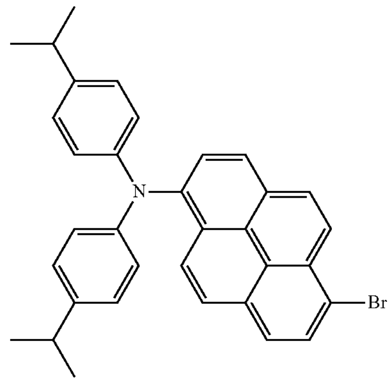 [SMILES: CC(C)c1ccc(N(c2ccc(C(C)C)cc2)c2ccc3ccc4c(Br)ccc5ccc2c3c54)cc1] | 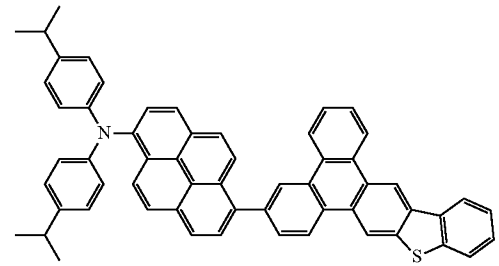 Compound 79 | 41% |
| 30 | 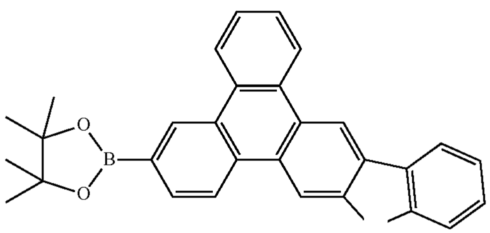 [SMILES: CC1(C)OB(c2ccc3c(c2)c2ccccc2c2cc4c(cc32)Cc2ccccc2-4)OC1(C)C] | 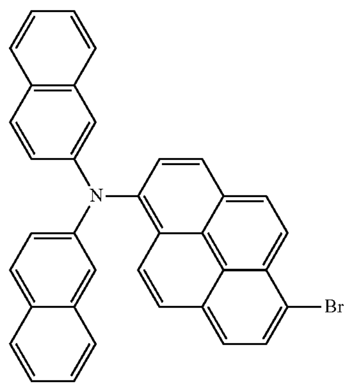 [SMILES: Brc1ccc2ccc3c(N(c4ccc5ccccc5c4)c4ccc5ccccc5c4)ccc4ccc1c2c43] | 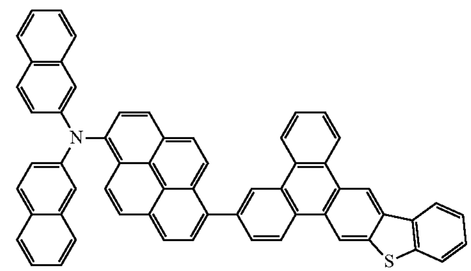 Compound 81 | 45% |

-continued
| Ex. | Intermediate III | Intermediate IV | Product | Yield |
|---|---|---|---|---|
| 31 | 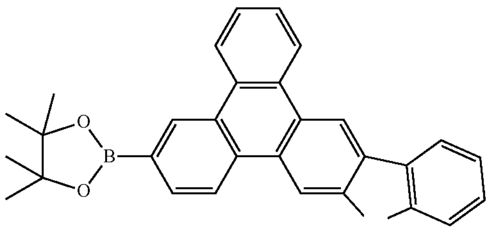 [SMILES: CC1(C)OB(c2ccc3c(c2)c2ccccc2c2cc4c(cc32)Cc2ccccc2-4)OC1(C)C] | 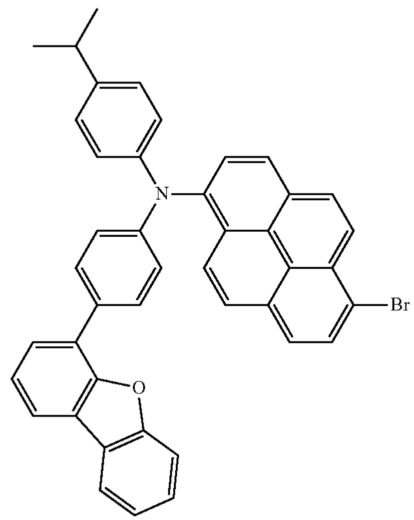 [SMILES: CC(C)c1ccc(N(c2ccc(-c3cccc4c3oc3ccccc34)cc2)c2ccc3ccc4c(Br)ccc5ccc2c3c54)cc1] | 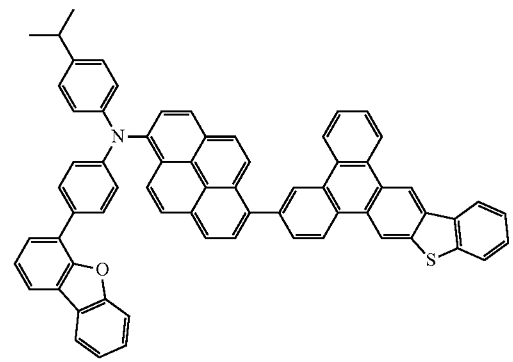 Compound 83 | 39% |
| 32 | 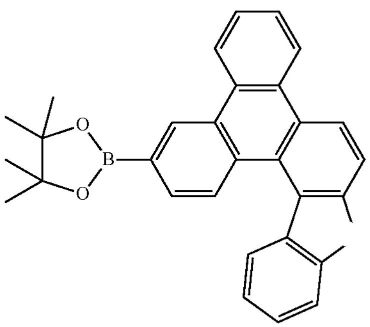 [SMILES: CC1(C)OB(c2ccc3c(c2)c2ccccc2c2ccc4c(c23)-c2ccccc2C4)OC1(C)C] | 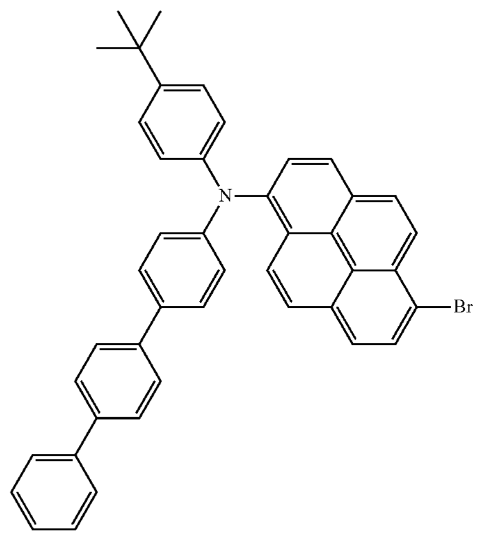 [SMILES: CC(C)(C)c1ccc(N(c2ccc(-c3ccc(-c4ccccc4)cc3)cc2)c2ccc3ccc4c(Br)ccc5ccc2c3c54)cc1] | 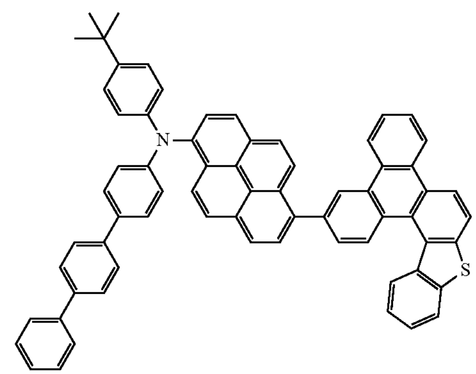 Compound 87 | 49% |

-continued
| Ex. | Intermediate III | Intermediate IV | Product | Yield |
|---|---|---|---|---|
| 33 | 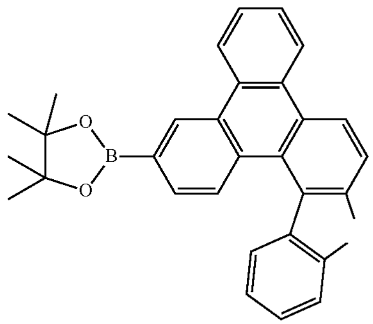 [SMILES: CC1(C)OB(c2ccc3c(c2)c2ccccc2c2ccc4c(c23)-c2ccccc2C4)OC1(C)C] | 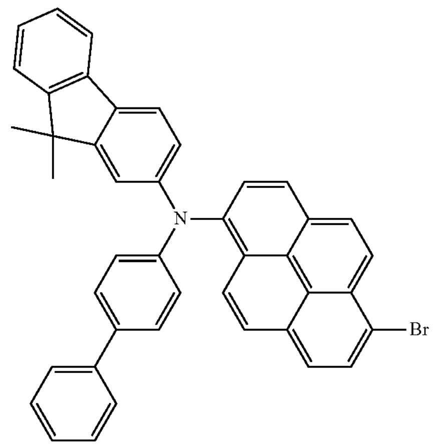 [SMILES: CC1(C)c2ccccc2-c2ccc(N(c3ccc(-c4ccccc4)cc3)c3ccc4ccc5c(Br)ccc6ccc3c4c65)cc21] | 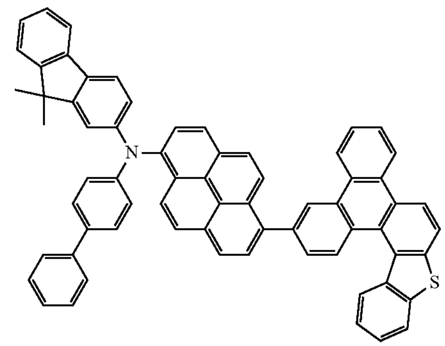 Compound 88 | 42% |
| 34 | 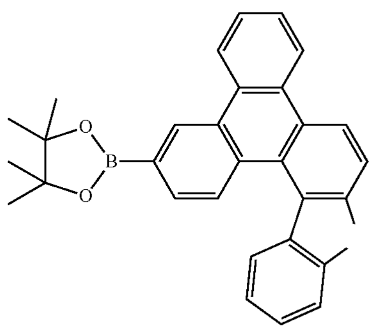 [SMILES: CC1(C)OB(c2ccc3c(c2)c2ccccc2c2ccc4c(c23)-c2ccccc2C4)OC1(C)C] | 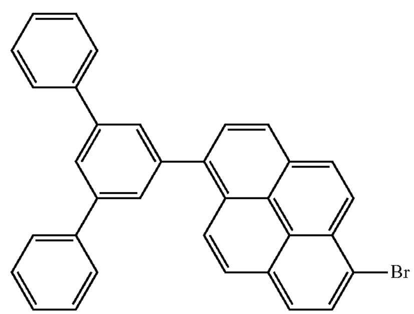 [SMILES: Brc1ccc2ccc3c(-c4cc(-c5ccccc5)cc(-c5ccccc5)c4)ccc4ccc1c2c43] | 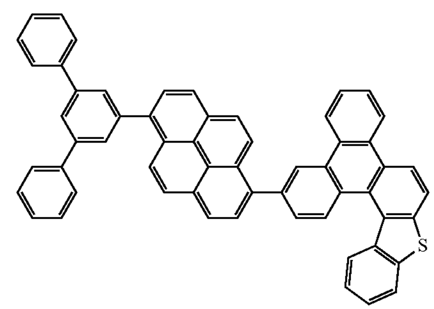 Compound 102 | 37% |

General Method of Producing Organic El Device

ITO-coated glasses with 9~12 ohm/square in resistance and 120~160 nm in thickness are provided (hereinafter ITO substrate) and cleaned in a number of cleaning steps in an ultrasonic bath (e.g., detergent, deionized water). Before vapor deposition of the organic layers, cleaned ITO substrates are further treated by UV and ozone. All pre-treatment processes for ITO substrate are under clean room (class 100).

These organic layers are applied onto the ITO substrate in order by vapor deposition in a high-vacuum unit ($10^{-7}$Torr), such as: resistively heated quartz boats. The thickness of the respective layer and the vapor deposition rate (0.1~0.3 nm/sec) are precisely monitored or set with the aid of a quartz-crystal monitor. It is also possible, as described above, for individual layers to consist of more than one compound, i.e. in general a host material doped with a dopant material and/or co-deposited with a co-host. This is successfully achieved by co-vaporization from two or more sources, which means the triphenylenobenzofuran and triphenylenobenzothiophene derivatives of the present invention are thermally stable.

Dipyrazino [2,3-f:2,3-]quinoxaline-2,3,6,7,10,11-hexacarbonitrile(HAT-CN) is used as hole injection layer in this organic EL device. N,N-Bis(naphthalene-1-yl)-N,N-bis (phenyl)-benzidine(NPB) is most widely used as the hole transporting layer. 10,10-dimethyl-13-(3-(pyren-1-yl)-phenyl)-10H-indeno[2,1-b]triphenylene(H1) is used as emitting hosts for comparison, and N1,N1,N6,N6-tetra-m-tolylpyrene-1,6-diamine(D1) is used as blue guest in the emitting layer. HB3 (see the following chemical structure) is used as hole blocking material (HBM), and 2-(naphthalen-1-yl)-9-(4-(1-(4-(10-(naphthalene-2-yl) anthracen-9-yl) -phenyl)-1H-benzo[d]imidazol-2-yl)-phenyl)-1,10-phenanthroline(ET2) is used as electron transporting material to co-deposit with 8-hydroxyquinolato-lithium(LiQ) in organic EL devices. The chemical structures of conventional OLED materials and the exemplary organic compounds of the present invention for producing control and exemplary organic EL devices in this invention are shown as follows:

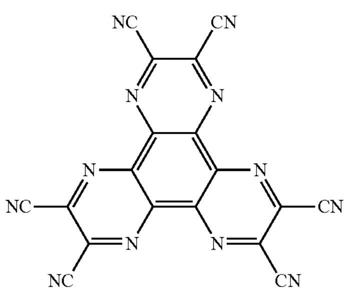
HAT-CN

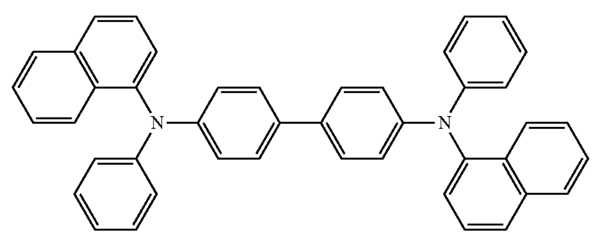
NPB

D1

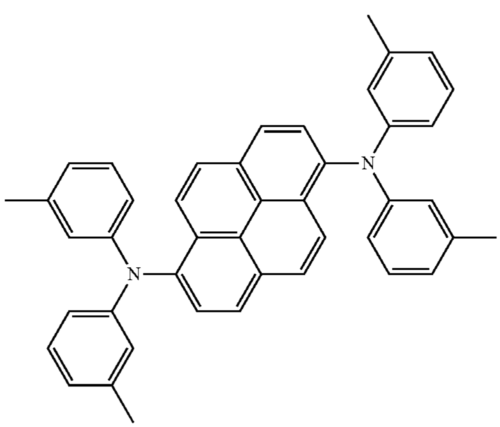

H1

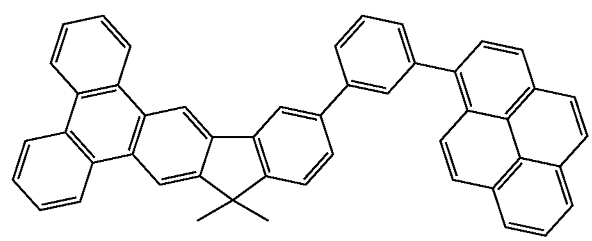

-continued
HB3
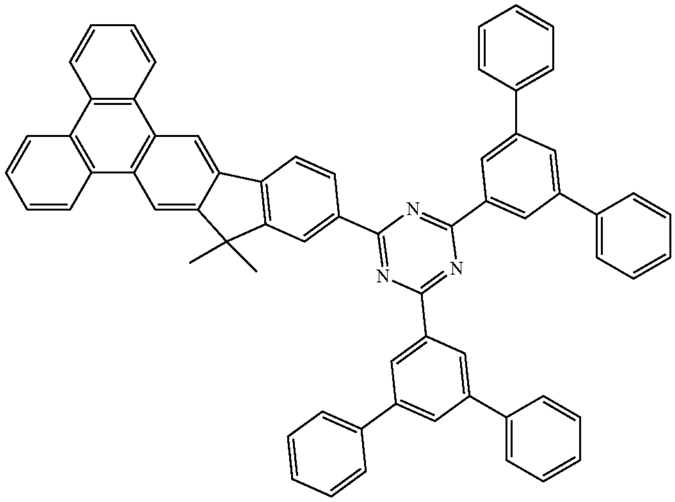
ET2
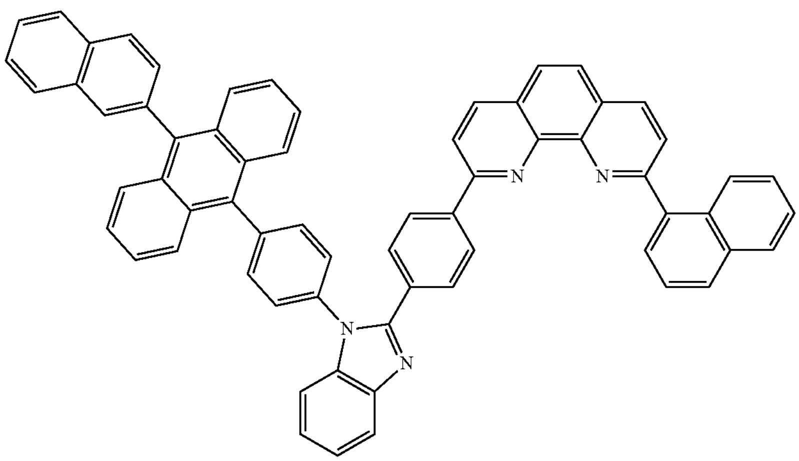
Compound 2
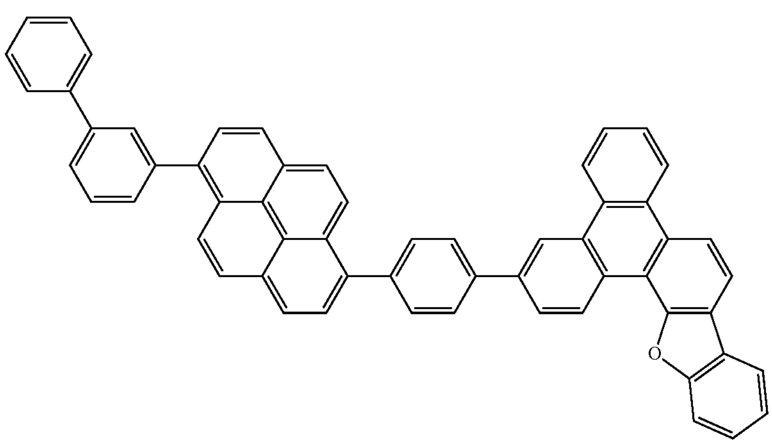

-continued
Compound 3
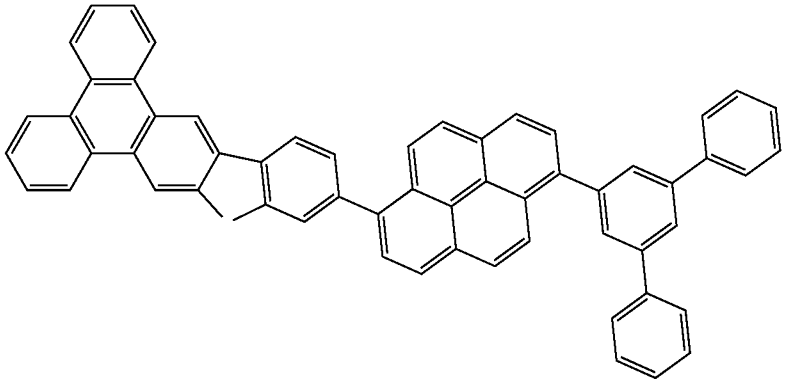
Compound 5
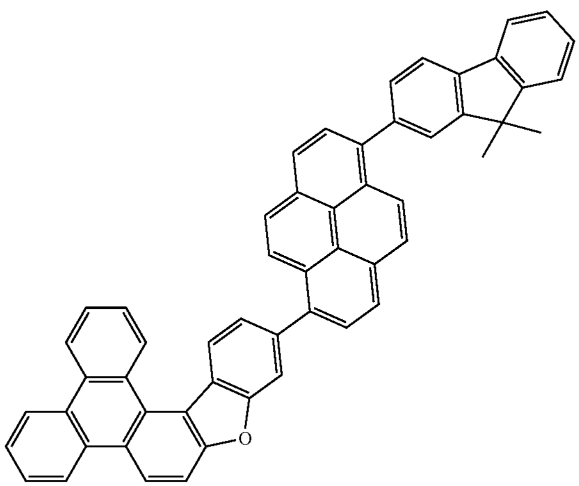
Compound 6
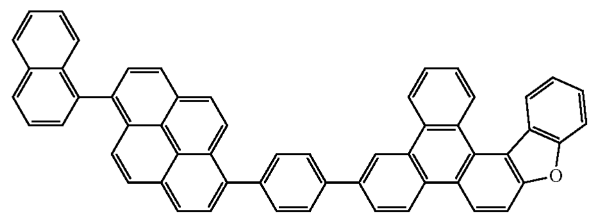
Compound 32
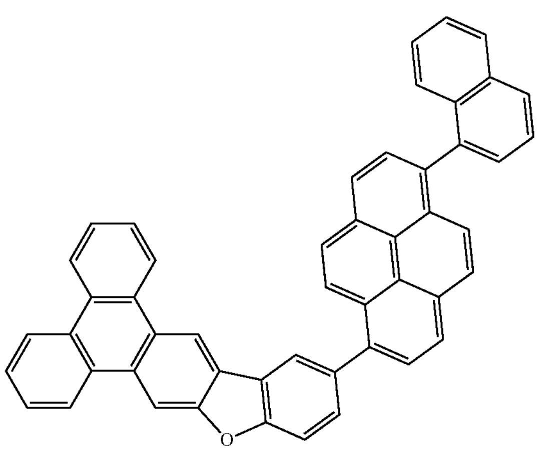
Compound 36
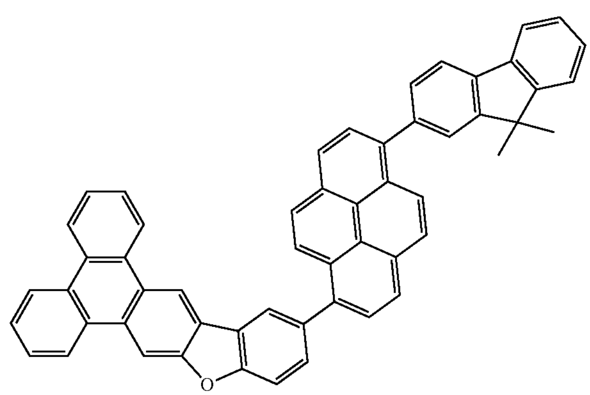

-continued
Compound 53
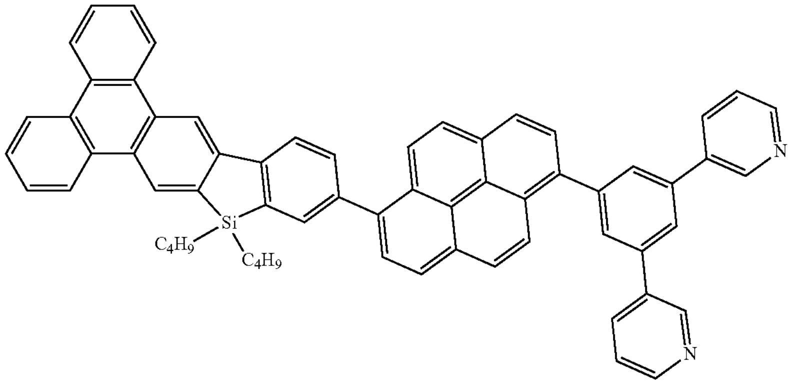
Compound 53
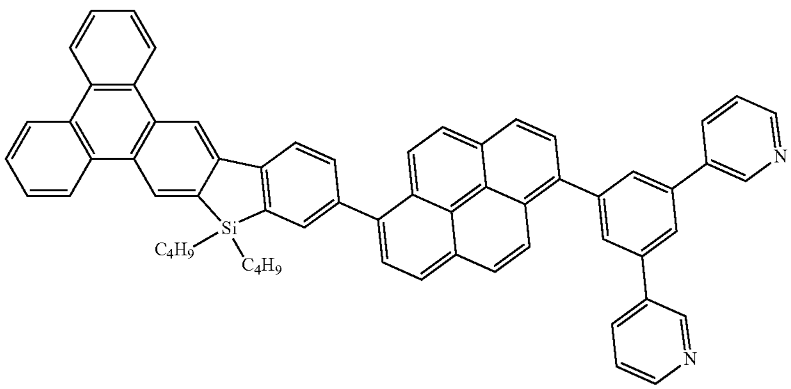
Compound 60
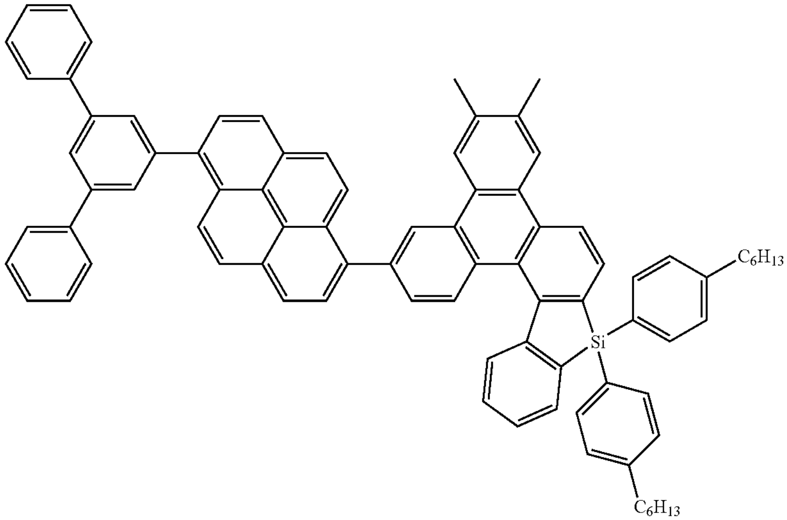

-continued
Compound 63
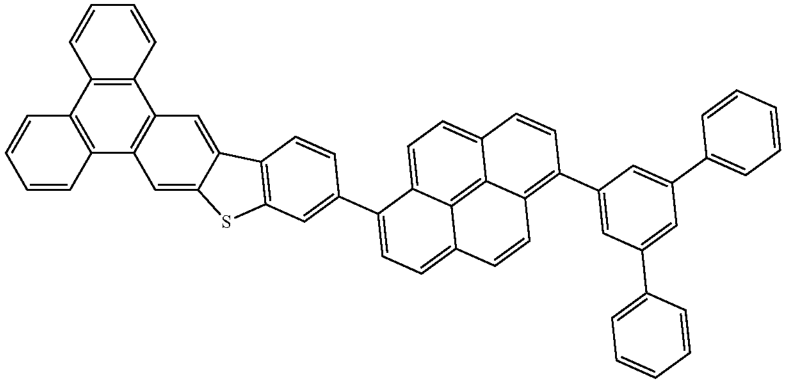
Compound 97
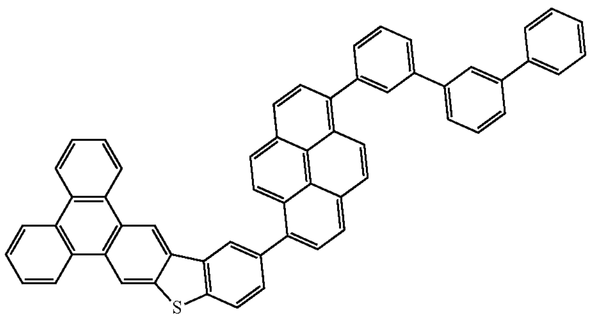
Compound 102
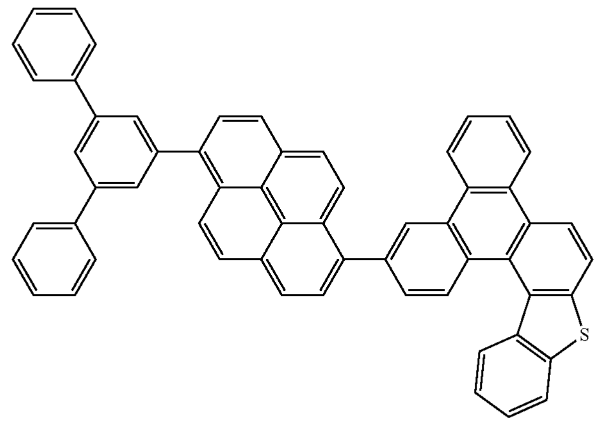
Compound 112
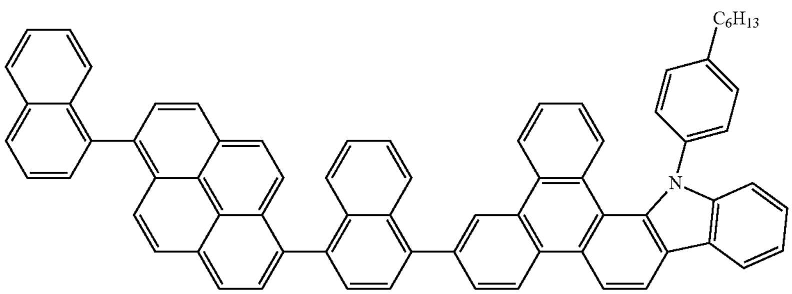
Compound 19
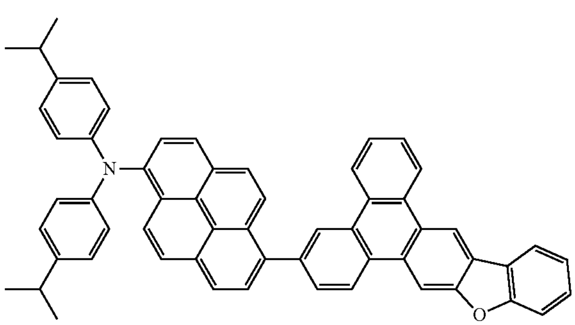
Compound 20
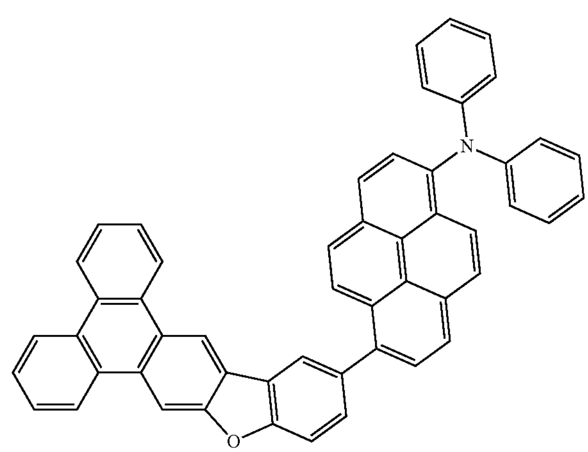

-continued
Compound 22
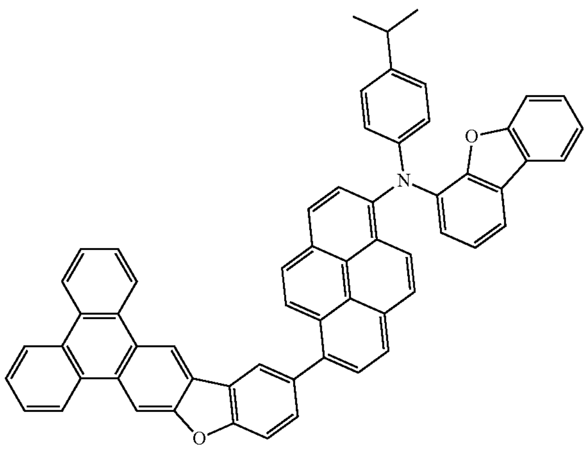
Compound 23
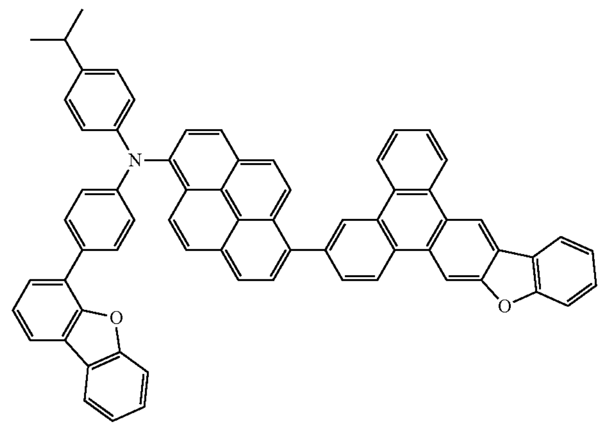
Compound 28
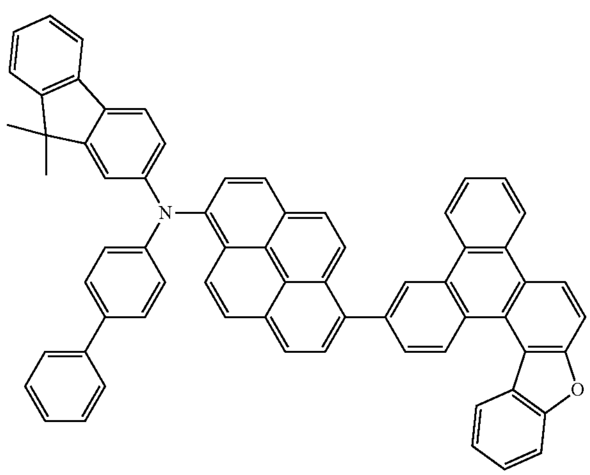
Compound 31
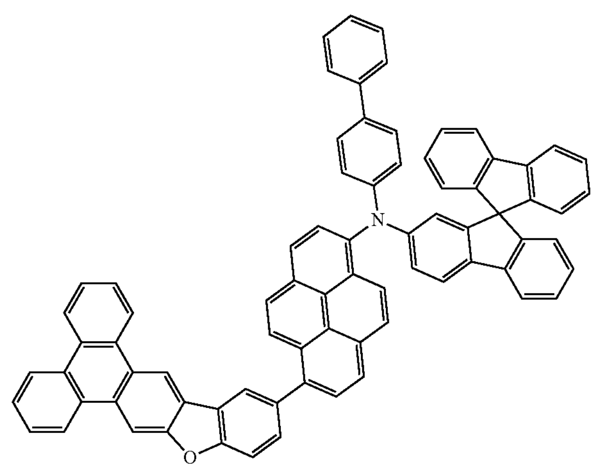
Compound 59
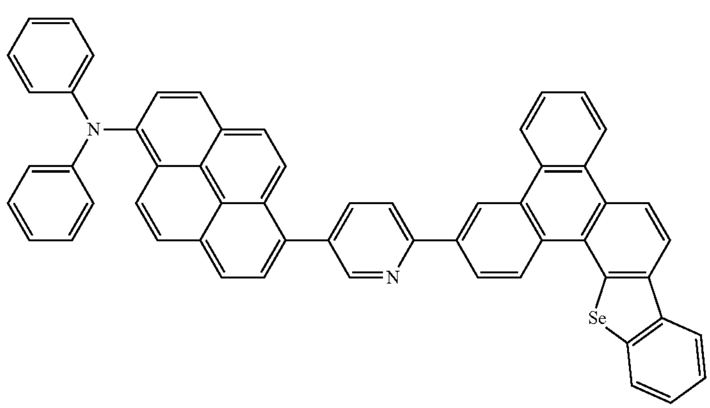

-continued

Compound 82

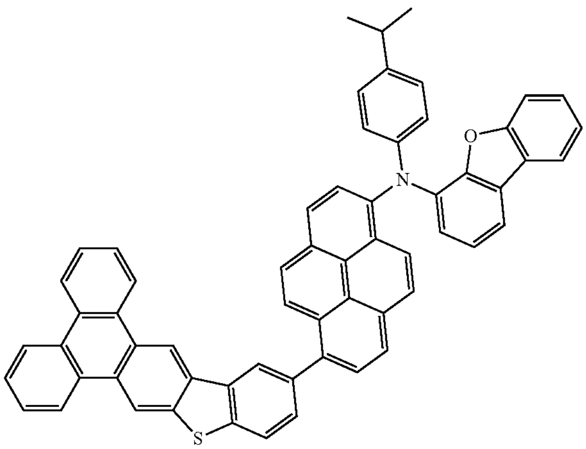

Compound 83

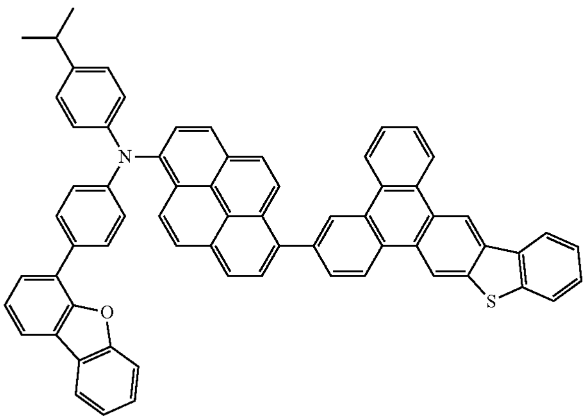

Compound 88

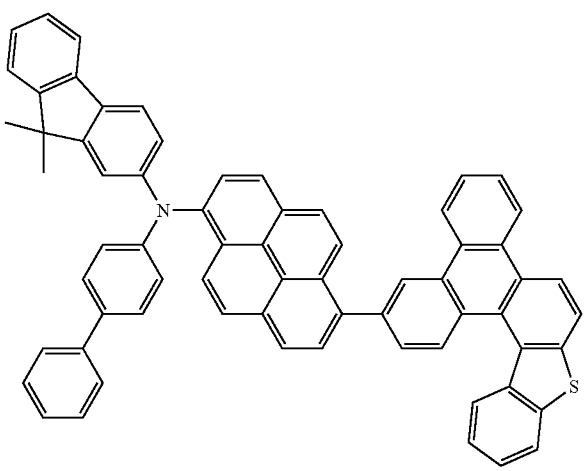

Compound 91

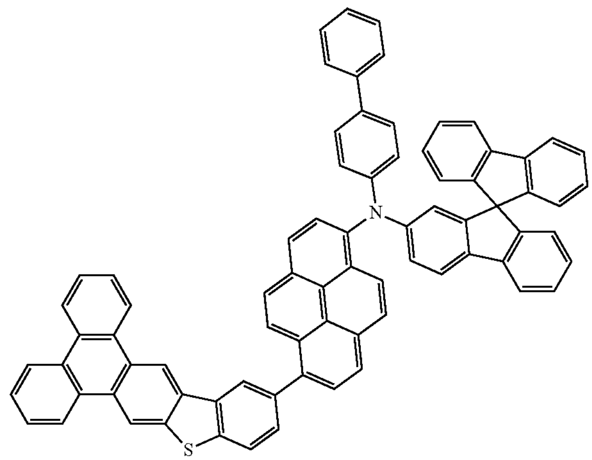

Compound 120

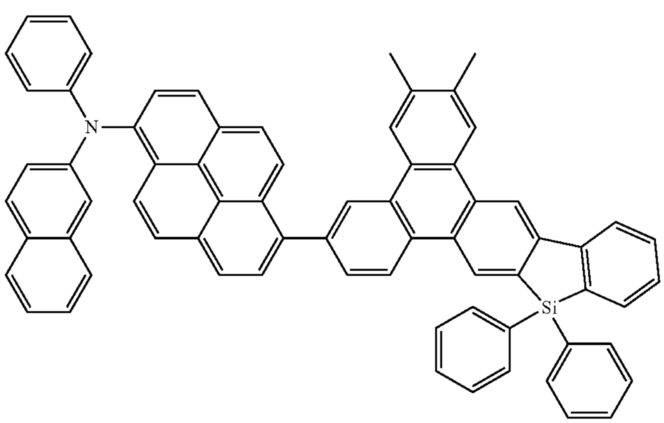

A typical organic EL device consists of low work function metals, such as Al, Mg, Ca, Li and K, as the cathode by thermal evaporation, and the low work function metals can help electrons injecting the electron transporting layer from cathode. In addition, for reducing the electron injection barrier and improving the organic EL device performance, a thin electron injecting layer is introduced between the cathode and the electron transporting layer. The materials of electron injecting layer are metal halide or metal oxide with low work function, such as: LiF, LiQ, MgO, or $Li_2O$. On the other hand, after the organic EL device fabrication, EL spectra and CIE coordination are measured by using a PR650 spectra scan spectrometer. Furthermore, the current/voltage, luminescence/voltage, and yield/voltage characteristics are taken with a Keithley 2400 programmable voltage-current source. The above-mentioned apparatuses are operated at room temperature (about 25° C.) and under atmospheric pressure.

Example 35

Using a procedure analogous to the above mentioned general method, organic EL devices emitting blue light and having the following device structure as shown in the FIGURE. From the bottom layer 10 to the top layer 80, the following components were produced: ITO/HAT-CN (20 nm)/NPB (110 nm)/Emitting host doped with 5% Emitting guest (30 nm)/HB3/ET2 doped 50% LiQ(35 nm)/LiQ(1 nm)/Al(160 nm). In the device illustrated in the FIGURE, the hole injection layer 20 (HAT-CN) is deposited onto the transparent electrode 10 (ITO), the hole transport layer 30 (NPB) is deposited onto the hole injection layer 20, the emitting layer 40 is deposited onto the hole transport layer 30. The emitting layer 40 may comprise an emitting host material and an emitting guest (dopant) material, as shown in, for example, Table 1. The emitting host material may be doped with about 5% emitting guest material. The emitting layer 40 may have a thickness of about 30 nm.

The hole blocking layer 50 (HB3) is deposited onto the emitting layer 40, the electron transport layer 60 (ET2 doped 50% LiQ) is deposited onto the hole blocking layer 50, the electron injection layer 70 (Liq) is deposited onto the electron transport layer 60, and the metal electrode 80 (Al) is deposited onto the electron injection layer 70. The I-V-B (at 1000 nits) test reports of these organic EL devices are summarized in Table 1 below. The half-life time is defined as the time the initial luminance of 1000 cd/m$^2$ has dropped to half.

TABLE 1

(The Comp. is short for Compound)

| Emitting Host Material | Emitting Dopant Material | Driving Voltage (V) | Current Efficiency (Yield; cd/A) | CIE(y) | Half-life time(hour) |
|---|---|---|---|---|---|
| H1 | D1 | 4.4 | 4.5 | 0.181 | 240 |
| Comp. 2 | D1 | 3.3 | 6.0 | 0.180 | 470 |
| Comp. 3 | D1 | 3.3 | 5.9 | 0.179 | 460 |
| Comp. 5 | D1 | 3.5 | 5.7 | 0.180 | 400 |
| Comp. 6 | D1 | 3.2 | 6.1 | 0.182 | 500 |
| Comp. 32 | D1 | 3.4 | 5.8 | 0.181 | 440 |
| Comp. 36 | D1 | 3.5 | 5.8 | 0.183 | 420 |
| Comp. 53 | D1 | 4.3 | 4.6 | 0.179 | 270 |
| Comp. 60 | D1 | 4.3 | 4.7 | 0.182 | 280 |
| Comp. 63 | D1 | 3.8 | 5.3 | 0.179 | 340 |
| Comp. 97 | D1 | 3.9 | 5.2 | 0.181 | 330 |
| Comp. 102 | D1 | 3.7 | 5.4 | 0.182 | 350 |
| Comp. 112 | D1 | 4.0 | 5.0 | 0.181 | 320 |
| Comp. 6 | D1 | 3.2 | 6.1 | 0.182 | 500 |
| Comp. 6 | Comp. 19 | 2.7 | 7.2 | 0.178 | 690 |
| Comp. 6 | Comp. 20 | 2.8 | 7.0 | 0.180 | 660 |
| Comp. 6 | Comp. 22 | 2.8 | 7.1 | 0.177 | 670 |
| Comp. 6 | Comp. 23 | 2.5 | 7.5 | 0.180 | 720 |
| Comp. 6 | Comp. 28 | 2.6 | 7.4 | 0.179 | 700 |
| Comp. 6 | Comp. 31 | 2.9 | 6.9 | 0.182 | 640 |
| Comp. 6 | Comp. 59 | 3.2 | 6.2 | 0.183 | 510 |
| Comp. 6 | Comp. 82 | 3.0 | 6.6 | 0.179 | 570 |
| Comp. 6 | Comp. 83 | 3.0 | 6.7 | 0.177 | 600 |
| Comp. 6 | Comp. 88 | 3.0 | 6.6 | 0.182 | 590 |
| Comp. 6 | Comp. 91 | 3.1 | 6.5 | 0.180 | 550 |
| Comp. 6 | Comp. 120 | 3.1 | 6.3 | 0.181 | 520 |

In the above test report of organic EL devices (see Table 1), the organic material with formula (A) used as a fluorescent blue host or dopant material for organic EL devices in the present invention may display better performance than the prior art organic EL materials. More specifically, the organic EL devices of the present invention use the organic material with formula (A) as emitting host or dopant material to collocate with emitting host (such as H1) and guest (such as D1) material, showing lower driving voltage, higher efficiency, or longer half-life time.

To sum up, the present invention discloses an organic compound, which may be used as the fluorescent host or guest material of the light emitting layer in organic EL devices. The mentioned organic compound is represented by the following formula (A):

formula (A)

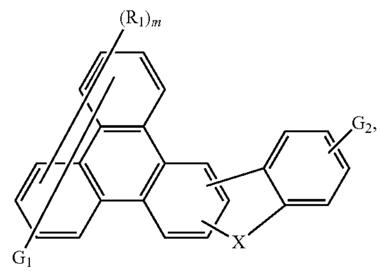

wherein at least one of $G_1$ and $G_2$ exists and represents formula(B) below:

formula (B)

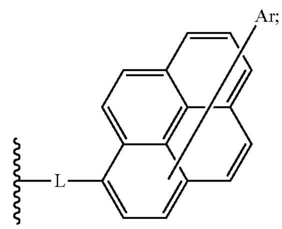

X may be a divalent bridge selected from the group consisting of O, S, Se, $NR_2$ and $SiR_3R_4$; m may represent an integer of 0 to 8; L may represent a single bond, a substituted or unsubstituted divalent arylene group having 6 to 12 ring carbon atoms, or a substituted or unsubstituted divalent heteroarylene group having 6 to 12 ring carbon atoms; Ar may represent a hydrogen, a halogen (e.g., fluoride), a methyl group, a substituted or unsubstituted aryl group having 6 to 30 (e.g., 6, 10, 12, 14, 15, 16, 18, 19, 20, 22, 24, 26 or 30) carbon atoms, or a substituted or unsubstituted heteroaryl group having 3 to 30 (e.g., 11 or 16) carbon atoms, or a substituted or unsubstituted arylamine group having 6 to 30 (e.g., 12, 16, 17, 18, 20, 24, 27 or 28) carbon atoms, or a substituted or unsubstituted heteroarylamine group having 3 to 30 (e.g., 19, 22 or 25) carbon atoms; and $R_1$ to $R_4$ may represent a hydrogen atom, a halogen (e.g., fluoride), a substituted or unsubstituted alkyl group having 1 to 30 (e.g., 6, 7 or 8) carbon atoms, a substituted or unsubstituted aryl group having 6 to 30 (e.g., 6, 10, 12 or 18) carbon atoms, a substituted or unsubstituted aralkyl group having 7 to 30 (e.g., 12 or 24) carbon atoms, or a substituted or unsubstituted heteroaryl group having 3 to 30 (e.g., 5) carbon atoms. The heteroaryl group may comprise, for example, a heteroaromatic PAHs unit having two, three, four, five or six rings. The heteroaromatic PAHs may contain an oxygen atom, a sulfur atom or one, two or three N atoms.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. An organic compound of formula (A) below:

formula (A)

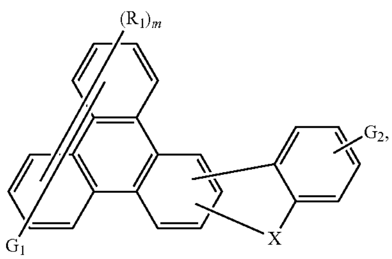

Wherein at least one of $G_1$ and $G_2$ exists and represents formula (B) below:

formula (B)

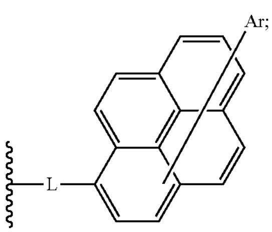

X is a divalent bridge selected from the group consisting of O, S, Se, $NR_2$ and $SiR_3R_4$; m is an integer of 0 to 8; L represents a single bond, a substituted or unsubstituted divalent arylene group having 6 to 12 ring carbon atoms, or a substituted or unsubstituted divalent heteroarylene group having 6 to 12 ring carbon atoms; Ar represents a halogen, a substituted or unsubstituted aryl group having 6 to 30 carbon atoms, or a substituted or unsubstituted heteroaryl group having 3 to 30 carbon atoms, or a substituted or unsubstituted arylamine group having 6 to 30 carbon atoms, or a substituted or unsubstituted heteroarylamine group having 3 to 30 carbon atoms; and $R_1$ to $R_4$ represent a hydrogen atom, a halogen, a substituted or unsubstituted alkyl group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

2. The organic compound according to claim 1, wherein the organic compound is represented by one of the following formula (1) to formula (12):

formula (1)

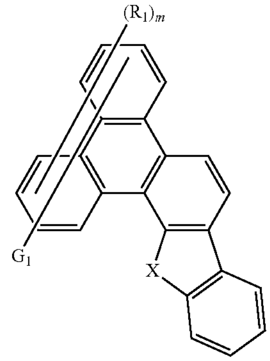

formula (2)

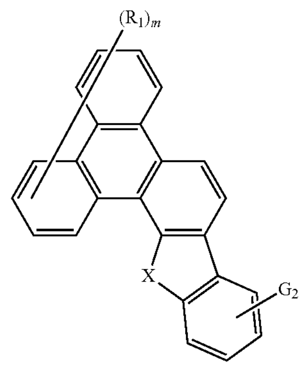

formula (3)

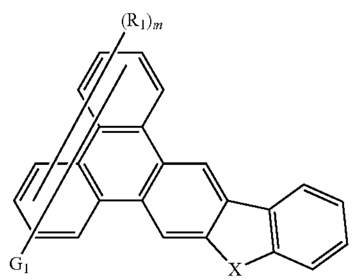

formula (4)

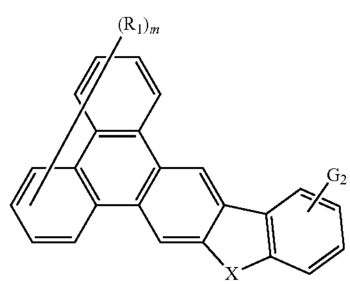

formula (5)

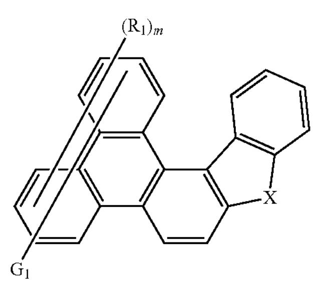

-continued formula (6)

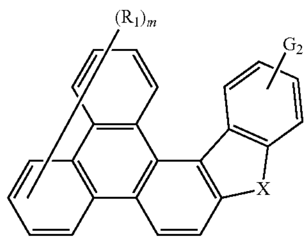

formula (7)

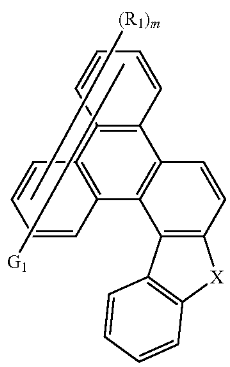

formula (8)

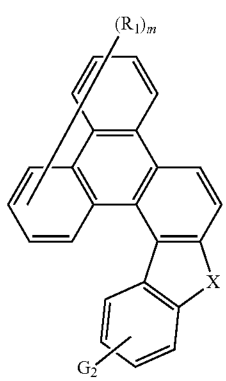

formula (9)

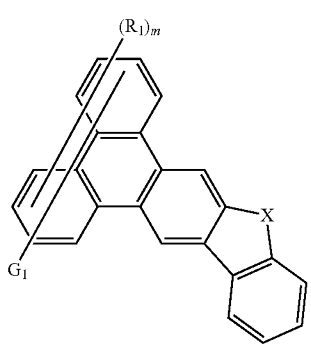

-continued formula (10)

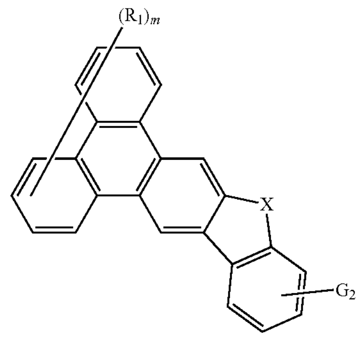

formula (11)

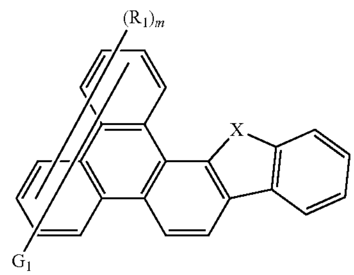

formula (12)

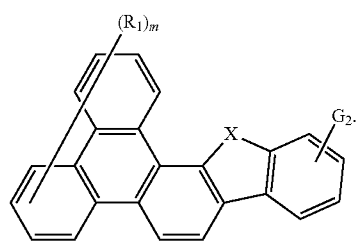

3. The organic compound according to claim 1, wherein the alkyl group, aralkyl group, aryl group, or heteroaryl group is substituted by a halogen, an alkyl group, an aryl group, or a heteroaryl group.

4. The organic compound according to claim 1, wherein Ar represents one of the following substituents:

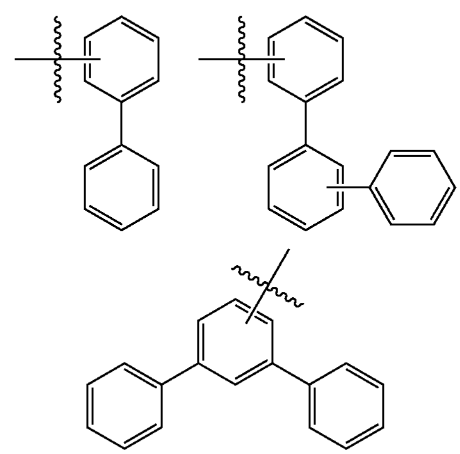

-continued
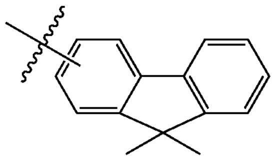
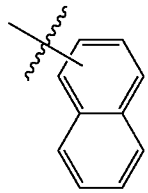
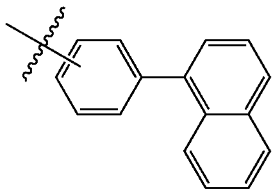
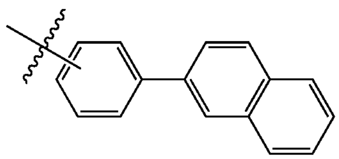
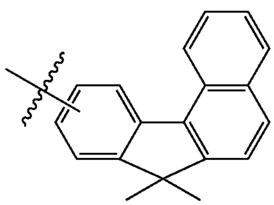
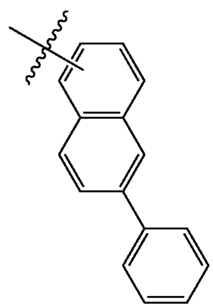
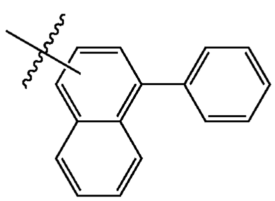
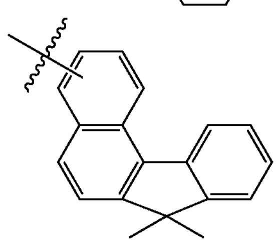
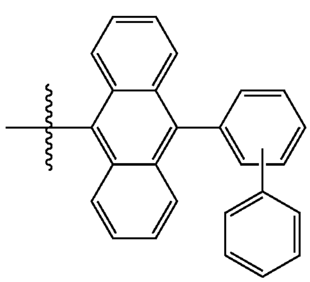
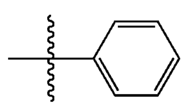
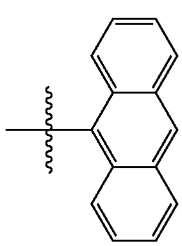
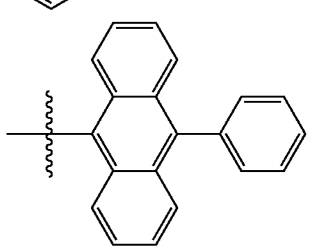
-continued
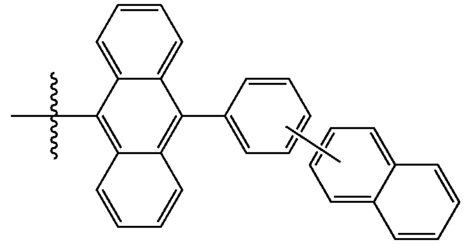
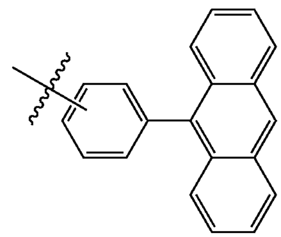
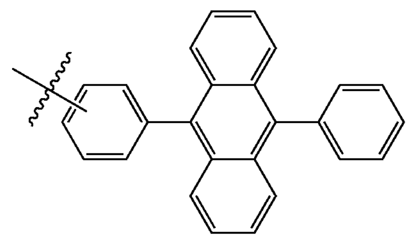
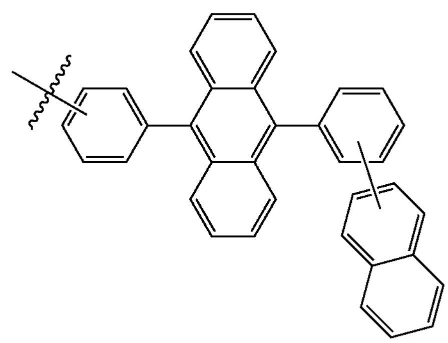
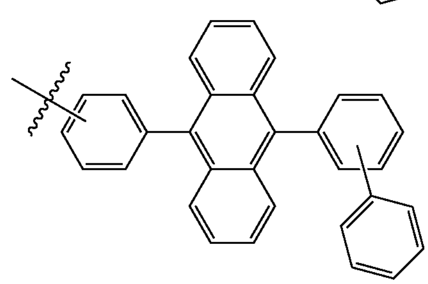
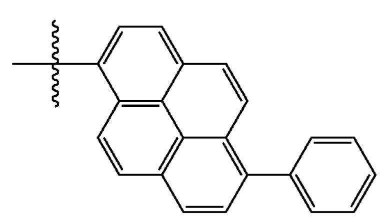

-continued
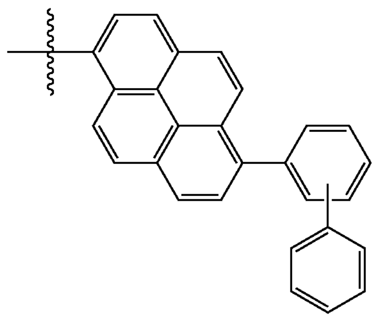
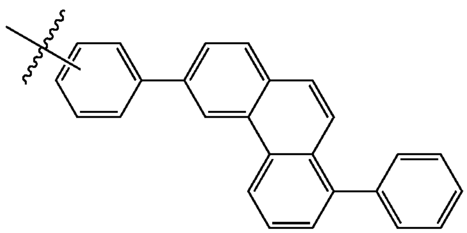
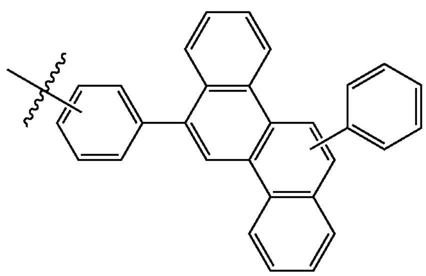
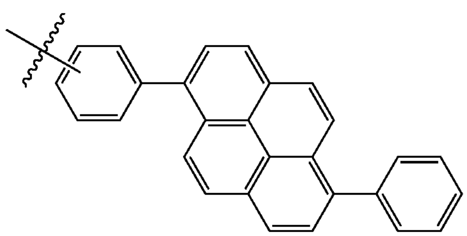
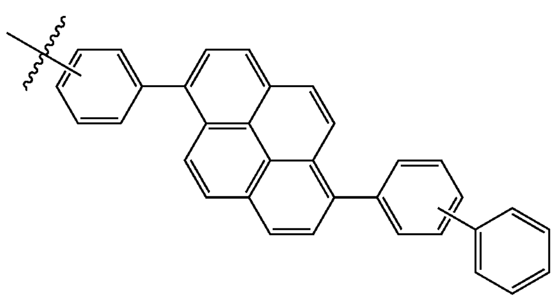
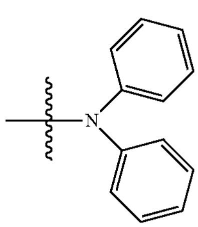
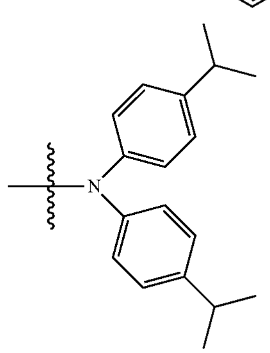
-continued
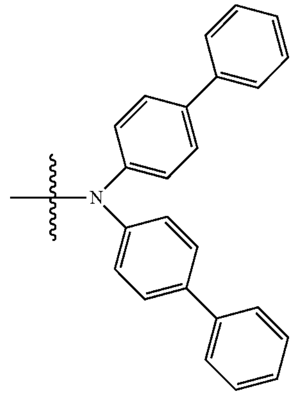
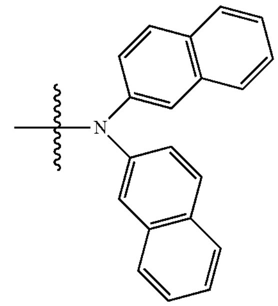
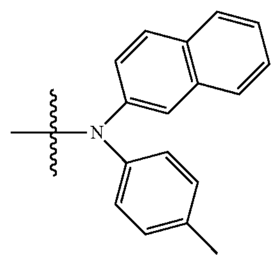
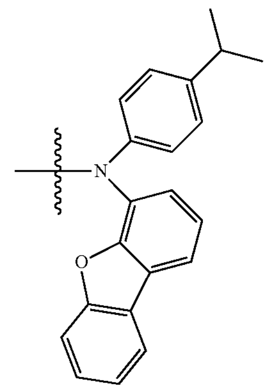
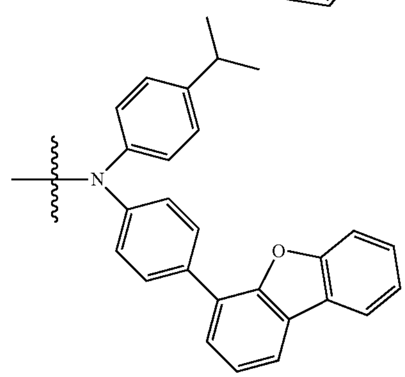
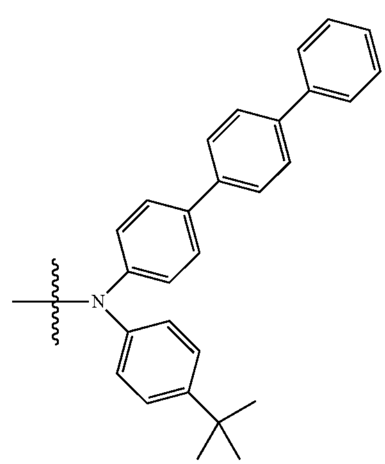

-continued

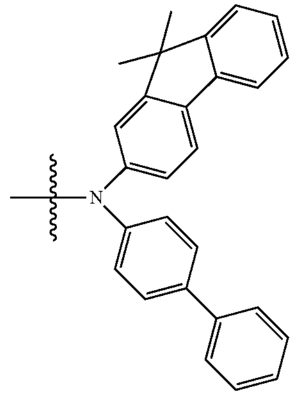

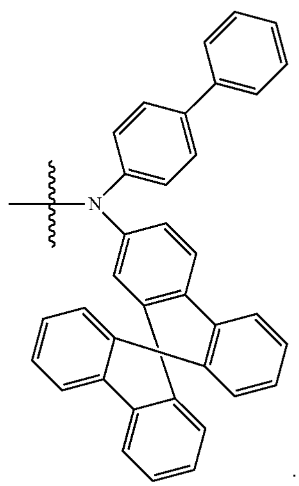

5. An organic electroluminescent device comprising an anode, a cathode, a light emitting layer and one or more layers between the anode and the cathode, wherein the light emitting layer and/or the one or more layers comprise the organic compound according to claim 1.

6. The organic electroluminescence device according to claim 5, wherein the light emitting layer comprising the organic compound of formula (A) is a host material.

7. The organic electroluminescence device according to claim 5, wherein the light emitting layer comprising the organic compound of formula (A) is a fluorescent dopant material.

8. The organic electroluminescence device according to claim 5, wherein the organic electroluminescence device is a lighting panel.

9. The organic electroluminescence device according to claim 5, wherein the organic electroluminescence device is a backlight panel.

10. An organic compound of the following formula (A):

formula (A)

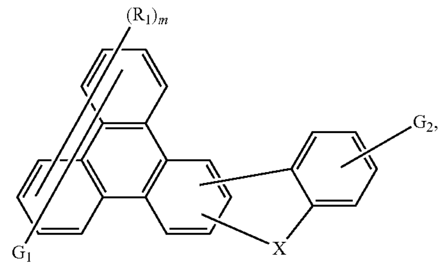

$(R_1)_m$ wherein at least one of $G_1$ and $G_2$ exists and represents formula (B) below:

formula (B)

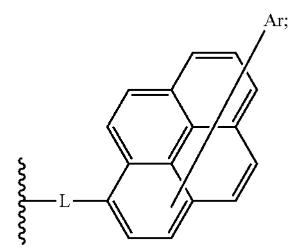

Ar formula (B);

X is a divalent bridge selected from the group consisting of O, S, Se, $NR_2$ and $SiR_3R_4$; m is an integer of 0 to 8; L represents a single bond, a substituted or unsubstituted divalent arylene group having 6 to 12 ring carbon atoms, or a substituted or unsubstituted divalent heteroarylene group having 6 to 12 ring carbon atoms; and Ar represents a substituted or unsubstituted phenyl group, a substituted or unsubstituted biphenyl group, a substituted or unsubstituted terphenyl group, a substituted or unsubstituted fluorene group, a substituted or unsubstituted benzofluorene group, a substituted or unsubstituted naphthyl group, a substituted or unsubstituted anthracenyl group, a substituted or unsubstituted phenanthrenyl group, a substituted or unsubstituted pyrenyl group, or a substituted or unsubstituted chrysenyl group, a substituted or unsubstituted diphenylamine group, a substituted or unsubstituted triphenylamine group, a substituted or unsubstituted phenyldibenzofuranylamine group, or a substituted or unsubstituted phenyldibenzothiophenylamine group, or a substituted or unsubstituted diphenylfluorenylamine group, or a substituted or unsubstituted diphenylspirobifluorenylamine group.

11. An organic compound is one of the following compounds:
Compound 1
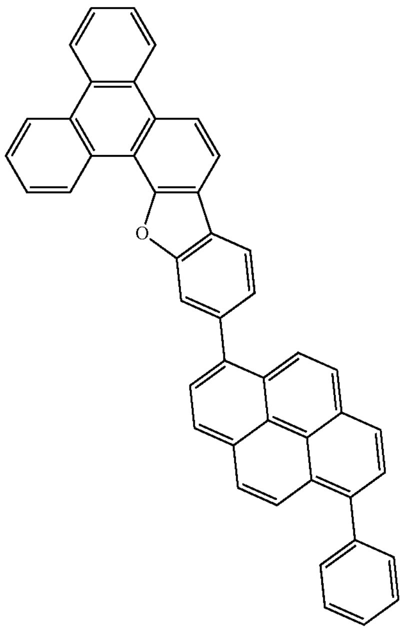
Compound 2
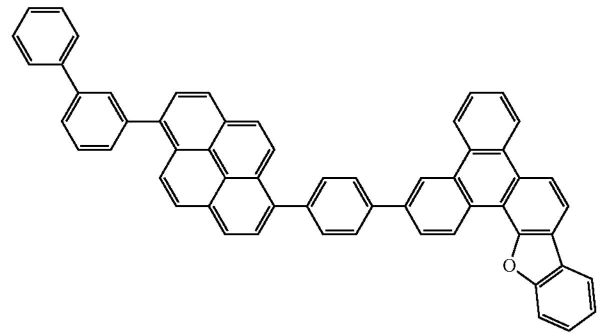
Compound 3
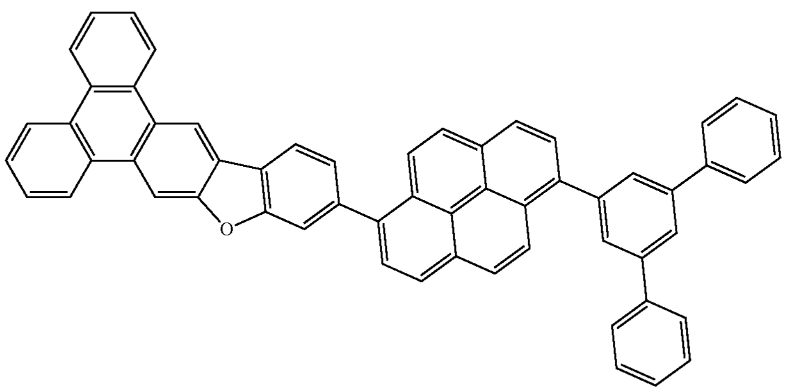
Compound 4
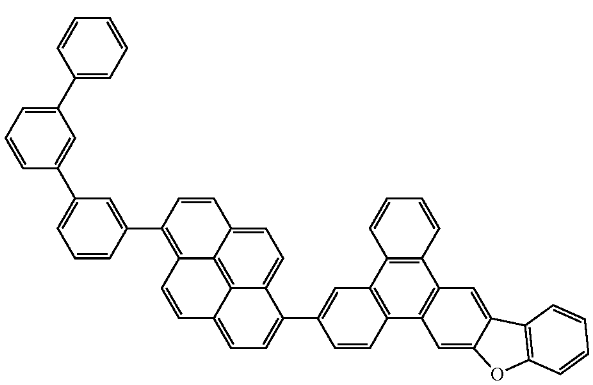
Compound 5
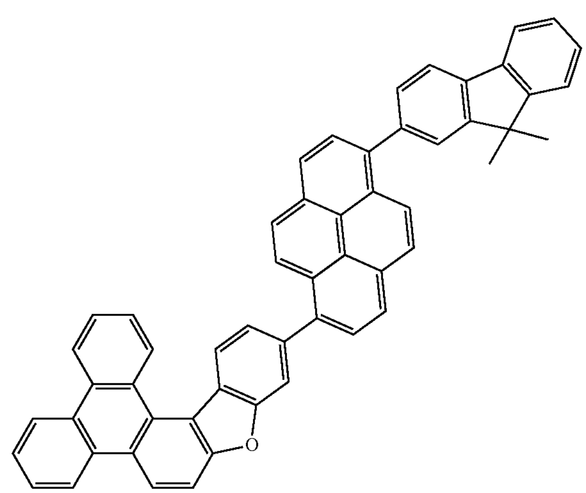

-continued
Compound 6
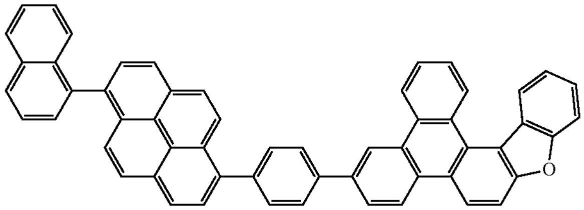
Compound 7
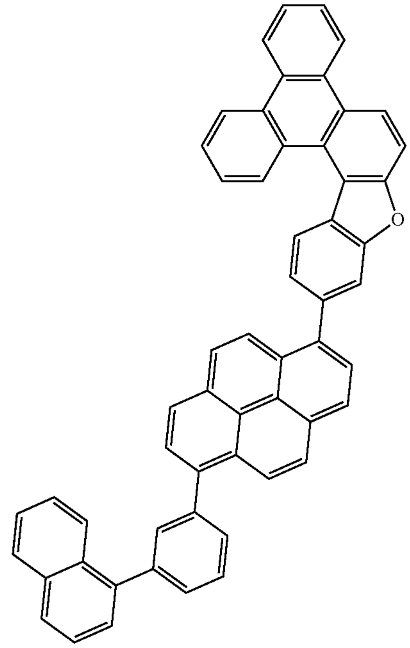
Compound 8
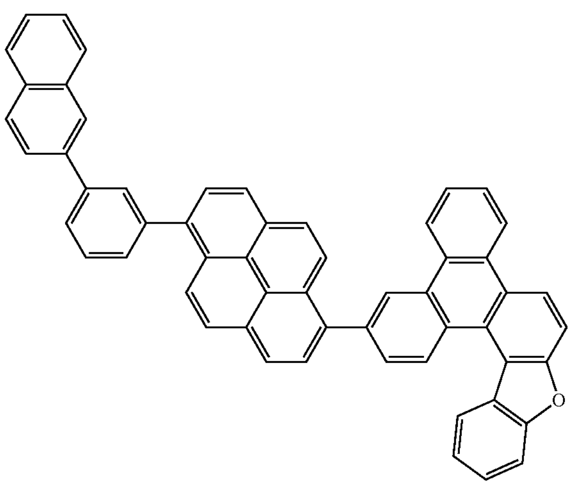
Compound 9
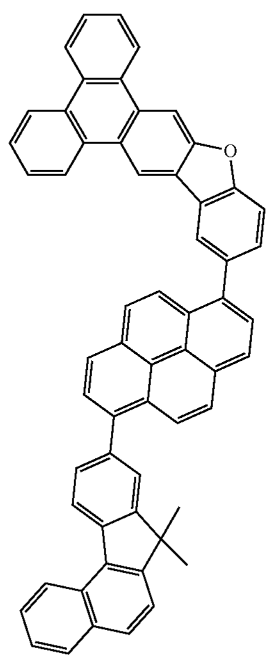

-continued
Compound 10
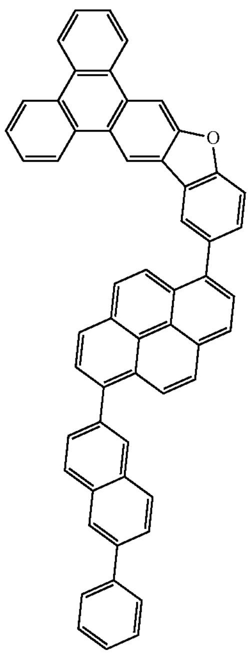
Compound 11
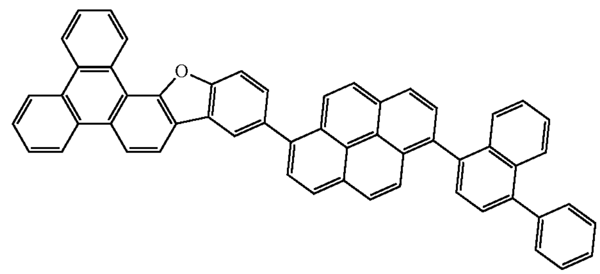
Compound 12
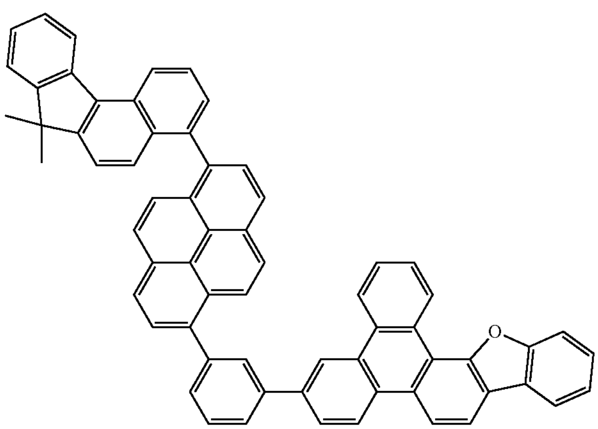
Compound 13
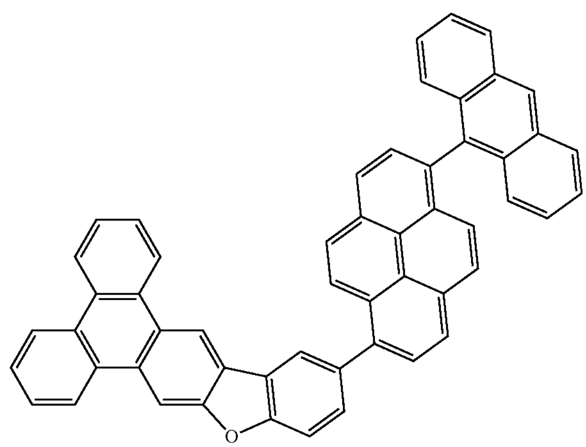
Compound 14
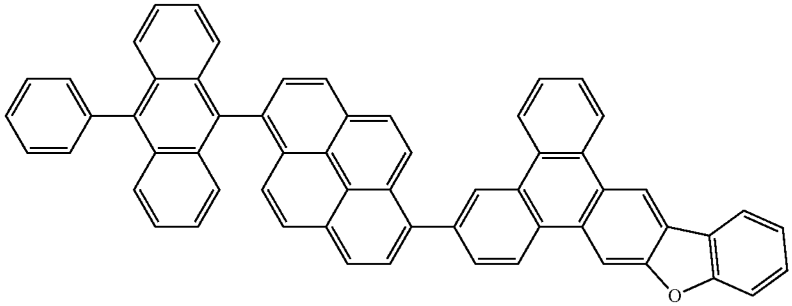

-continued
Compound 15
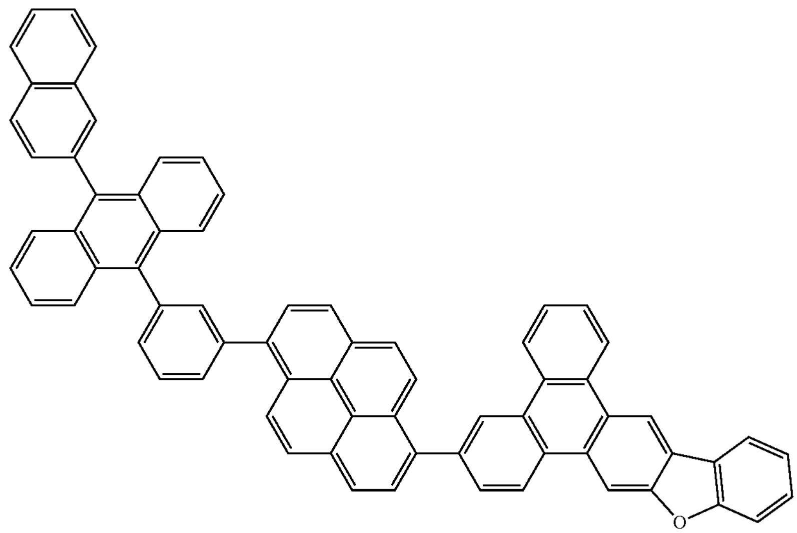
Compound 16
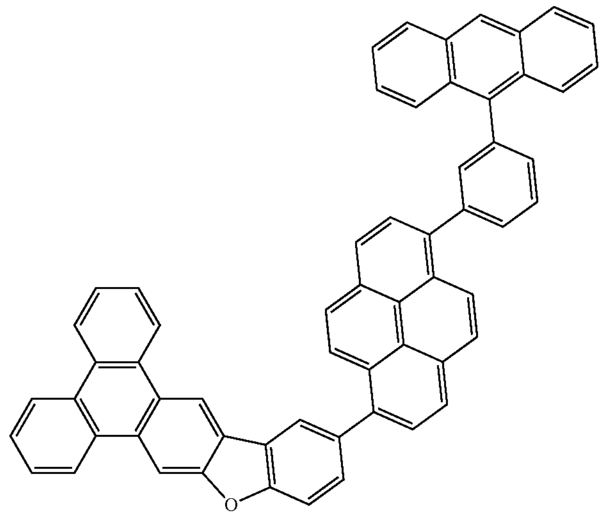
Compound 17
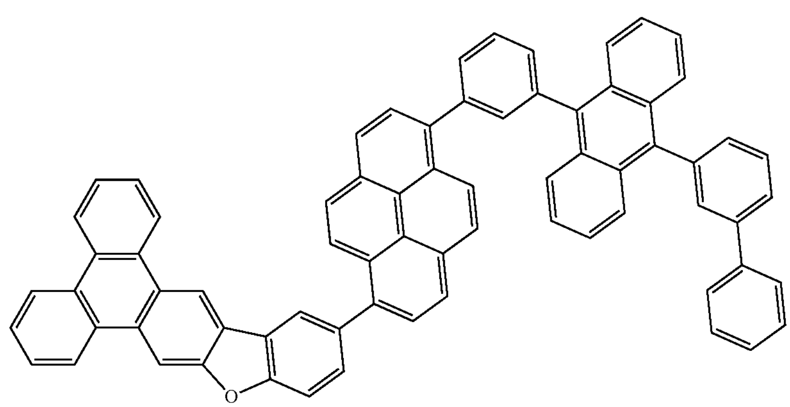

-continued
Compound 18
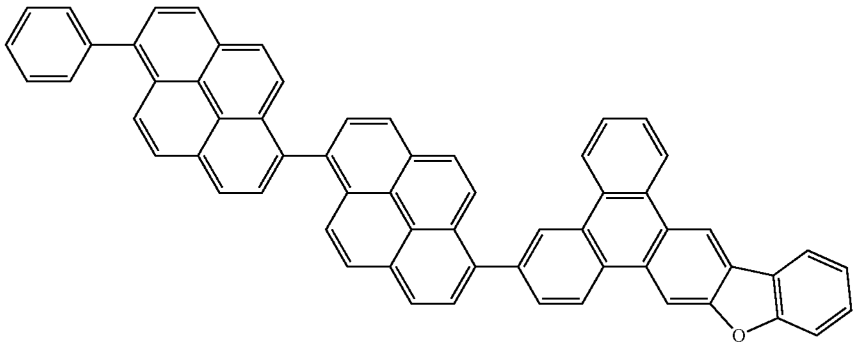
Compound 19
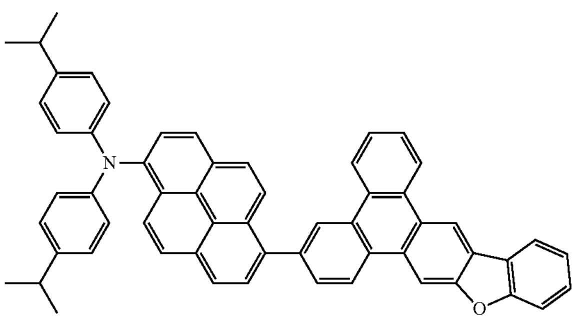
Compound 20
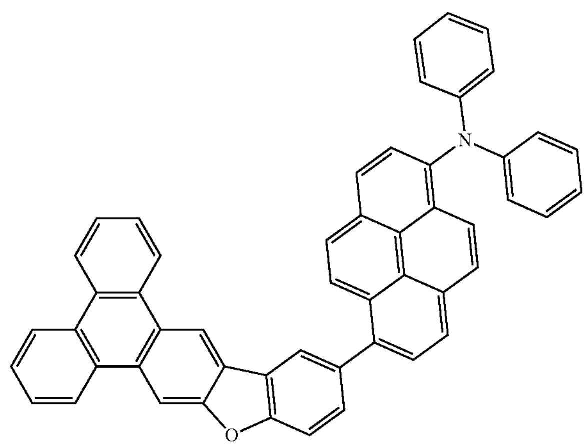
Compound 21
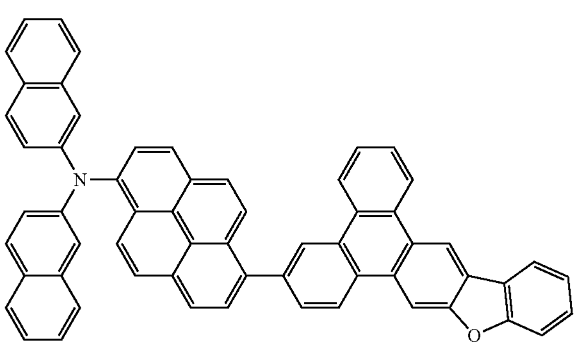
Compound 22
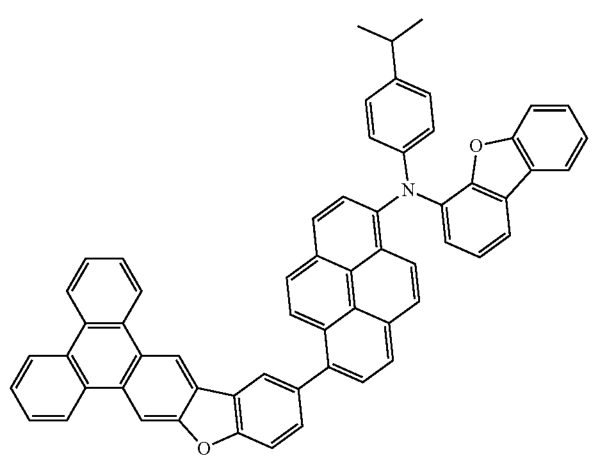

-continued
Compound 23
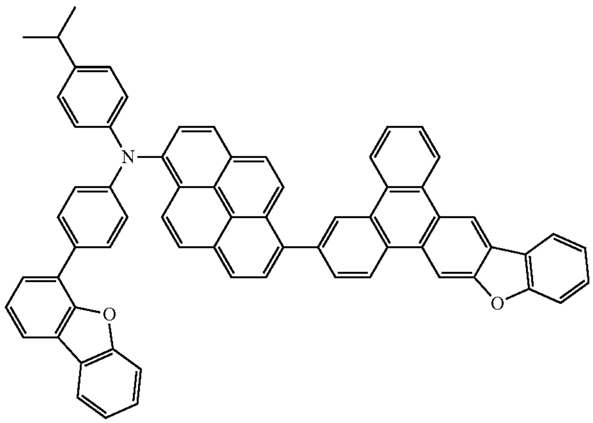
Compound 24
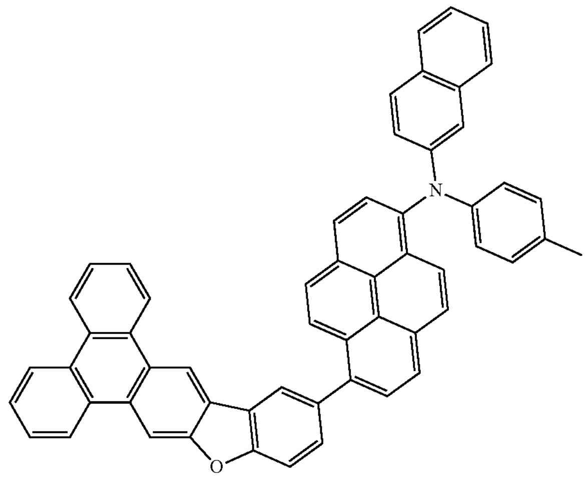
Compound 25
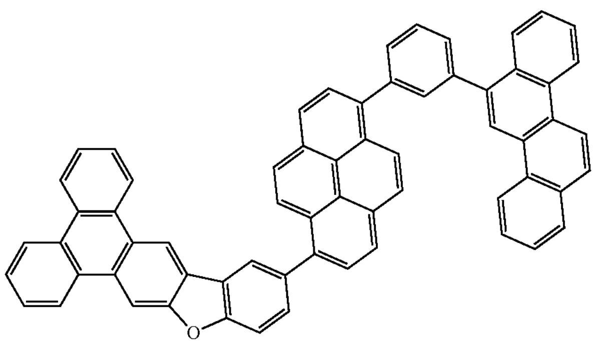
Compound 26
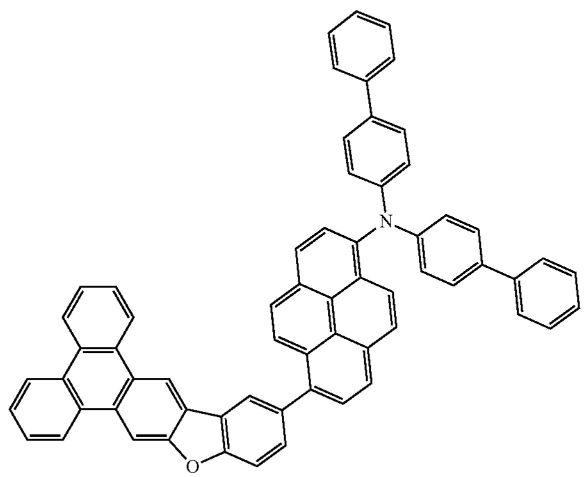
Compound 27
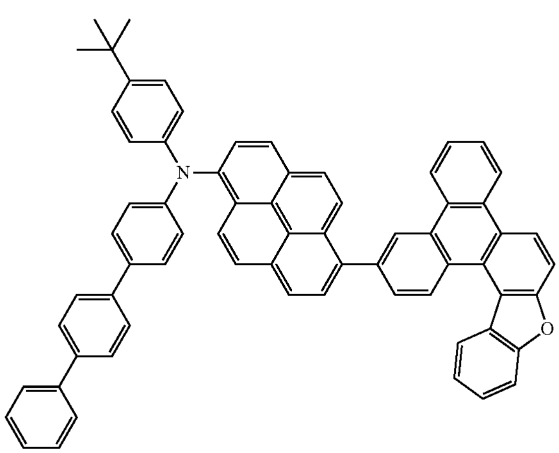
Compound 28
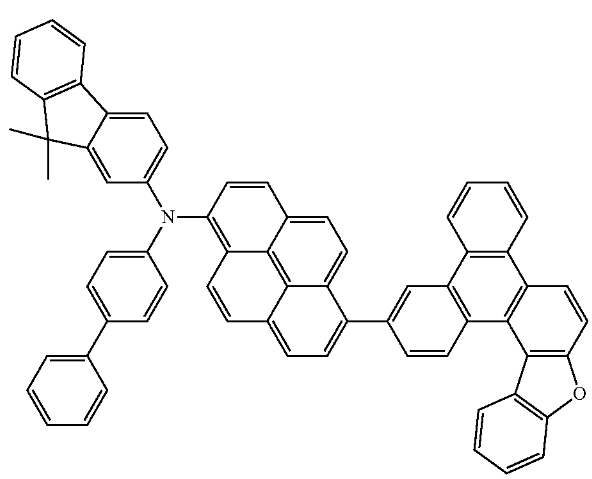

-continued
Compound 29
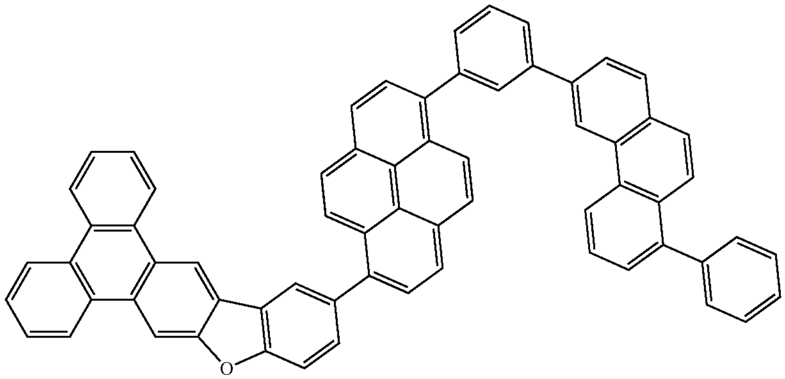
Compound 30
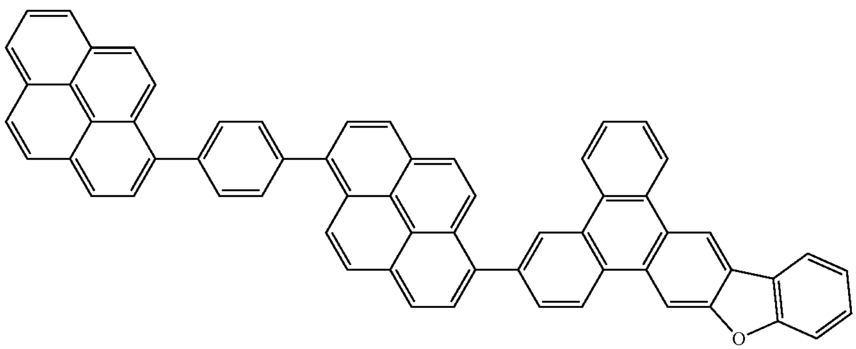
Compound 31
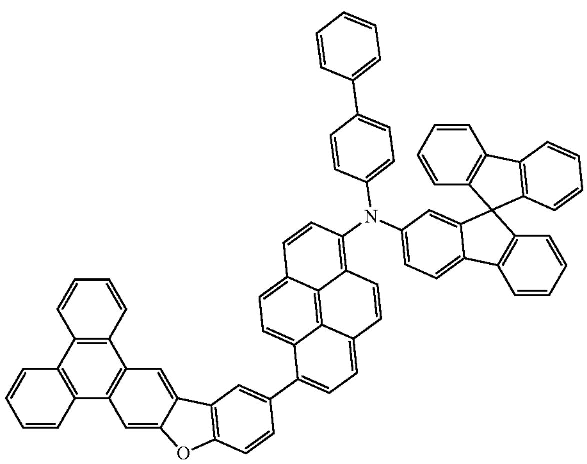
Compound 32
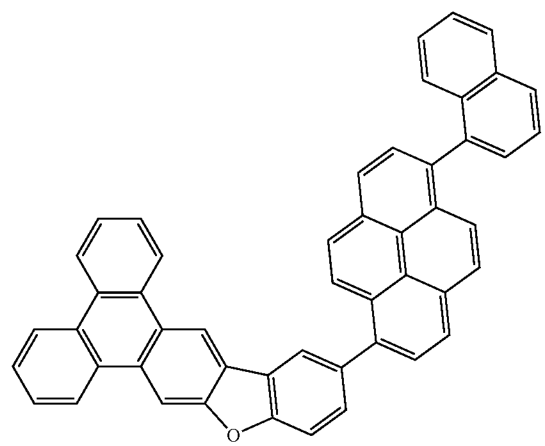
Compound 33
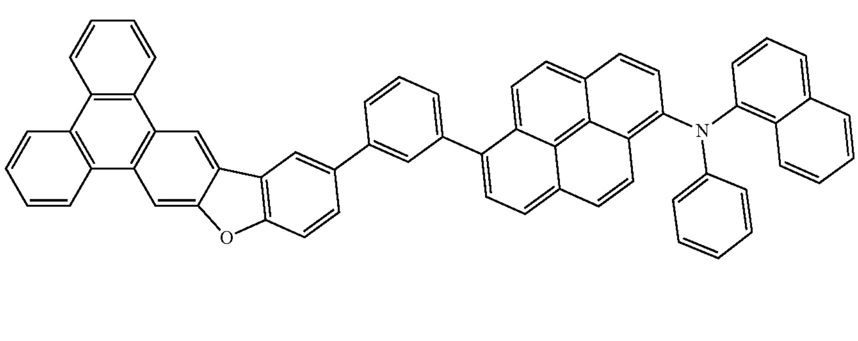

-continued
Compound 34
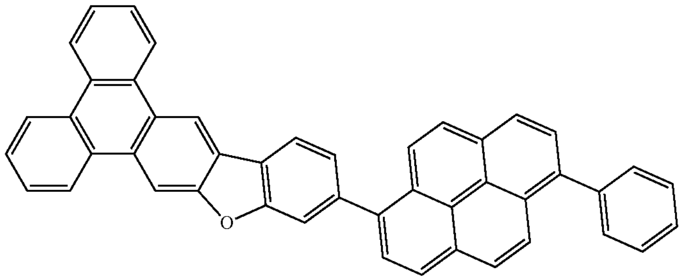
Compound 35
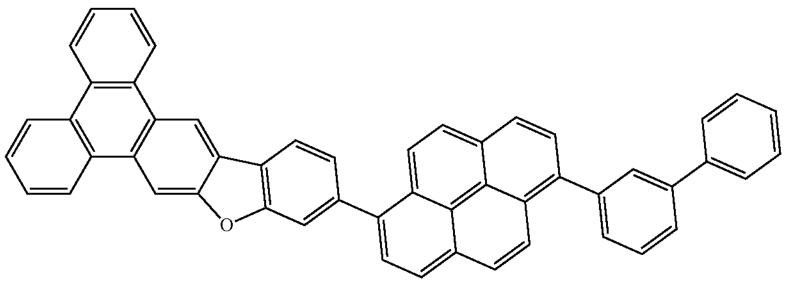
Compound 36
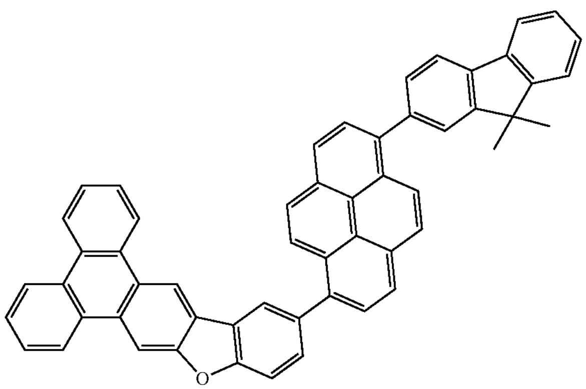
Compound 37
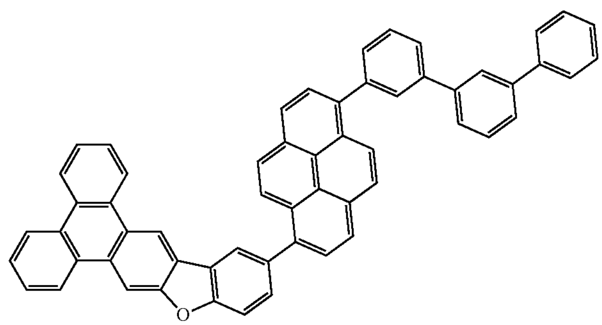
Compound 38
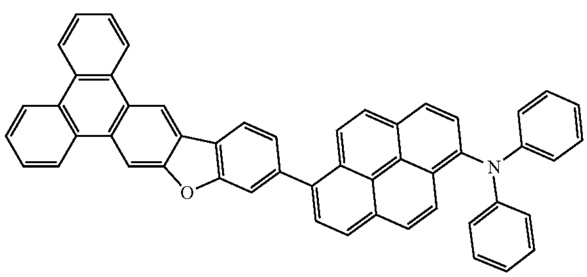
Compound 39
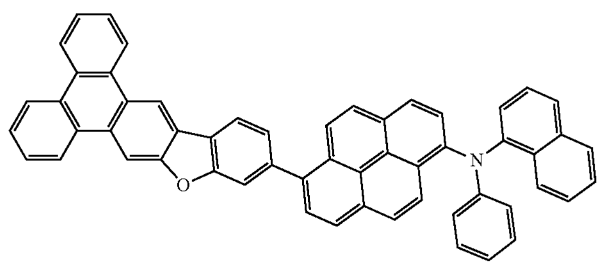
Compound 40
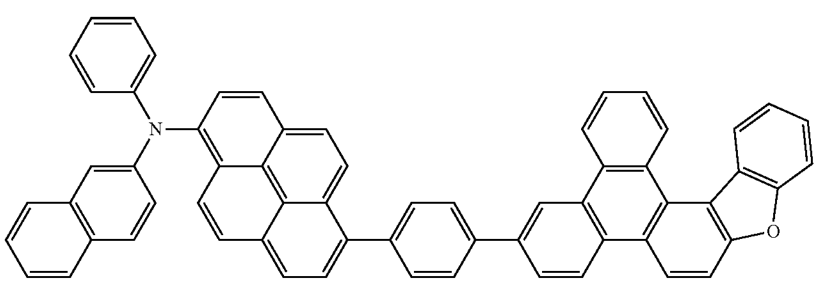

-continued
Compound 41
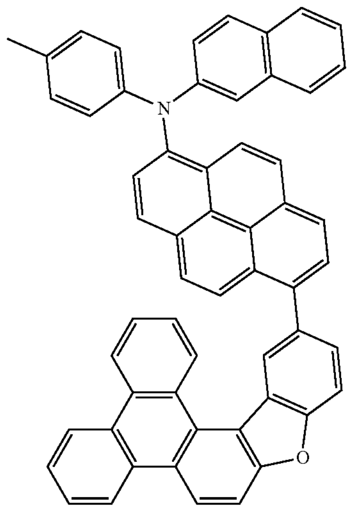
Compound 42
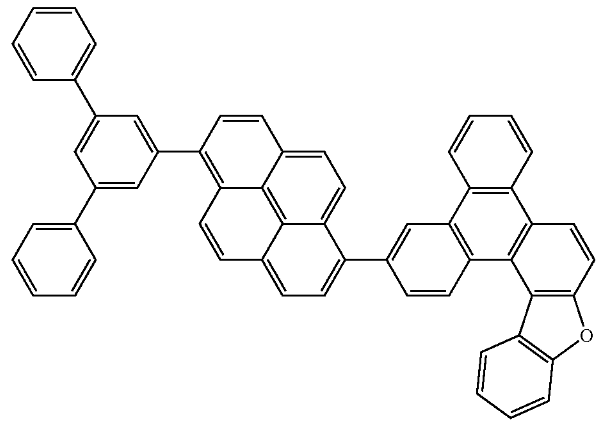
Compound 43
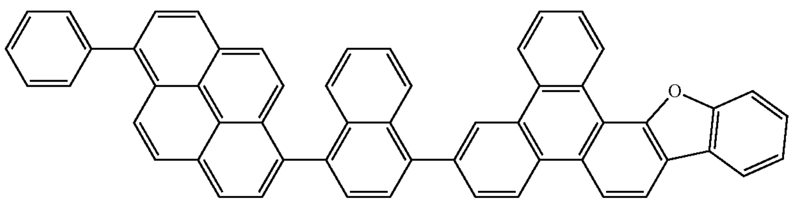
Compound 44
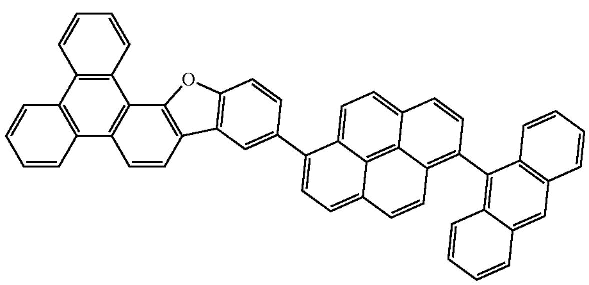
Compound 45
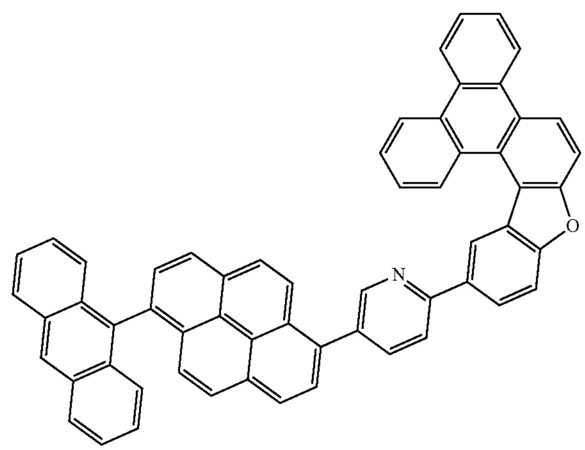
Compound 46
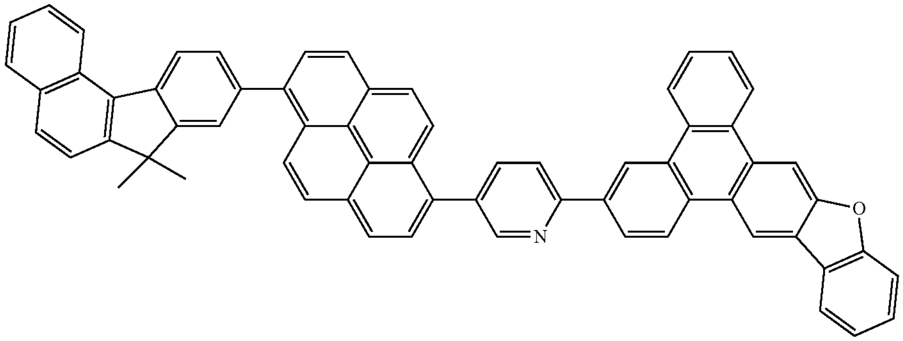

-continued
Compound 47
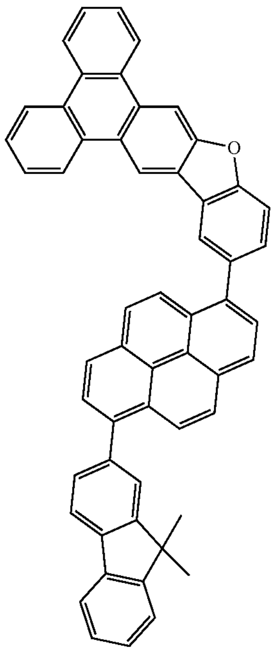
Compound 48
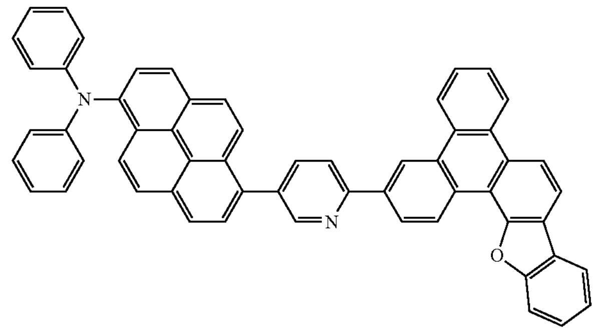
Compound 49
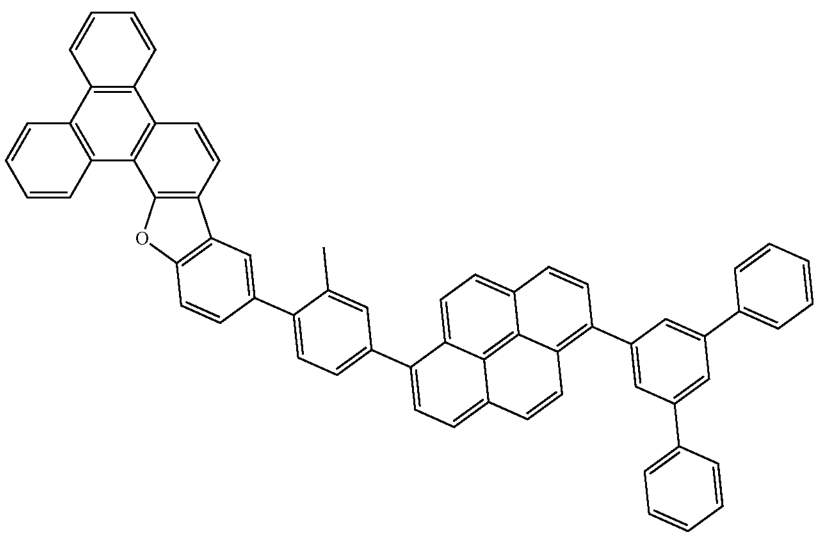
Compound 50
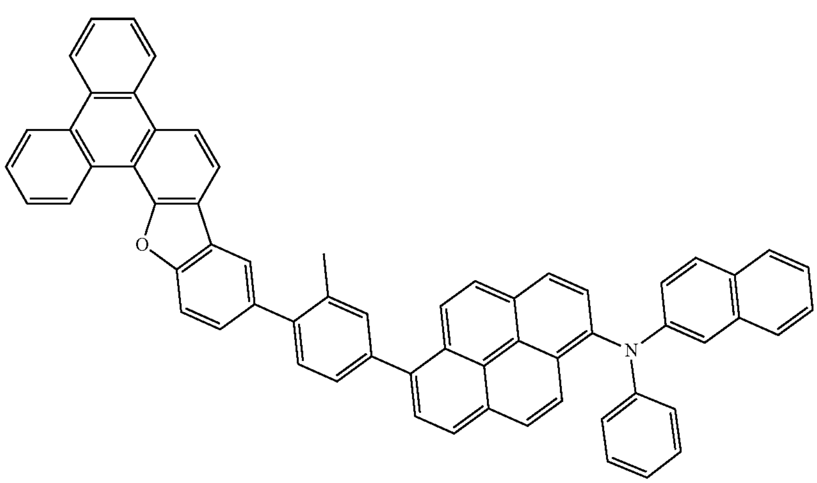

-continued
Compound 51
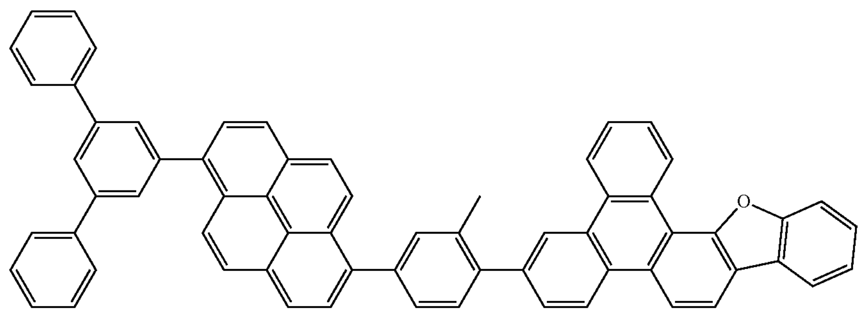
Compound 52
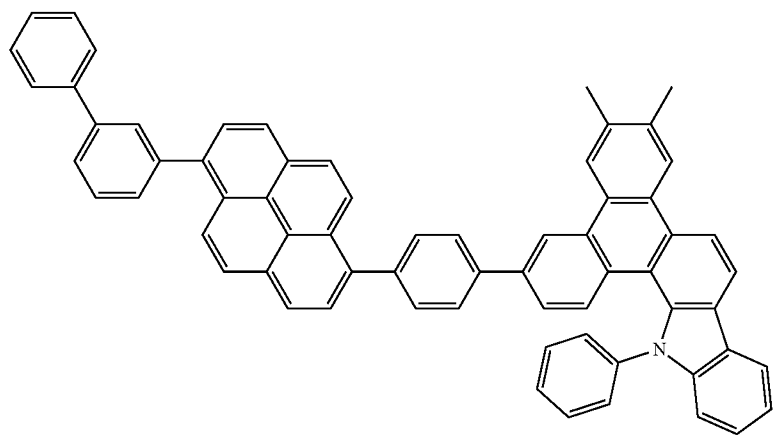
Compound 53
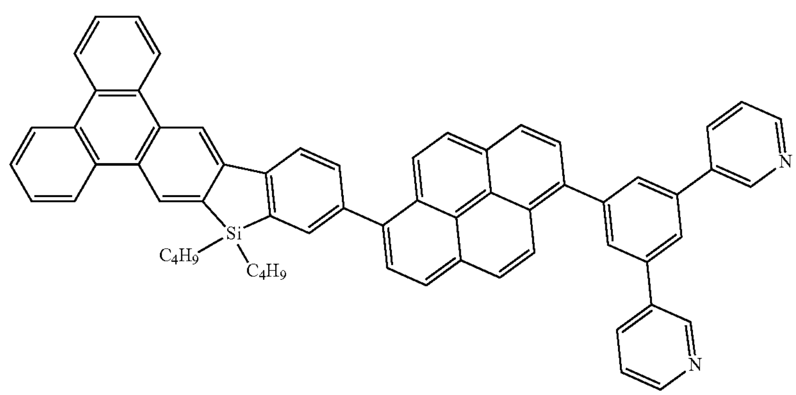
Compound 54
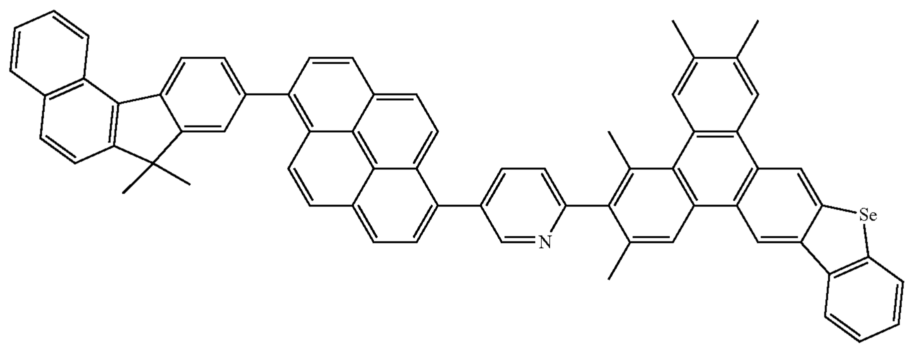

-continued
Compound 55
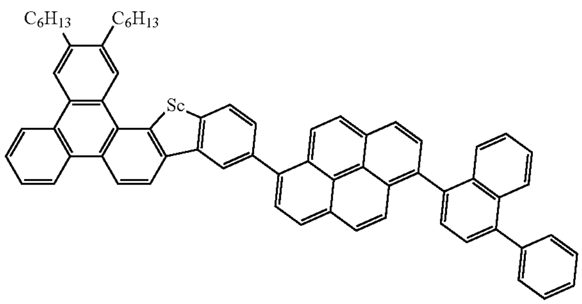
Compound 56
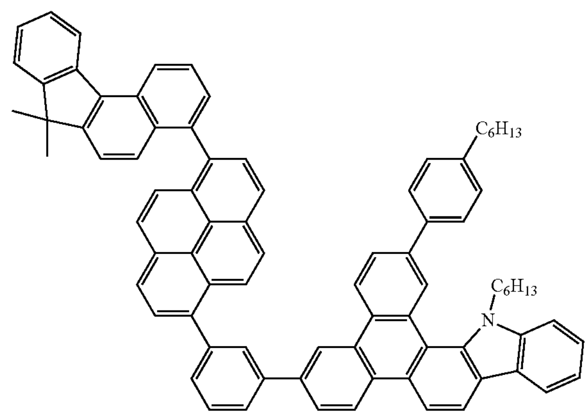
Compound 57
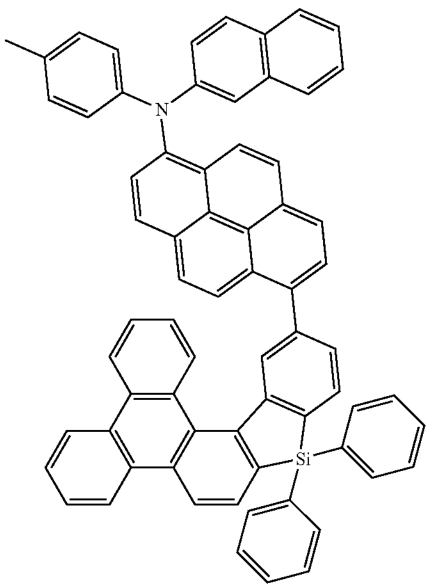
Compound 58
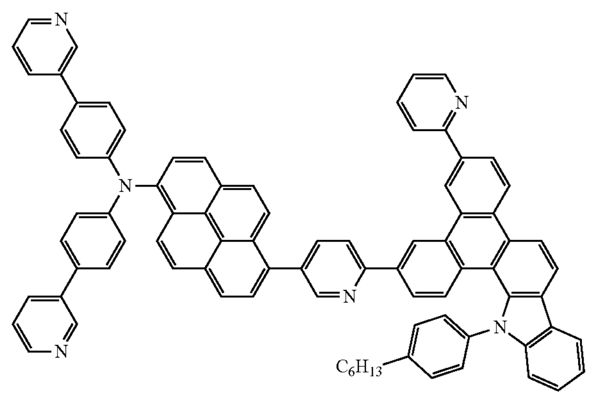
Compound 59
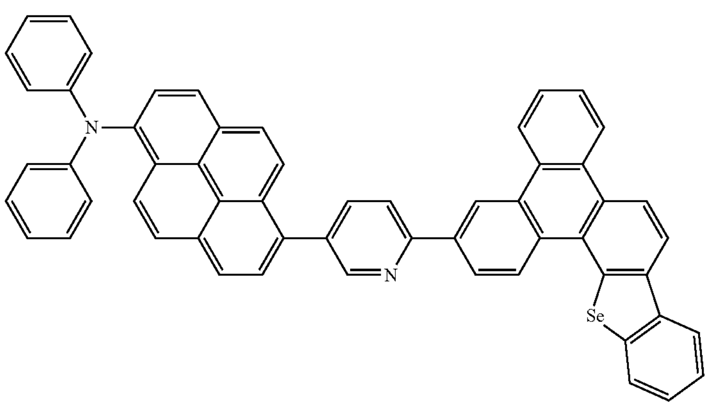

-continued
Compound 60
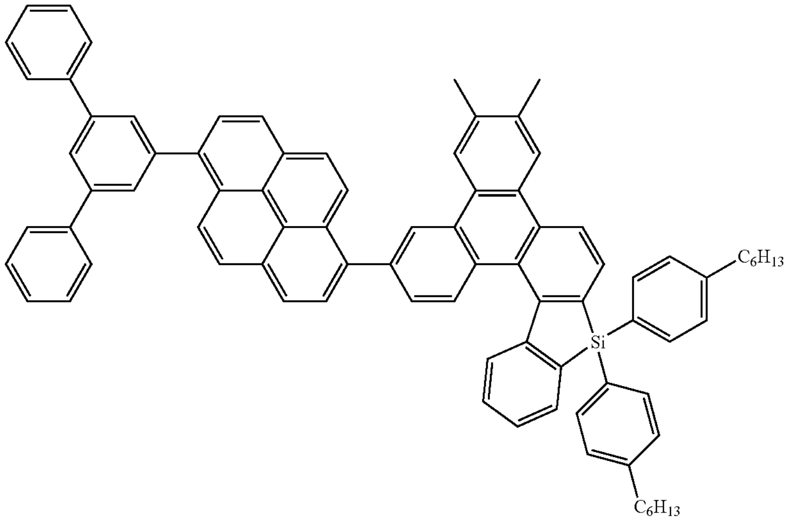
Compound 61
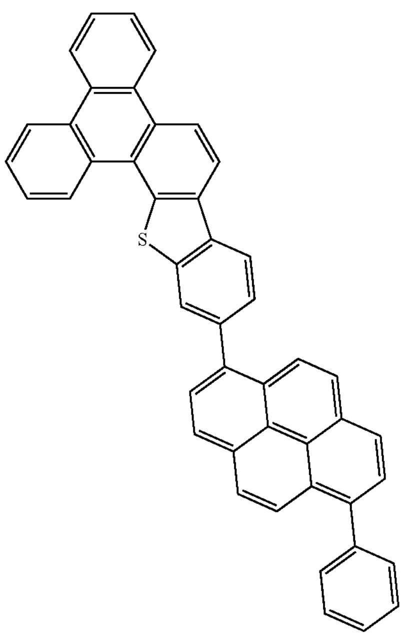
Compound 62
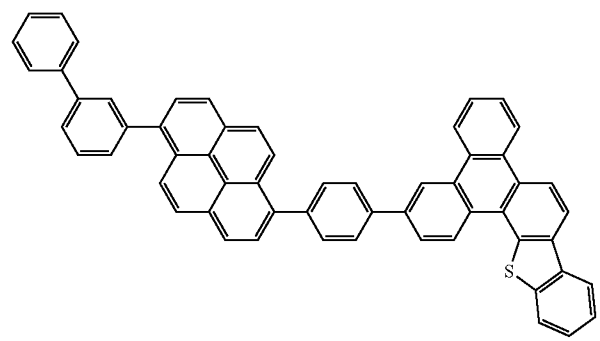
Compound 63
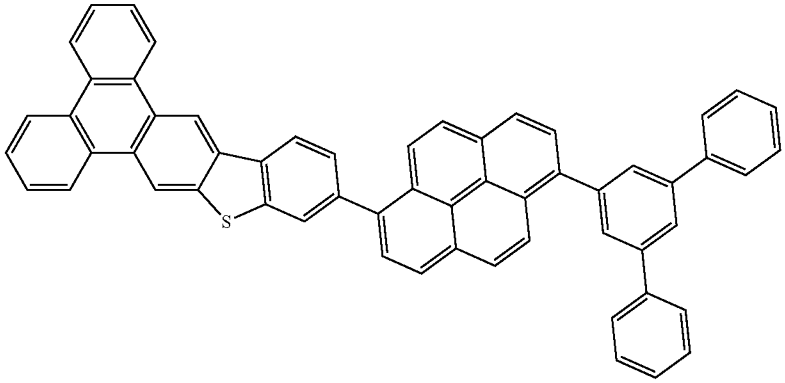

-continued
Compound 64
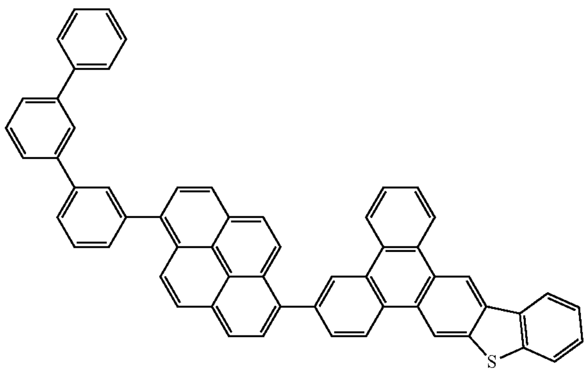
Compound 65
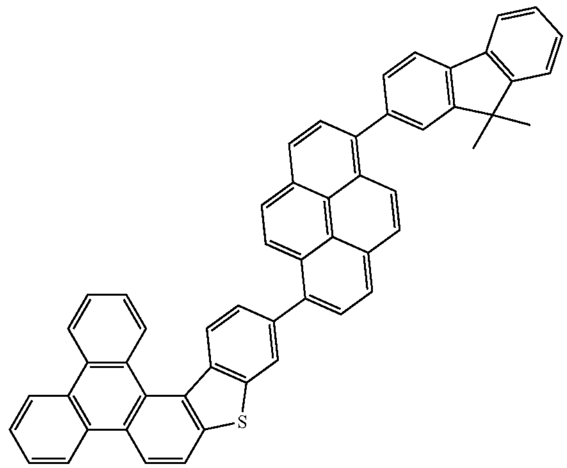
Compound 66
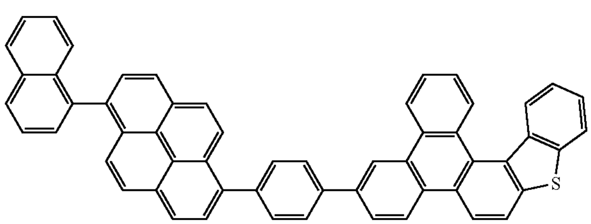
Compound 67
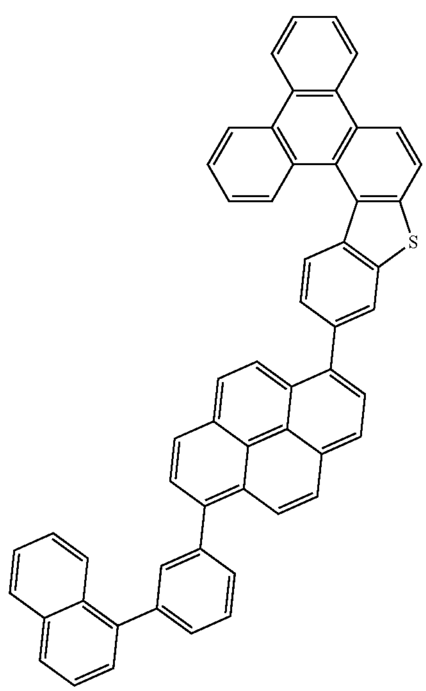

-continued
Compound 68
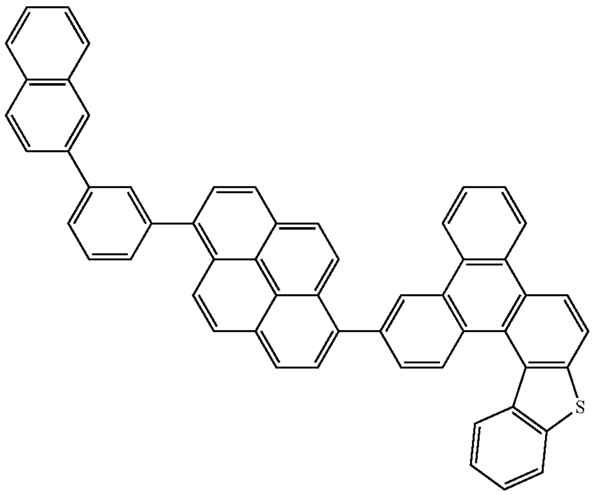
Compound 69
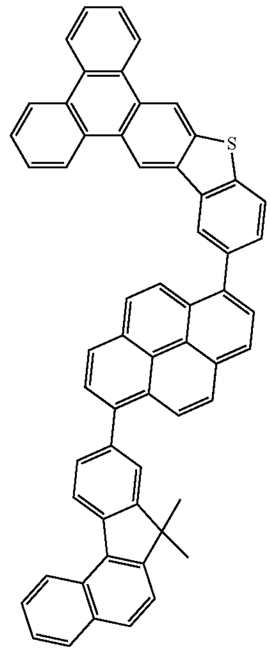
Compound 70
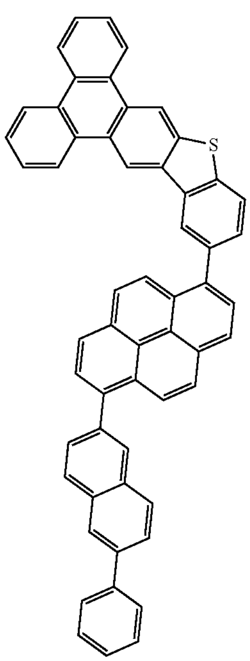
Compound 71
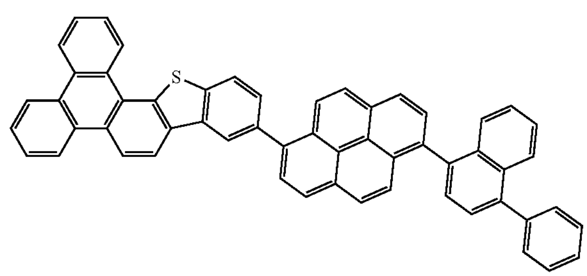

-continued
Compound 72
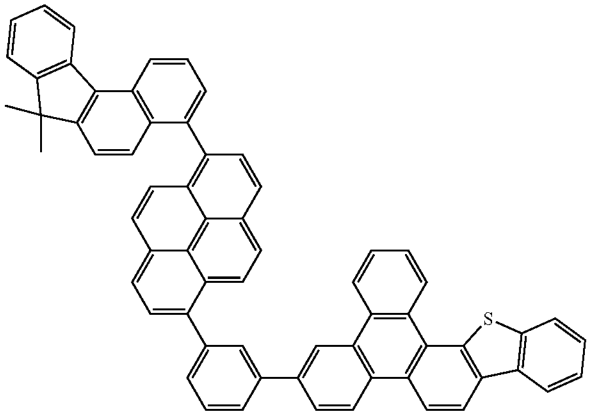
Compound 73
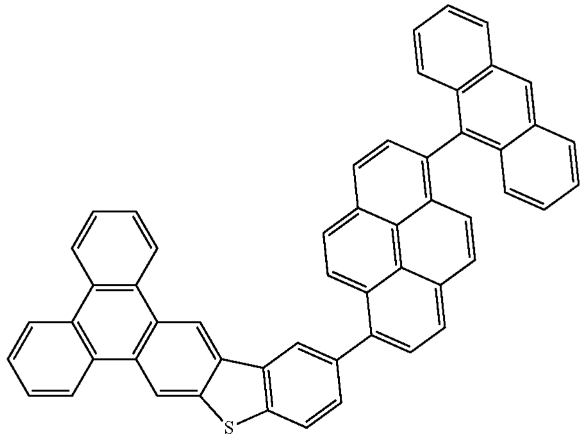
Compound 74
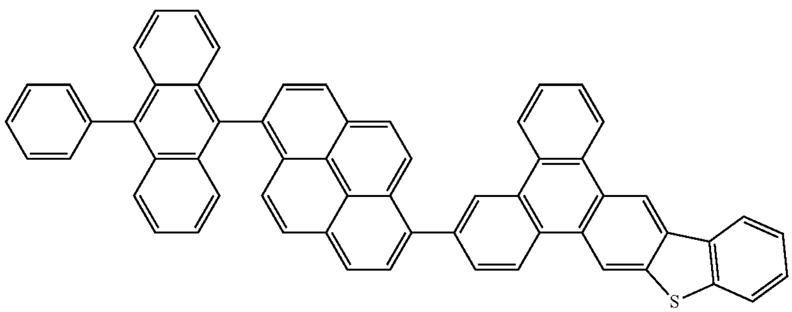
Compound 75
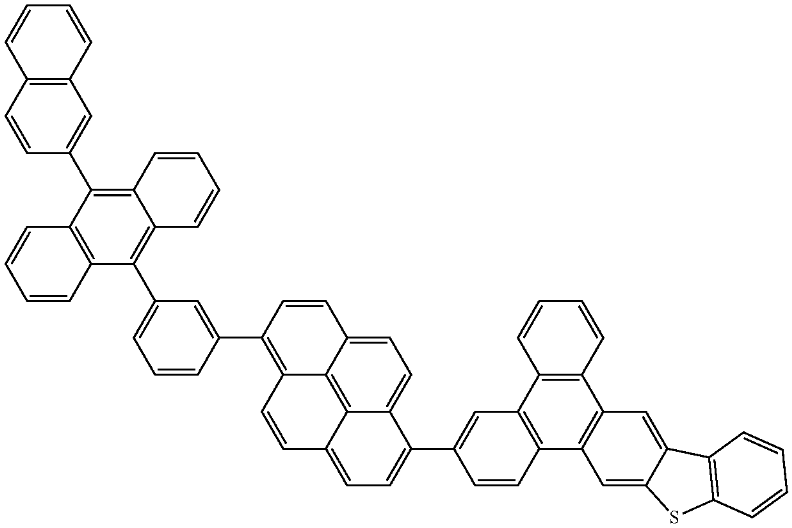

-continued
Compound 76
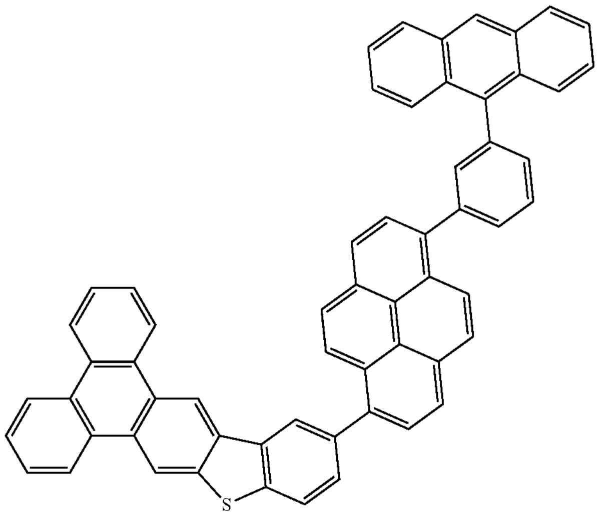
Compound 77
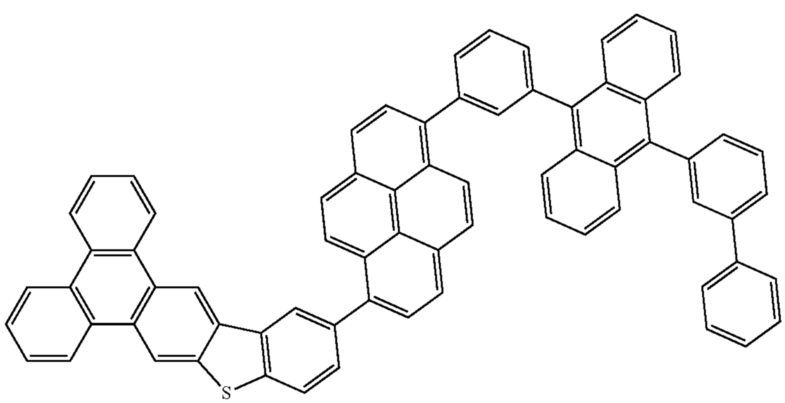
Compound 78
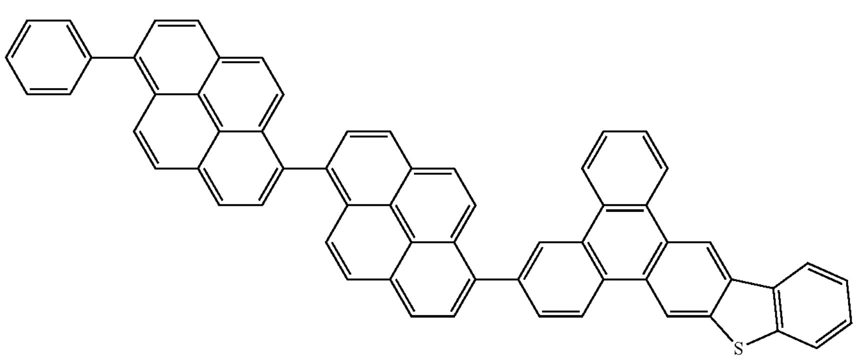

-continued
Compound 79
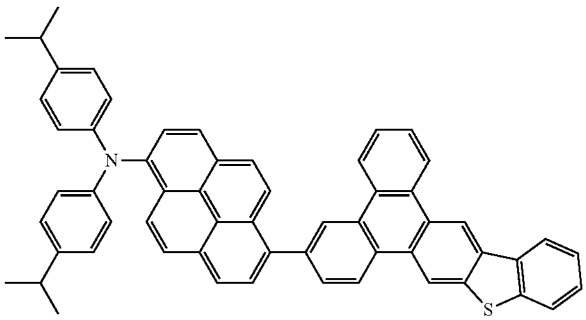
Compound 80
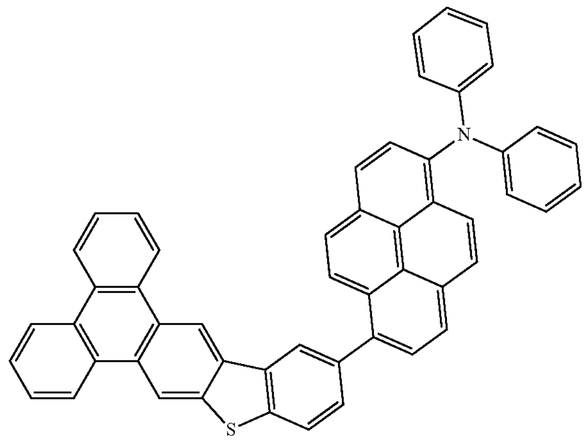
Compound 81
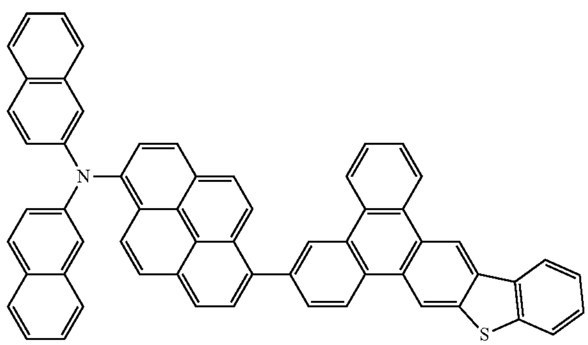
Compound 82
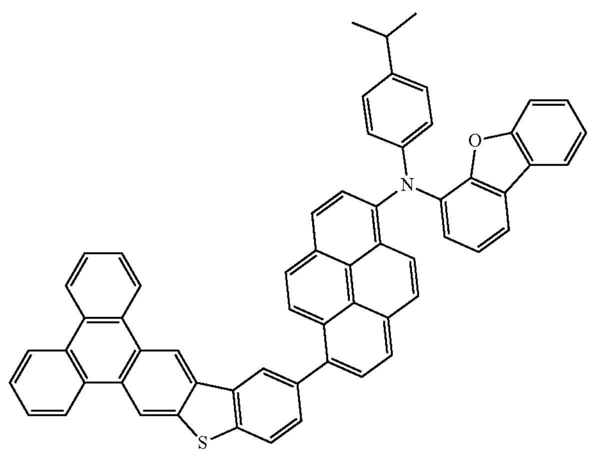
Compound 83
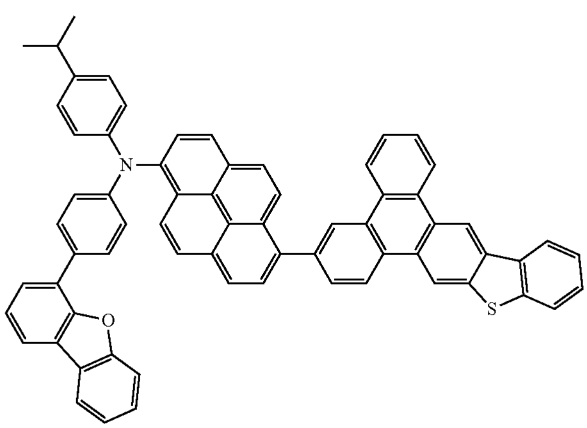
Compound 84
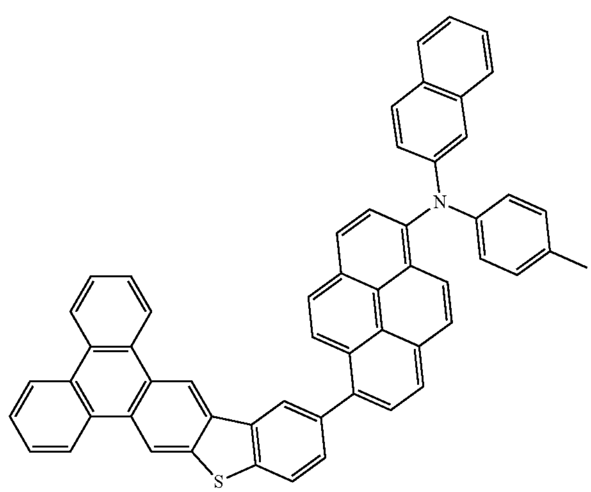

-continued
Compound 85
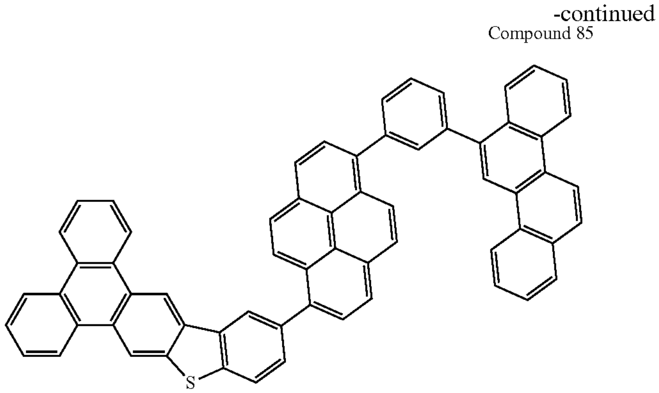
Compound 86
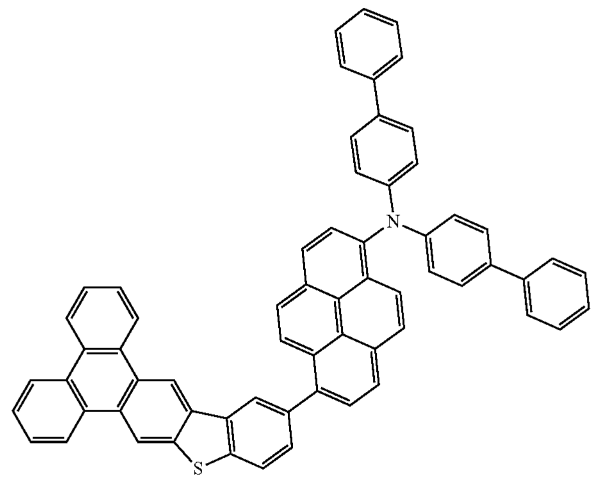
Compound 87
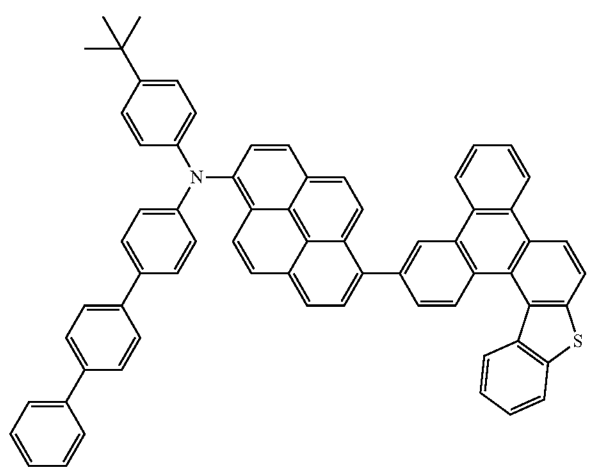
Compound 88
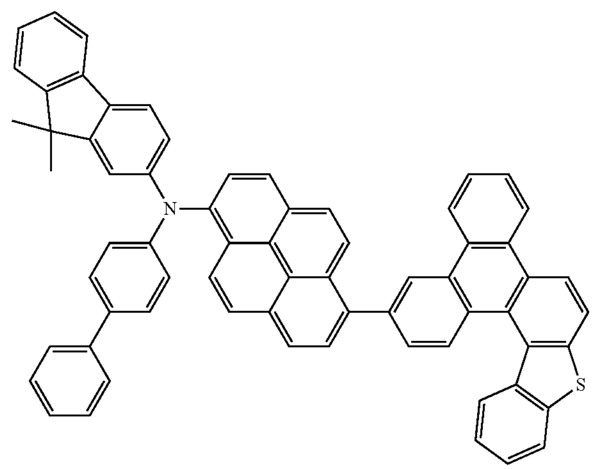
Compound 89
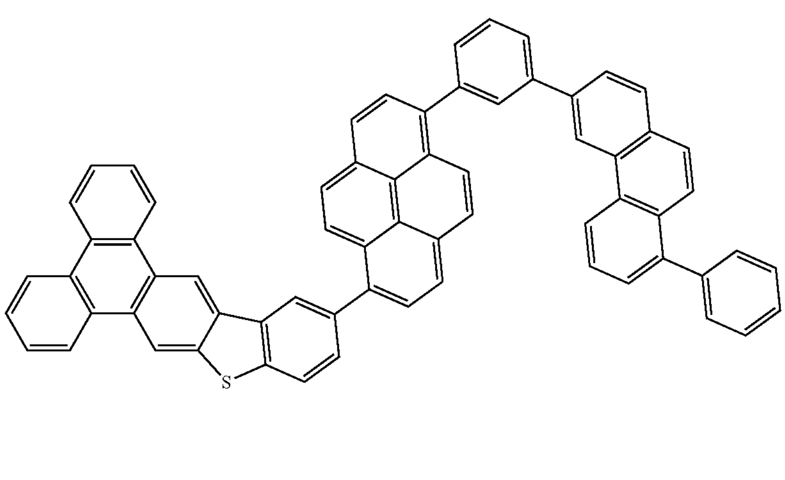

-continued
Compound 90
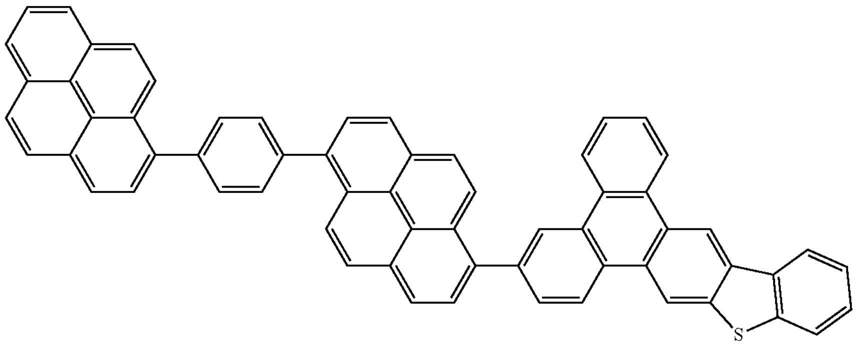
Compound 91
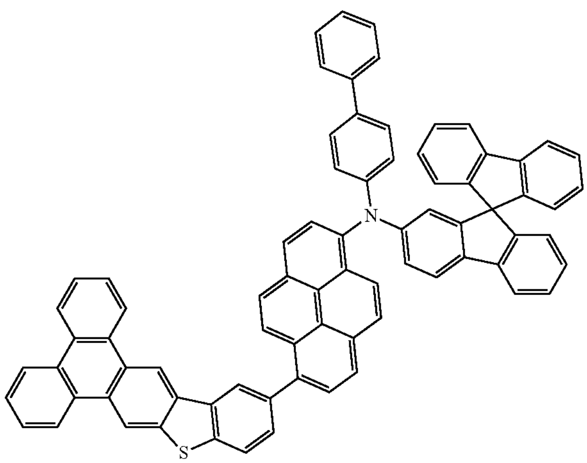
Compound 92
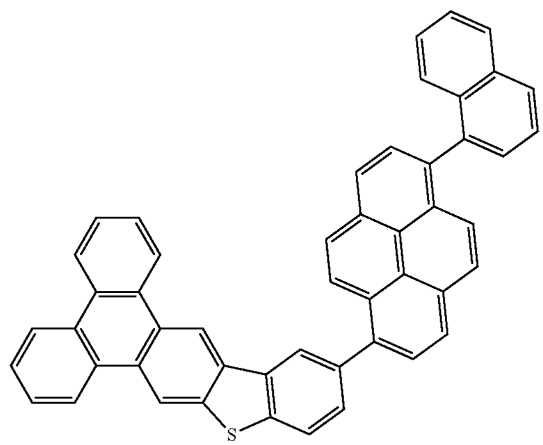
Compound 93
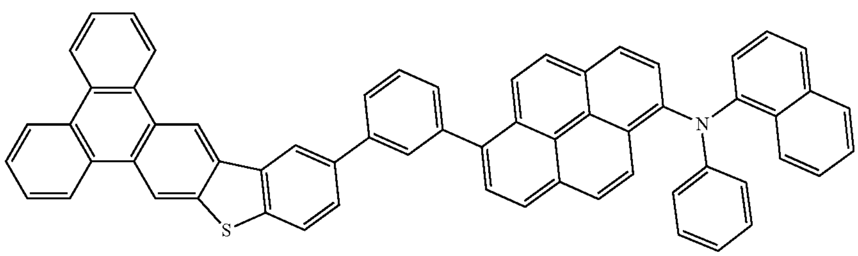
Compound 94
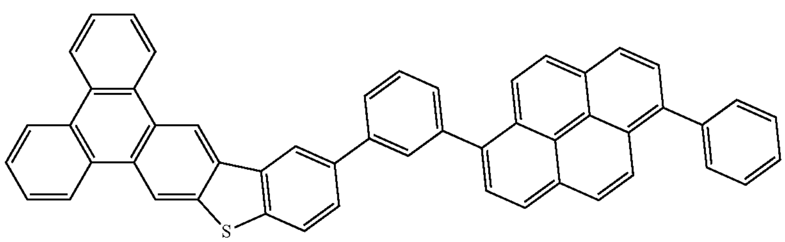
Compound 95
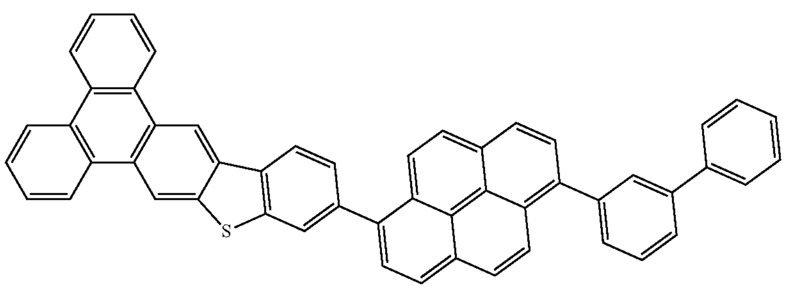

-continued
Compound 96
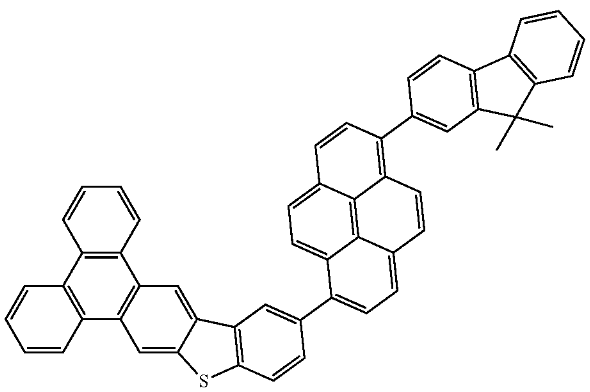
Compound 97
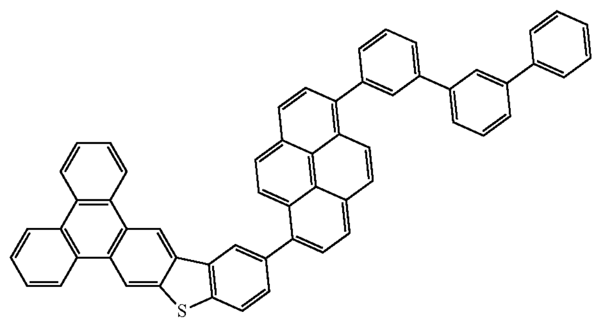
Compound 98
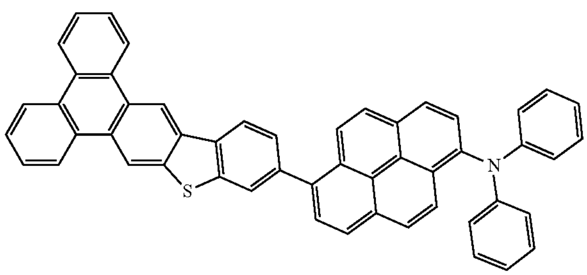
Compound 99
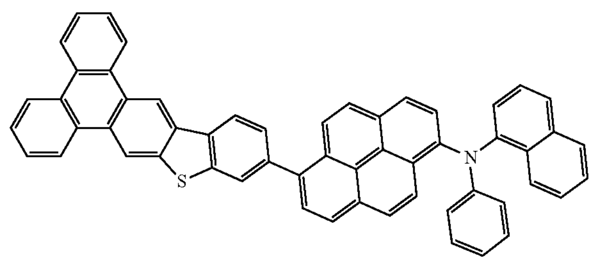
Compound 100
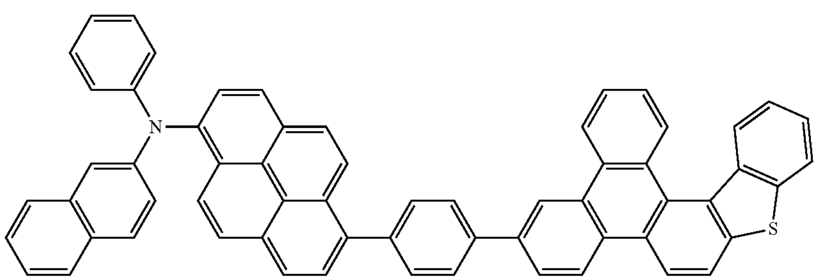
Compound 101
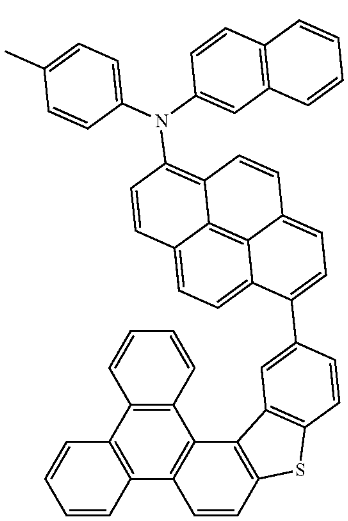
Compound 102
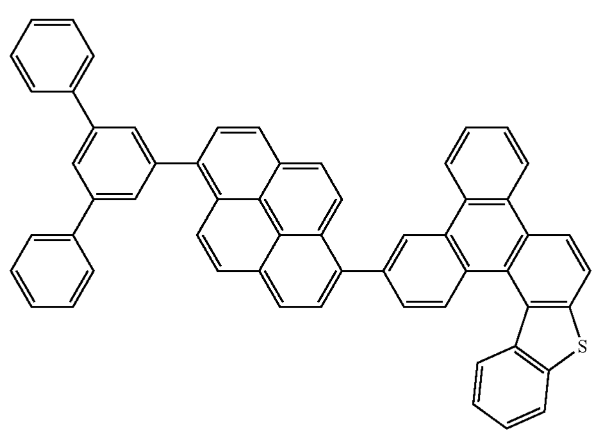

-continued
Compound 103
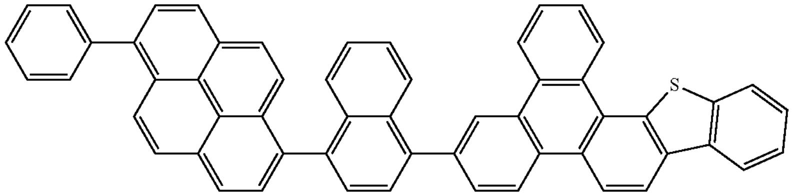
Compound 104
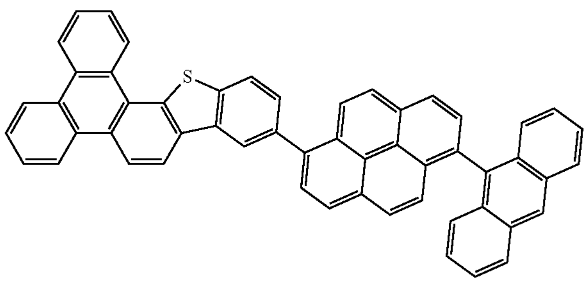
Compound 105
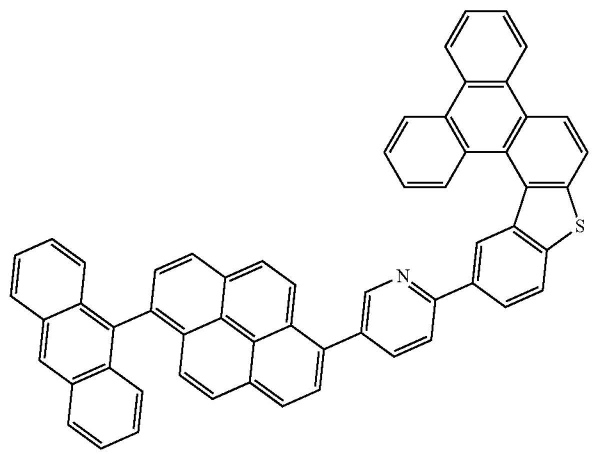
Compound 106
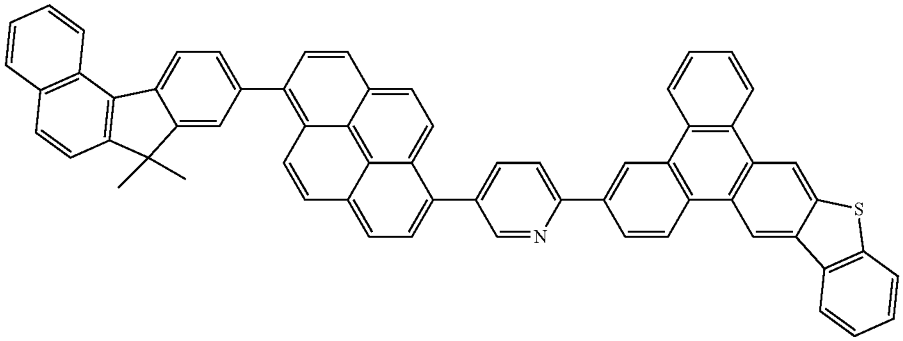

-continued
Compound 107
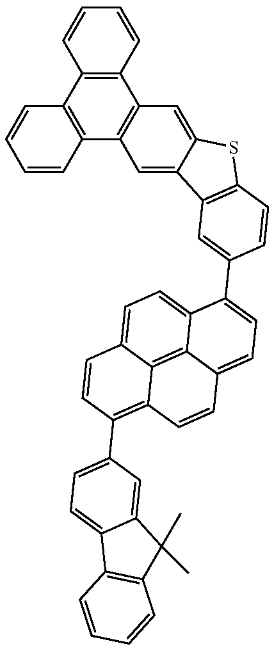
Compound 108
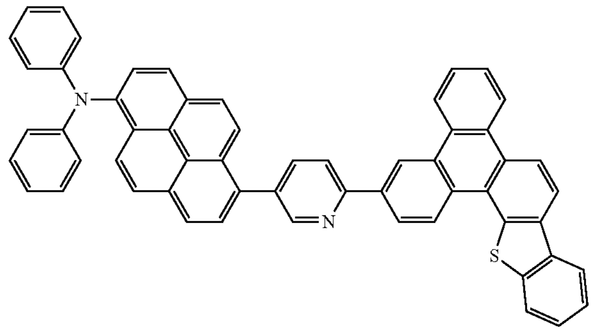
Compound 109
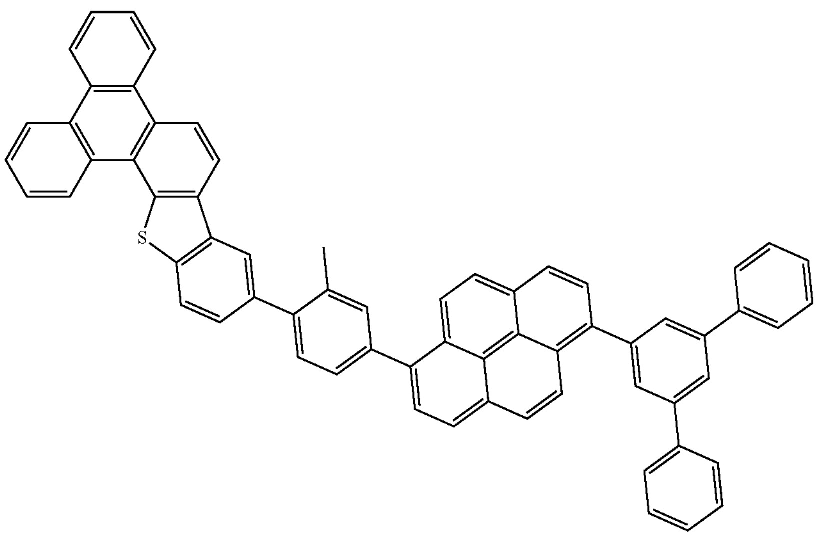
Compound 110
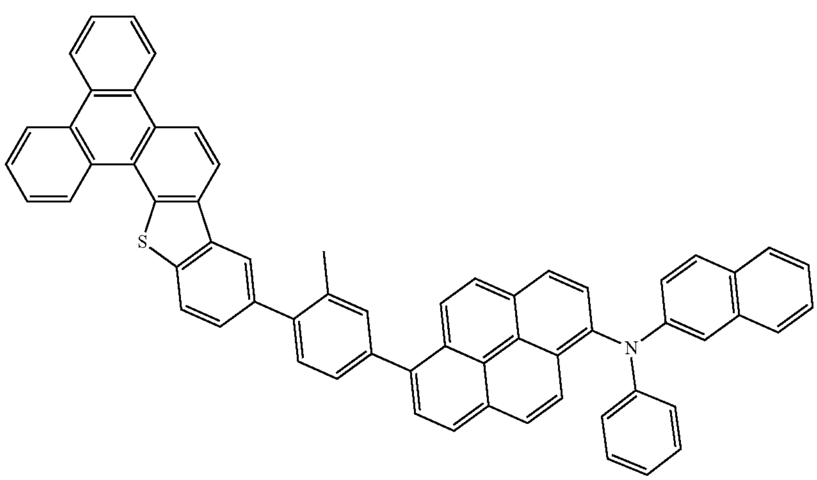

-continued
Compound 111
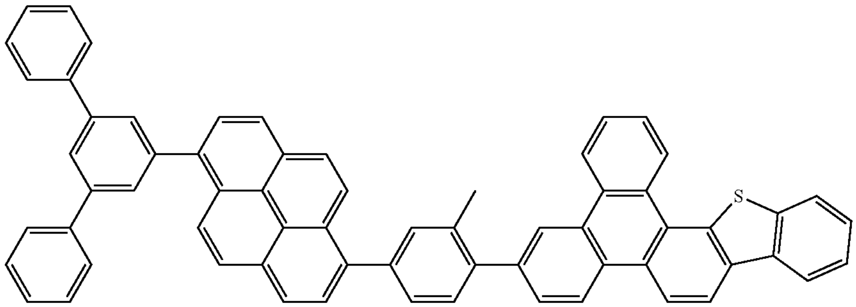
Compound 112
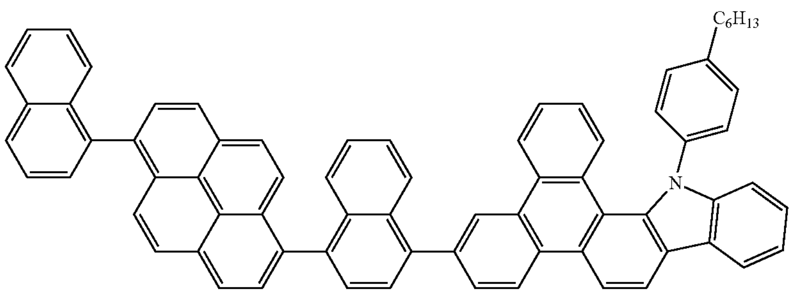
Compound 113
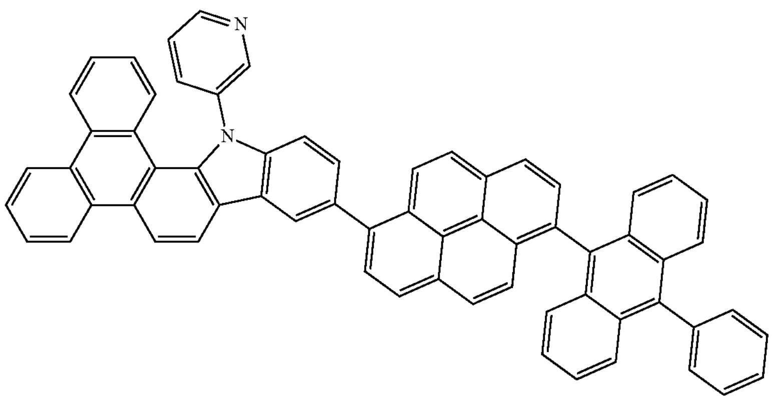
Compound 114
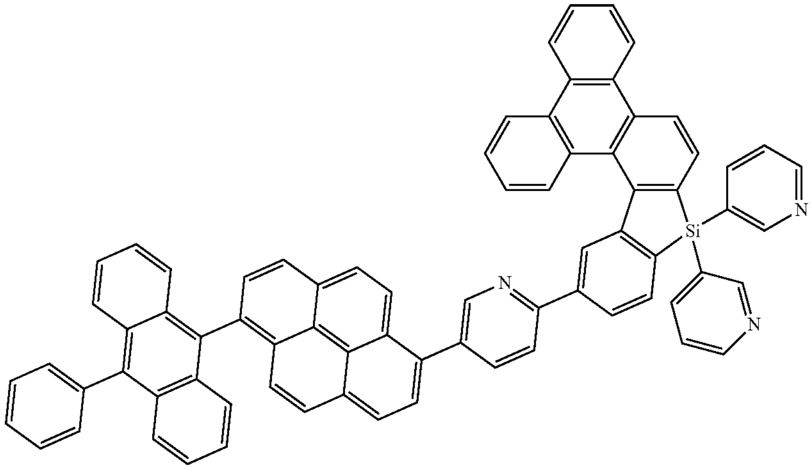

-continued
Compound 115
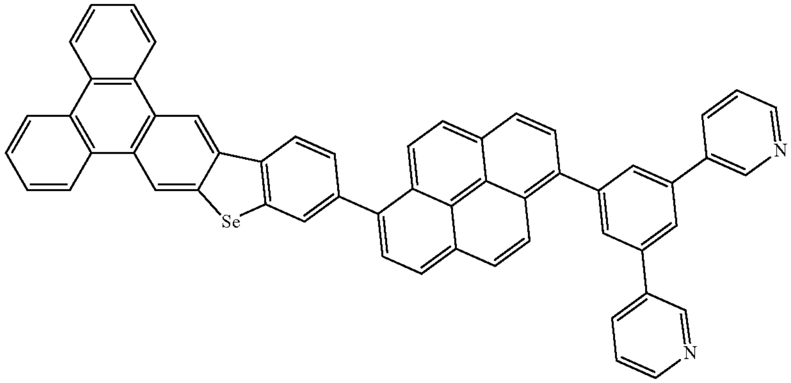
Compound 116
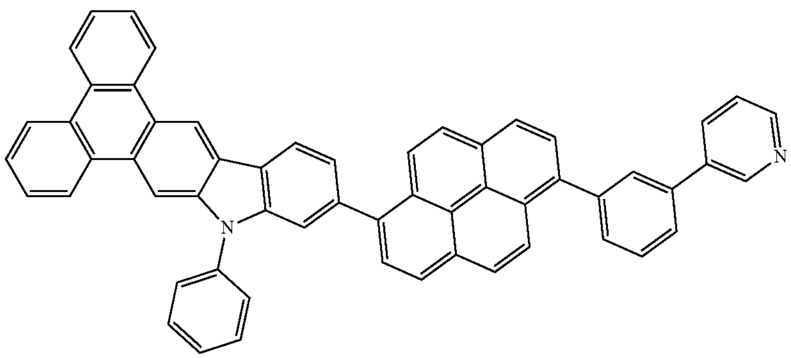
Compound 117
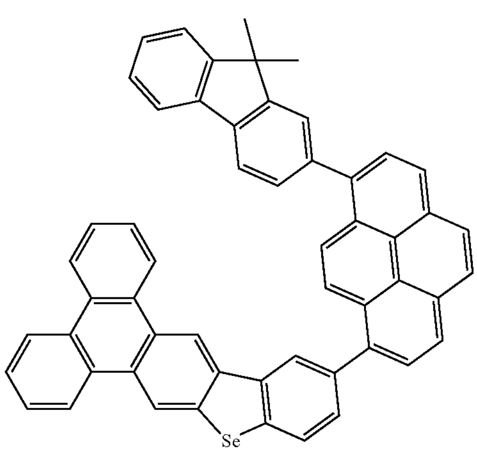
Compound 118
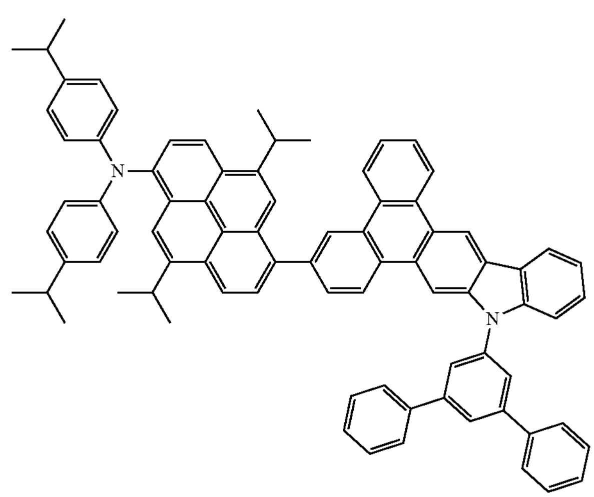

-continued
Compound 119
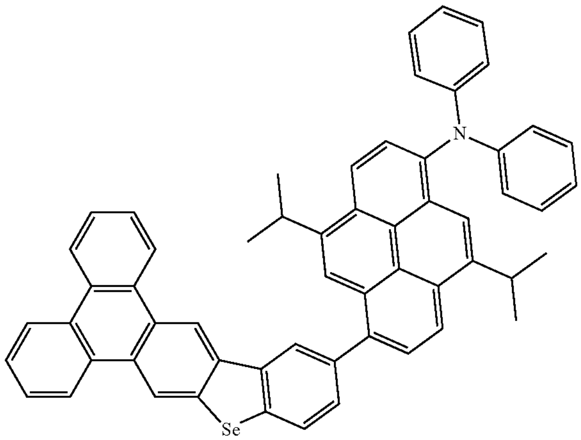
Compound 120
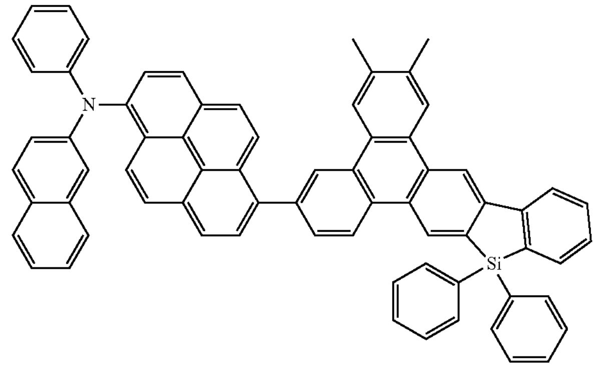
Compound 121
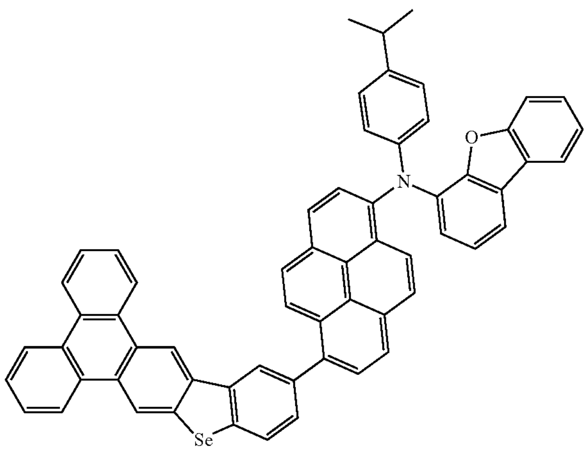
Compound 122
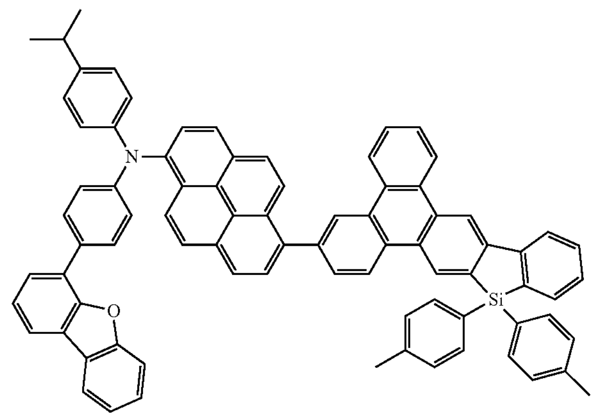
Compound 123
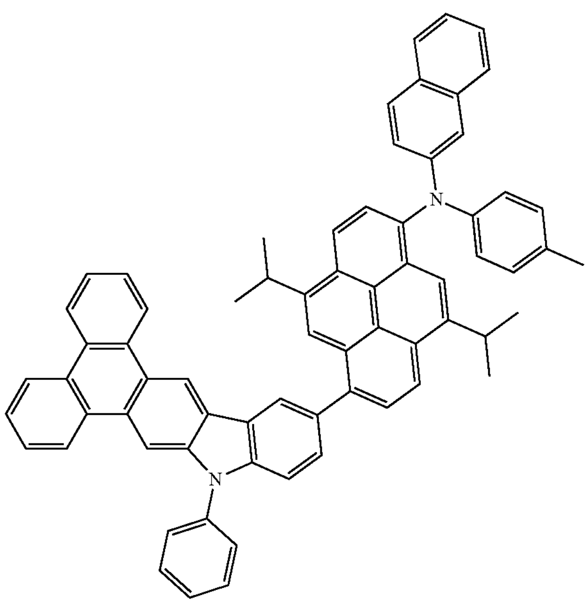
Compound 124
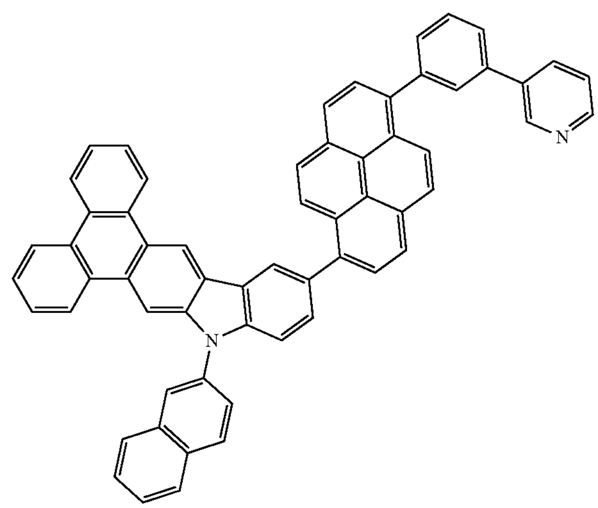

-continued
Compound 125
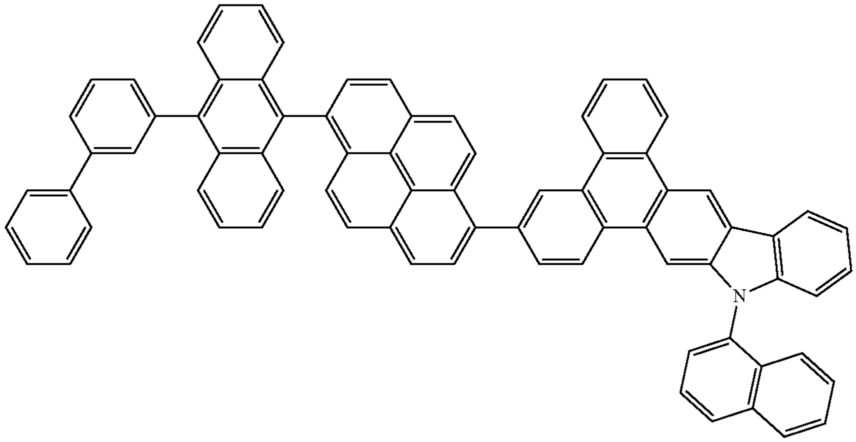
and
Compound 126
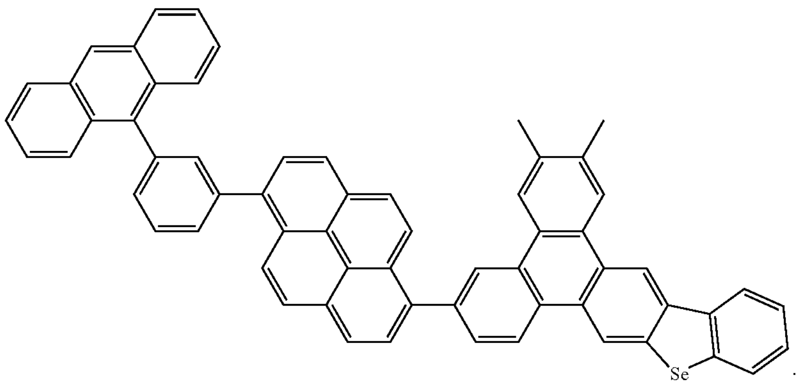
.
* * * * *